US012585857B2

(12) United States Patent
Liebmann

(10) Patent No.: US 12,585,857 B2
(45) **Date of Patent: \*Mar. 24, 2026**

(54) METHOD FOR AUTOMATED STANDARD CELL DESIGN

(71) Applicant: Tokyo Electron Limited, Tokyo (JP)

(72) Inventor: Lars Liebmann, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/333,159

(22) Filed: Jun. 12, 2023

(65) Prior Publication Data

US 2023/0325574 A1     Oct. 12, 2023

Related U.S. Application Data

(63) Continuation of application No. 17/219,539, filed on Mar. 31, 2021, now Pat. No. 11,714,945, which is a
(Continued)

(51) Int. Cl.
*G06F 30/392*     (2020.01)
*G03F 1/70*     (2012.01)

(52) U.S. Cl.
CPC .............. *G06F 30/392* (2020.01); *G03F 1/70* (2013.01)

(58) Field of Classification Search
CPC .... G06F 30/394; G06F 30/392; G06F 30/398; G06F 30/39; G06F 2119/06; G06F 30/327; G06F 2119/12; G06F 2111/04; G06F 30/18; G06F 30/367; G06F 30/3953; G06F 2111/20; G06F 30/20; G06F 30/27; G06F 30/347; G06F 2119/10; G06F 2119/18;
(Continued)

(56) References Cited

U.S. PATENT DOCUMENTS 6,031,980 A     2/2000   Oota
6,462,584 B1   10/2002   Proebsting
(Continued)

FOREIGN PATENT DOCUMENTS

CN     109154843 A     1/2019
TW     201415270 A     4/2014
TW     201725861 A     7/2017

OTHER PUBLICATIONS

Cadence, "Best Full-Flow PPA", White Paper, www.cadence.com, Mar. 2020, 6 pages.
(Continued)

*Primary Examiner* — Binh C Tat
(74) *Attorney, Agent, or Firm* — Slater Matsil, LLP

(57)     ABSTRACT

In an embodiment, a method includes: receiving data representative of an electrical circuit including an arrangement of devices, inputs, outputs, and power sources; determining a minimum number of segments based on the received data; grouping the devices into N segments based on common features shared between two or more of the devices, where N is equal to the minimum number of segments; and generating discrete portions of the grouped devices to form a physical layout representative of a physical manifestation of the electrical circuit, such that when the discrete portions are integrated together they form a physical manifestation of the electrical circuit.

20 Claims, 40 Drawing Sheets

Related U.S. Application Data continuation-in-part of application No. 17/122,689, filed on Dec. 15, 2020, now Pat. No. 11,550,985.

(60) Provisional application No. 63/007,705, filed on Apr. 9, 2020.

(58) Field of Classification Search

CPC .. G06F 30/3312; G06F 30/337; G06F 30/396; G06F 2111/12; G06F 30/00; G06F 30/15; G06F 30/34; G06F 30/3947; G06F 11/0724; G06F 11/079; G06F 11/08; G06F 11/1004; G06F 15/8023; G06F 18/23213; G06F 18/2433; G06F 2111/18; G06F 2113/16; G06F 2117/10; G06F 30/17; G06F 40/103; G06F 40/137; G06F 2113/18; G06F 2119/20; G06F 30/12; G06F 30/30; G06F 30/31; G06F 30/3308; G06F 30/3315; G06F 30/373; G06F 30/36; G06F 30/343; H01L 2224/16145; H01L 25/0657; H01L 2225/06544; H01L 23/5227; H01L 2027/11874; H01L 27/0688; H01L 23/49838; H01L 2224/0612; H01L 25/50; H01L 23/528; H01L 2224/05568; G03F 1/00; G03F 1/36; G03F 1/70; G03F 7/70441

USPC ..................................................... 716/50–56

See application file for complete search history.

(56) References Cited

U.S. PATENT DOCUMENTS

| | | | |
|---|---|---|---|
| 8,964,453 B2 | 2/2015 | Lin et al. | |
| 9,092,589 B2 | 7/2015 | Chai et al. | |
| 9,582,630 B2 * | 2/2017 | Wu | G06F 30/392 |
| 9,871,034 B1 | 1/2018 | Or-Bach et al. | |
| 10,297,586 B2 | 5/2019 | Or-Bach et al. | |
| 10,503,855 B2 | 12/2019 | Ledzius et al. | |
| 10,528,684 B1 * | 1/2020 | Ayubi-Moak | G06F 30/20 |
| 10,872,172 B2 | 12/2020 | Kim | |
| 2005/0022146 A1 | 1/2005 | Sachs | |
| 2011/0121366 A1 | 5/2011 | Or-Bach et al. | |
| 2012/0038057 A1 * | 2/2012 | Bartley | H01L 23/50 257/E23.174 |
| 2014/0264461 A1 | 9/2014 | Xu et al. | |
| 2014/0339548 A1 | 11/2014 | Yamazaki et al. | |
| 2015/0077173 A1 * | 3/2015 | Goodnow | H01L 25/0657 257/774 |
| 2015/0145143 A1 * | 5/2015 | Samadi | G06F 30/392 257/774 |
| 2015/0331985 A1 | 11/2015 | Sharma et al. | |
| 2018/0089340 A1 | 3/2018 | Sendig et al. | |
| 2019/0042684 A1 | 2/2019 | Toub et al. | |
| 2019/0065650 A1 | 2/2019 | Pelloie | |
| 2019/0114383 A1 | 4/2019 | Kim et al. | |
| 2019/0211475 A1 | 7/2019 | Ito et al. | |
| 2019/0384884 A1 * | 12/2019 | Thuries | G06F 30/327 |
| 2020/0104451 A1 | 4/2020 | Huang et al. | |
| 2020/0105660 A1 | 4/2020 | Sio et al. | |
| 2020/0373330 A1 | 11/2020 | Liebmann et al. | |
| 2020/0381430 A1 | 12/2020 | Liebmann et al. | |
| 2021/0043630 A1 | 2/2021 | Liebmann et al. | |
| 2021/0319164 A1 | 10/2021 | Liebmann | |
| 2021/0319165 A1 | 10/2021 | Liebmann | |

OTHER PUBLICATIONS

Cadence, "IEDM: Automating DTCO for 3nm", https://community.cadence.com/cadence_blogs_8/b/breakfast-bytes/posts/iedm2, Jan. 22, 2020, 5 pages.

Cadence, "Moving Logic to the 3rd Dimension", Breakfast Bytes, https://community.cadence.com/cadence_blogs_8/b/breakfast-bytes/posts/moving-logic-to-the-3rd-dimension, Aug. 9, 2017, 6 pages.

Cadence, "CDNLive: Design Technology Co-Optimization for N7 and N5", Cadence, Breakfast Bytes—Cadence Blogs—Cadence Community, https://community.cadence.com/cadence_blogs_8/b/breakfast-bytes/posts/cdnlive-imec-and-cadence-flows-for-n7-and-n5, May 9, 2016, 4 pages.

International Search Report for PCT/US2021/025543 dated Jul. 26, 2021, 8 pages.

Liebmann, Lars, "Design Technology Co-Optimization for 3nm and beyond", TEL Tokyo Electron et al., IEDM, Nov. 2019, 55 pages.

Liebmann, L. et al., "Design Technology CoOptimization, the key to unlocking new scaling key to pathways," MNC Plenary, 29th International Microprocesses and Nanotechnology Conference, Nov. 8-11, 2016, 1 page, Kyoto, Japan.

Liebmann, L. et al., "The daunting complexity of scaling to 7NM without EUV: Pushing DTCO to the extreme," Design-Process-Technology Co-optimization for Manufacturability IX, Proceedings of SPIE, vol. 9427, Apr. 2015, 12 pages.

Moore, Samuel K, "Buried Power Lines Make Memory Faster Researchers at imec explore strategy that could make memory more efficient and pack in more transistors," IEEE Spectrum, Jul. 26, 2019, 5 pages.

Tapily, K., et al., "Advances and Challenges in Selective Deposition," Tokyo Electron Limited, 4th Area Selective Deposition, Apr. 4, 2019, 32 pages, Leuven, Belgium.

International Search Report and Written Opinion, PCT Application No. PCT/US2022/022348, mailed Jul. 4, 2022, 10 pages.

Taiwan Search Report, Taiwanese Patent Application No. 110112530, Mailed: Jul. 8, 2025, 9 Pages.

Taiwan Office Action, with English Translation, Taiwanese Patent Application No. 111112149, mailed Oct. 31, 2025, 15 pages.

* cited by examiner

PRIOR ART

PRIOR ART

250

300

PRIOR ART

400

500

PRIOR ART
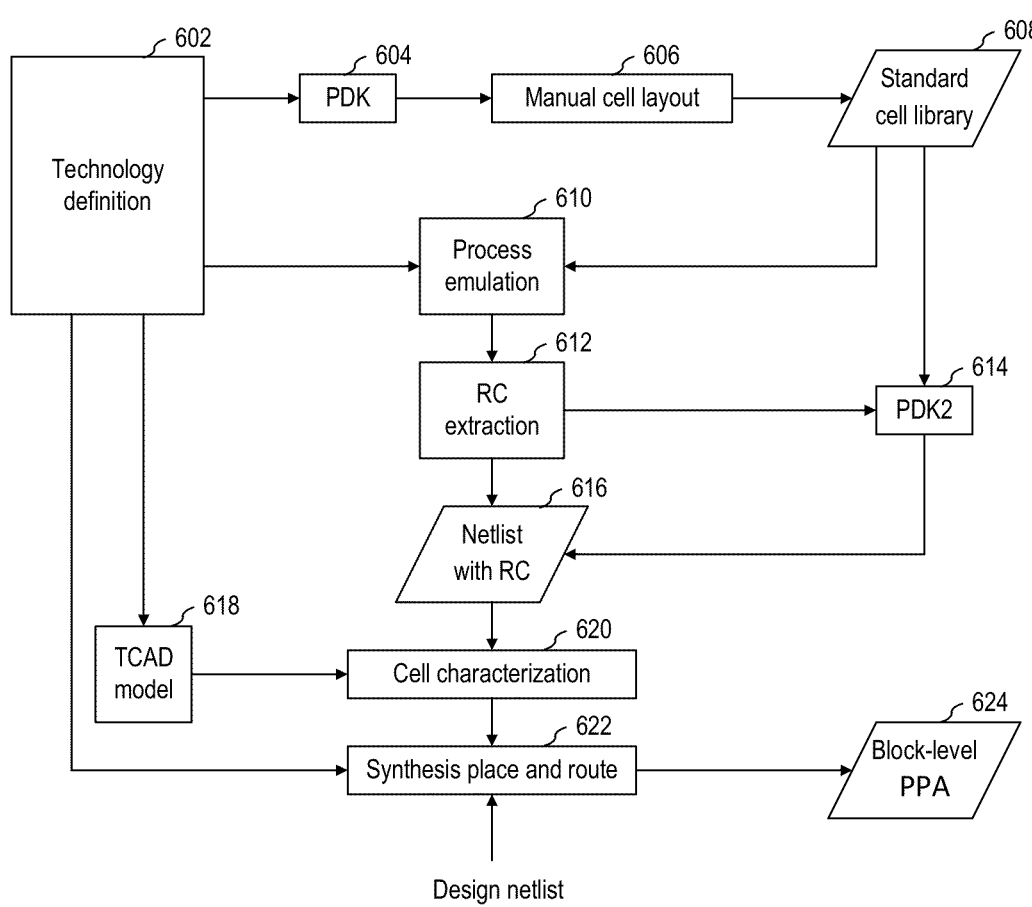
FIG. 6

700

750

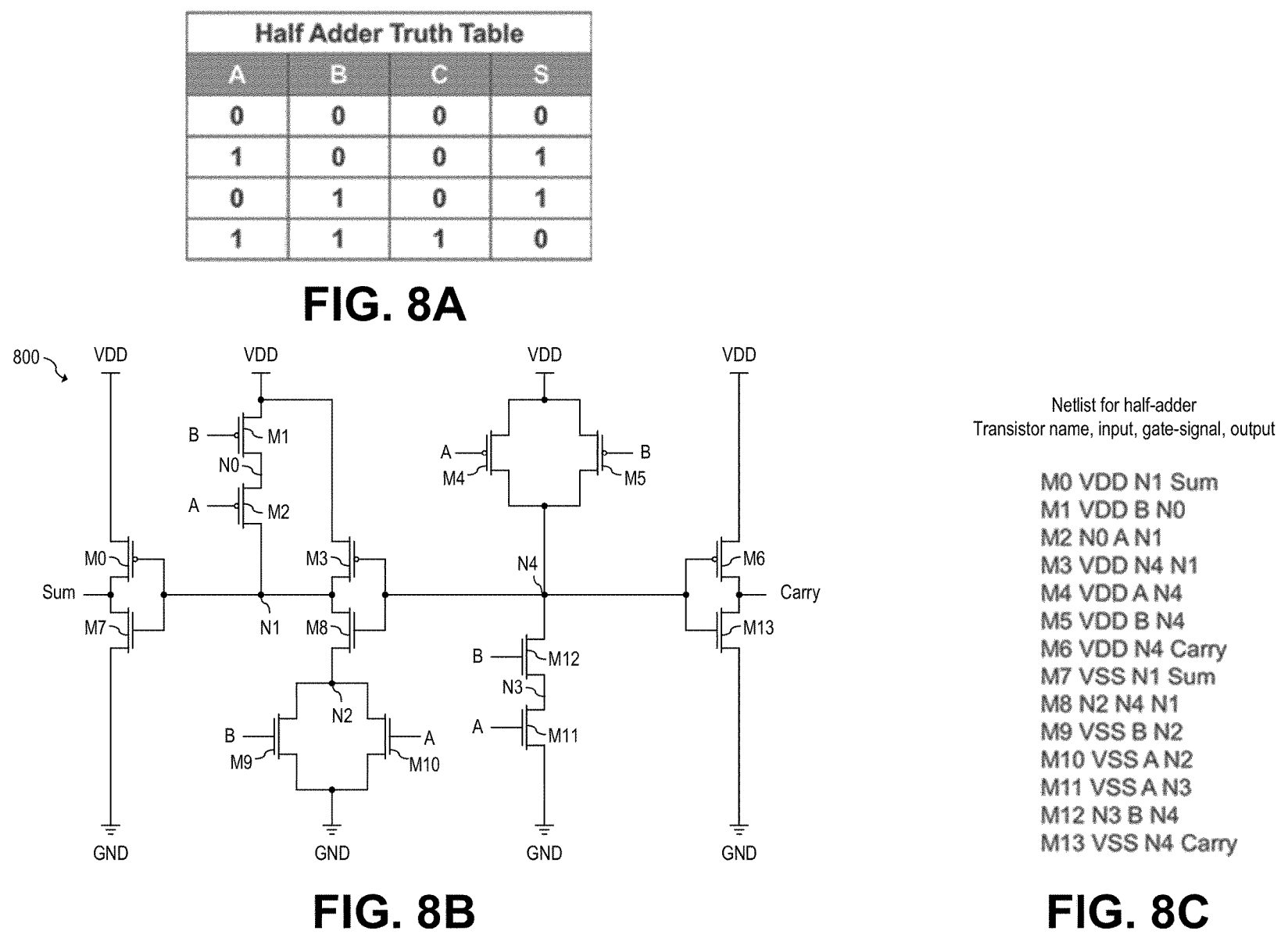

Netlist for half-adder
Transistor name, input, gate-signal, output

M0 VDD N1 Sum
M1 VDD B N0
M2 N0 A N1
M3 VDD N4 N1
M4 VDD A N4
M5 VDD B N4
M6 VDD N4 Carry
M7 VSS N1 Sum
M8 N2 N4 N1
M9 VSS B N2
M10 VSS A N2
M11 VSS A N3
M12 N3 B N4
M13 VSS N4 Carry

FIG. 8C

Half Adder Truth Table

| A | B | C | S |
|---|---|---|---|
| 0 | 0 | 0 | 0 |
| 1 | 0 | 0 | 1 |
| 0 | 1 | 0 | 1 |
| 1 | 1 | 1 | 0 |

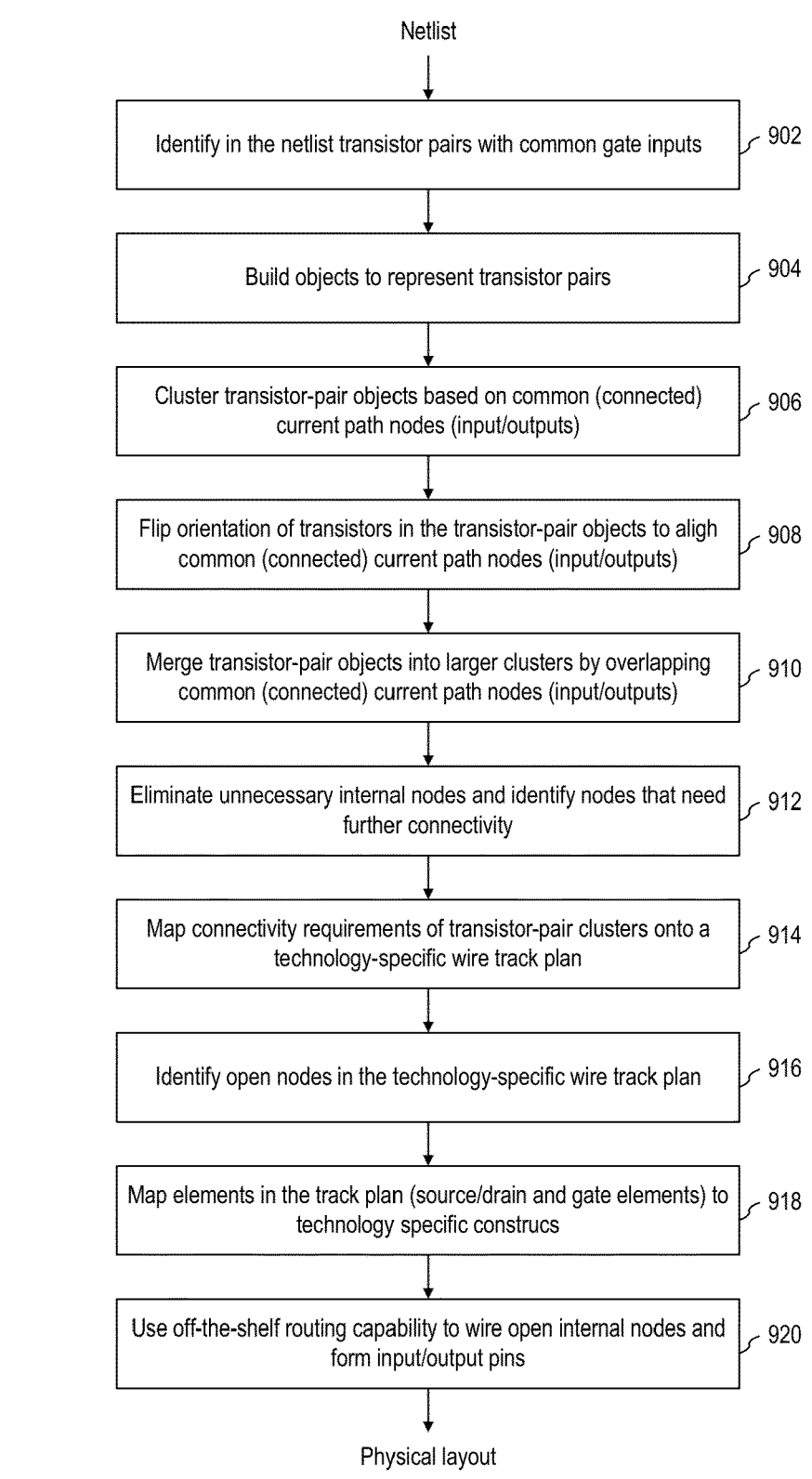

Netlist

Identify in the netlist transistor pairs with common gate inputs — 902

Build objects to represent transistor pairs — 904

Cluster transistor-pair objects based on common (connected) current path nodes (input/outputs) — 906

Flip orientation of transistors in the transistor-pair objects to aligh common (connected) current path nodes (input/outputs) — 908

Merge transistor-pair objects into larger clusters by overlapping common (connected) current path nodes (input/outputs) — 910

Eliminate unnecessary internal nodes and identify nodes that need further connectivity — 912

Map connectivity requirements of transistor-pair clusters onto a technology-specific wire track plan — 914

Identify open nodes in the technology-specific wire track plan — 916

Map elements in the track plan (source/drain and gate elements) to technology specific construcs — 918

Use off-the-shelf routing capability to wire open internal nodes and form input/output pins — 920

Physical layout

VDD M0
VSS M7 Sum

1304　B

VDD M1 N0
VSS M9 N2

1306　A

N0 M2 N1
VSS M10 N2

1308　N4

VDD M3 N1
N2 M8 N1

1310　A

VDD M4 N4
VSS M11 N3

1312　B

VDD M5 N4
N3 M12 N4

1314　N4

VDD M6 Carry
VSS M13

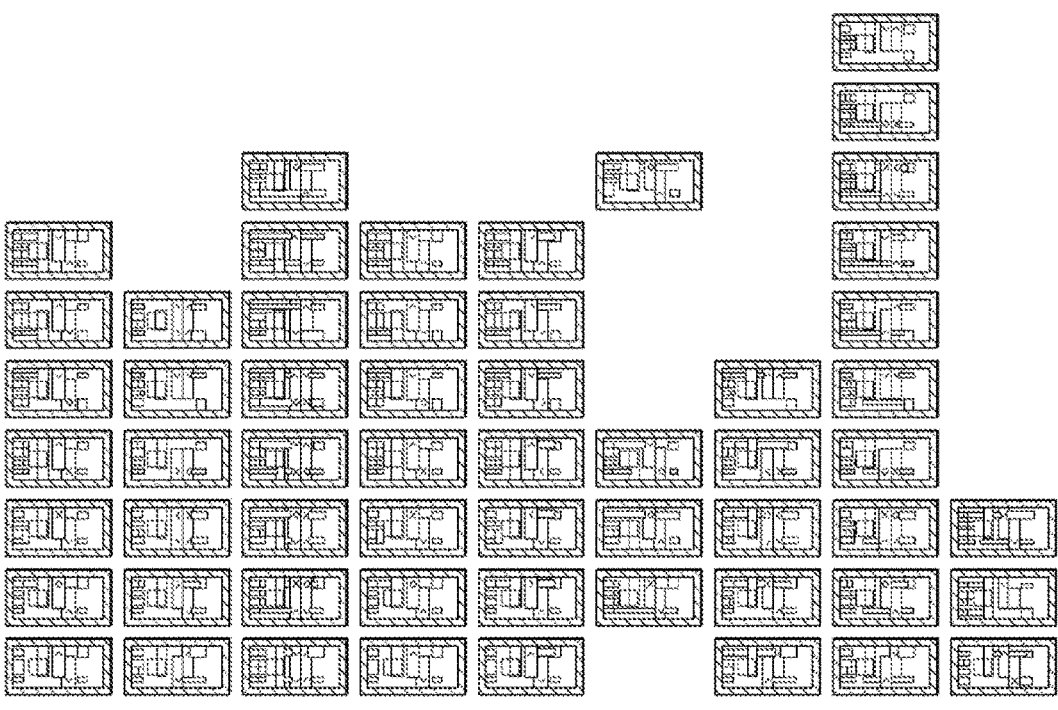
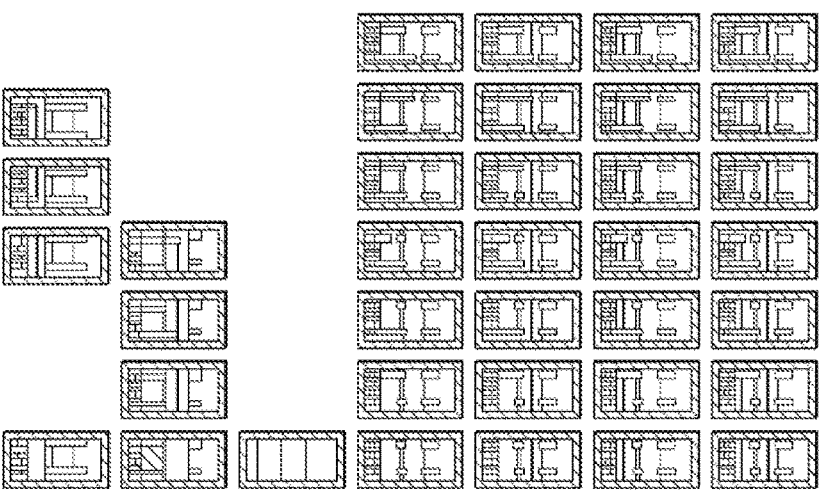
cross-section view
FIG. 13K

1502
| pFET | | | |
|------|------|------|------|
| Name | SD1 | Gate | SD2 |
| M0 | VDD | N1 | Sum |
| M1 | VDD | B | N0 |
| M2 | N0 | A | N1 |
| M3 | VDD | N4 | N1 |
| M4 | VDD | A | N4 |
| M5 | VDD | B | N4 |
| M6 | VDD | N4 | Carry |
1504
| nFET | | | |
|------|------|------|------|
| Name | SD1 | Gate | SD2 |
| M7 | VSS | N1 | Sum |
| M8 | N2 | N4 | N1 |
| M9 | VSS | B | N2 |
| M10 | VSS | A | N2 |
| M11 | VSS | A | N3 |
| M12 | N3 | B | N4 |
| M13 | VSS | N4 | Carry |
FIG. 15A
1512
| pFET | |
|------|------|
| SD | Count |
| VDD | 6 |
| N0 | 2 |
| N1 | 2 |
| N4 | 2 |
| Sum | 1 |
| Carry | 1 |
1514
| nFET | |
|------|------|
| SD | Count |
| VSS | 5 |
| N1 | 1 |
| N2 | 3 |
| N3 | 2 |
| N4 | 1 |
| Sum | 1 |
| Carry | 1 |
FIG. 15B
1522
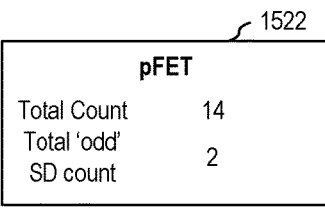
| pFET | |
|------|------|
| Total Count | 14 |
| Total 'odd' SD count | 2 |
1523
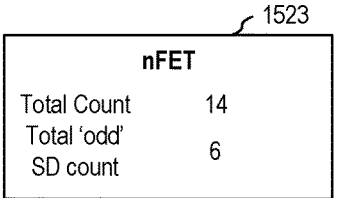
| nFET | |
|------|------|
| Total Count | 14 |
| Total 'odd' SD count | 6 |
FIG. 15C

Legend:
|  | Label |  |
|---|---|---|
| SD1 | Gate | SD2 |
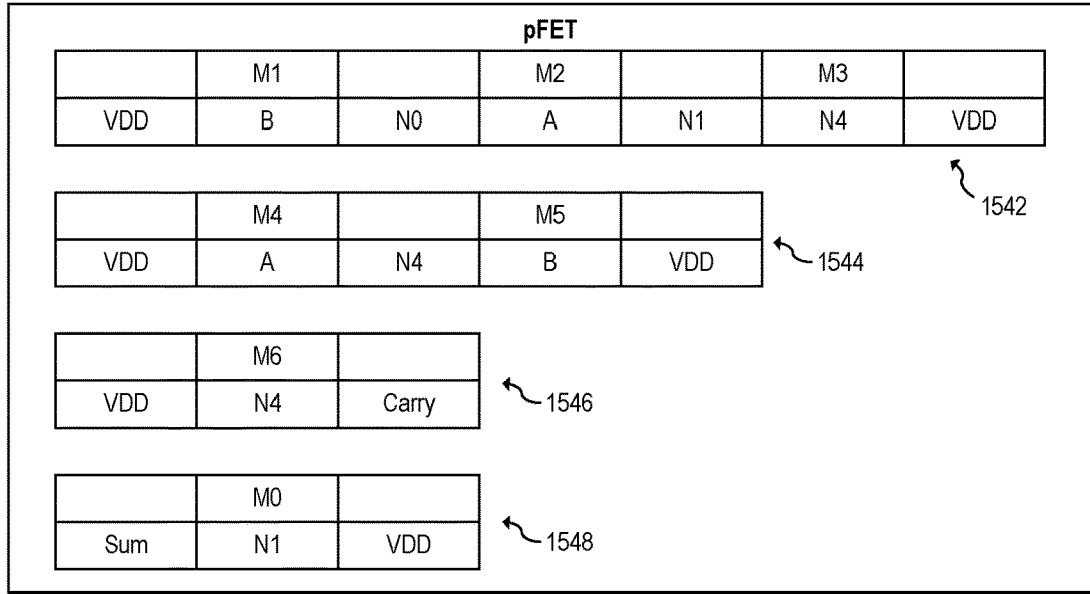
pFET
|  | M1 |  | M2 |  | M3 |  |
|---|---|---|---|---|---|---|
| VDD | B | N0 | A | N1 | N4 | VDD |
1542
|  | M4 |  | M5 |  |
|---|---|---|---|---|
| VDD | A | N4 | B | VDD |
1544
|  | M6 |  |
|---|---|---|
| VDD | N4 | Carry |
1546
|  | M0 |  |
|---|---|---|
| Sum | N1 | VDD |
1548
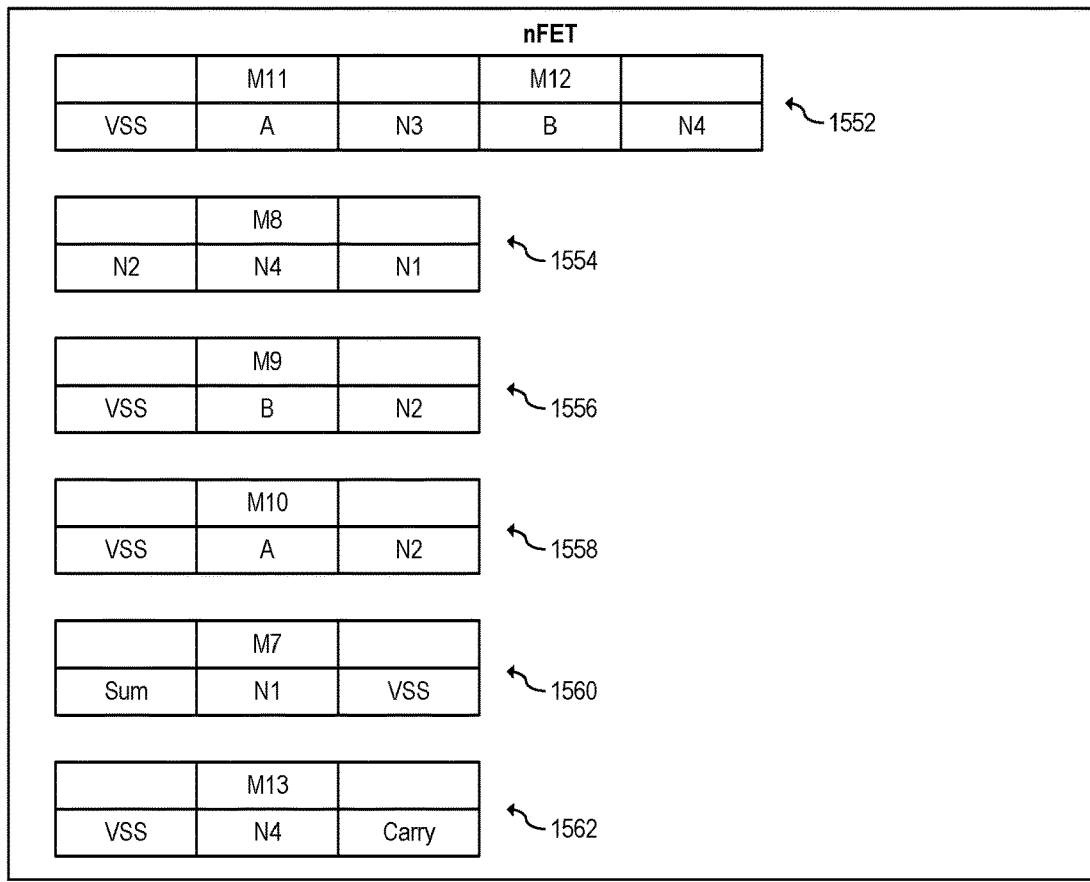
nFET
|  | M11 |  | M12 |  |
|---|---|---|---|---|
| VSS | A | N3 | B | N4 |
1552
|  | M8 |  |
|---|---|---|
| N2 | N4 | N1 |
1554
|  | M9 |  |
|---|---|---|
| VSS | B | N2 |
1556
|  | M10 |  |
|---|---|---|
| VSS | A | N2 |
1558
|  | M7 |  |
|---|---|---|
| Sum | N1 | VSS |
1560
|  | M13 |  |
|---|---|---|
| VSS | N4 | Carry |
1562
FIG. 15D

Legend:
| | Label | |
|---|---|---|
| SD1 | Gate | SD2 |
Legend:
| | P Label | |
|---|---|---|
| P SD1 | P Gate | P SD2 |
| N SD1 | P Label | N SD2 |
| | N Label | |
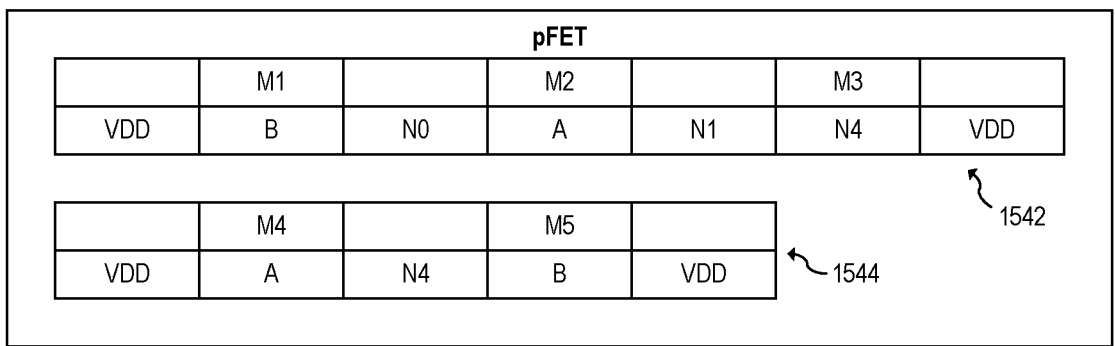
pFET
| | M1 | | M2 | | M3 | |
|---|---|---|---|---|---|---|
| VDD | B | N0 | A | N1 | N4 | VDD |
1542
| | M4 | | M5 | |
|---|---|---|---|---|
| VDD | A | N4 | B | VDD |
1544
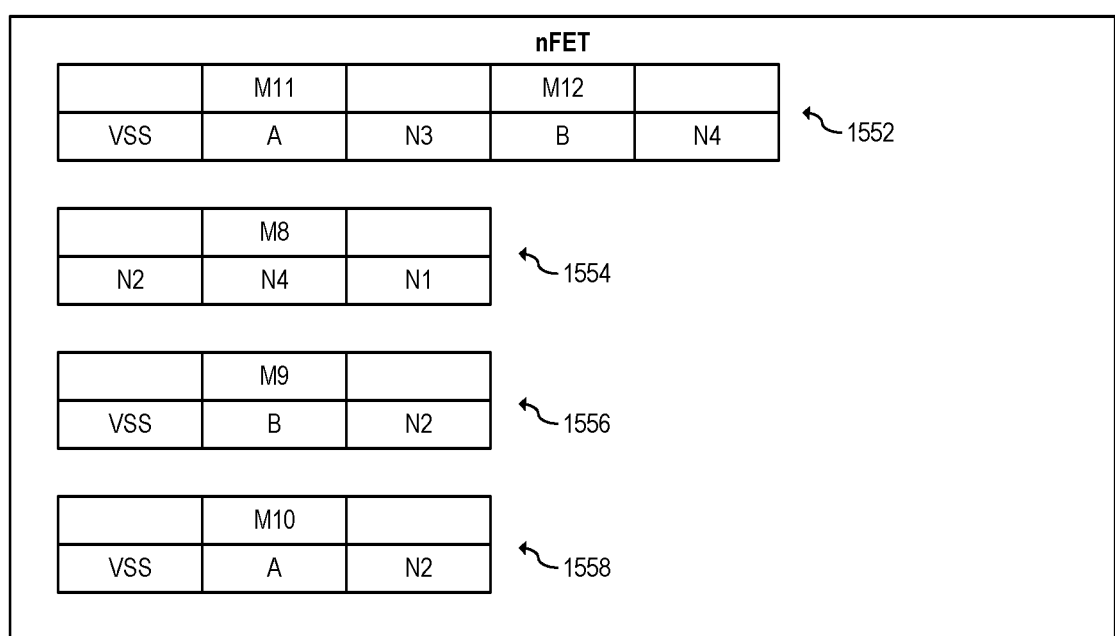
nFET
| | M11 | | M12 | |
|---|---|---|---|---|
| VSS | A | N3 | B | N4 |
1552
| | M8 | |
|---|---|---|
| N2 | N4 | N1 |
1554
| | M9 | |
|---|---|---|
| VSS | B | N2 |
1556
| | M10 | |
|---|---|---|
| VSS | A | N2 |
1558
| | M0 | | M6 | |
|---|---|---|---|---|
| Sum | N1 | VDD | N4 | Carry |
| Sum | N1 | VSS | N4 | Carry |
| | M7 | | M13 | |
1122
FIG. 15E

Legend:
| | Label | |
|---|---|---|
| SD1 | Gate | SD2 |
Legend:
| | P Label | |
|---|---|---|
| P SD1 | P Gate | P SD2 |
| N SD1 | P Label | N SD2 |
| | N Label | |
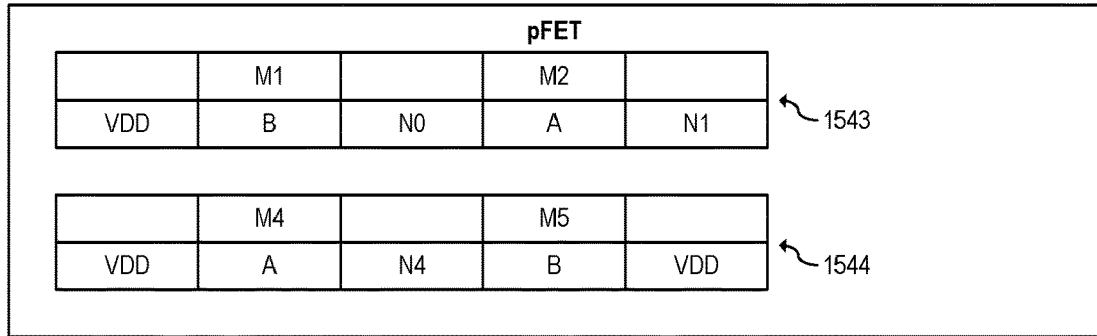
pFET
| | M1 | | M2 | |
|---|---|---|---|---|
| VDD | B | N0 | A | N1 |
1543
| | M4 | | M5 | |
|---|---|---|---|---|
| VDD | A | N4 | B | VDD |
1544
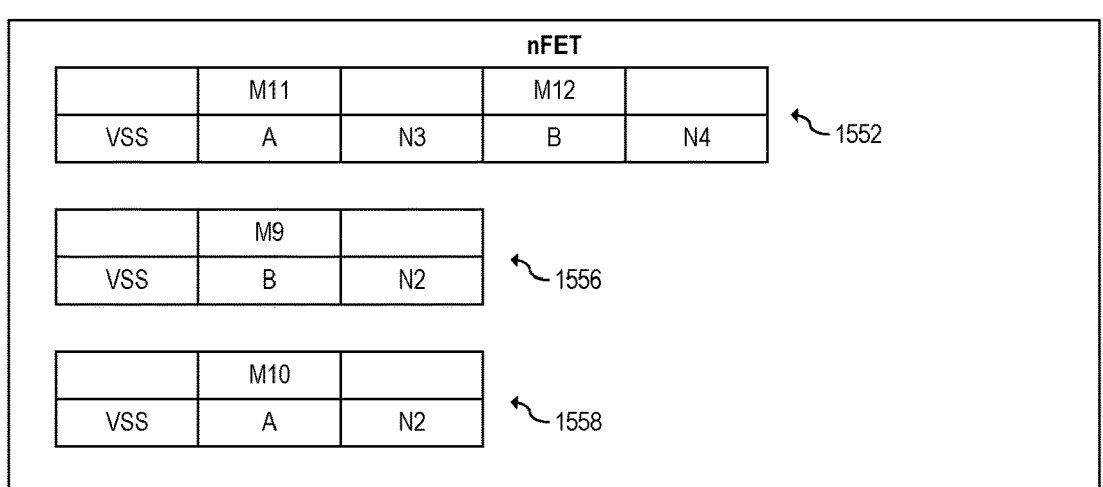
nFET
| | M11 | | M12 | |
|---|---|---|---|---|
| VSS | A | N3 | B | N4 |
1552
| | M9 | |
|---|---|---|
| VSS | B | N2 |
1556
| | M10 | |
|---|---|---|
| VSS | A | N2 |
1558
| | M0 | | M6 | |
|---|---|---|---|---|
| Sum | N1 | VDD | N4 | Carry |
| Sum | N1 | VSS | N4 | Carry |
| | M7 | | M13 | |
1122
| | M3 | |
|---|---|---|
| VDD | N4 | N1 |
| N2 | N4 | N1 |
| | M8 | |
1126
FIG. 15F

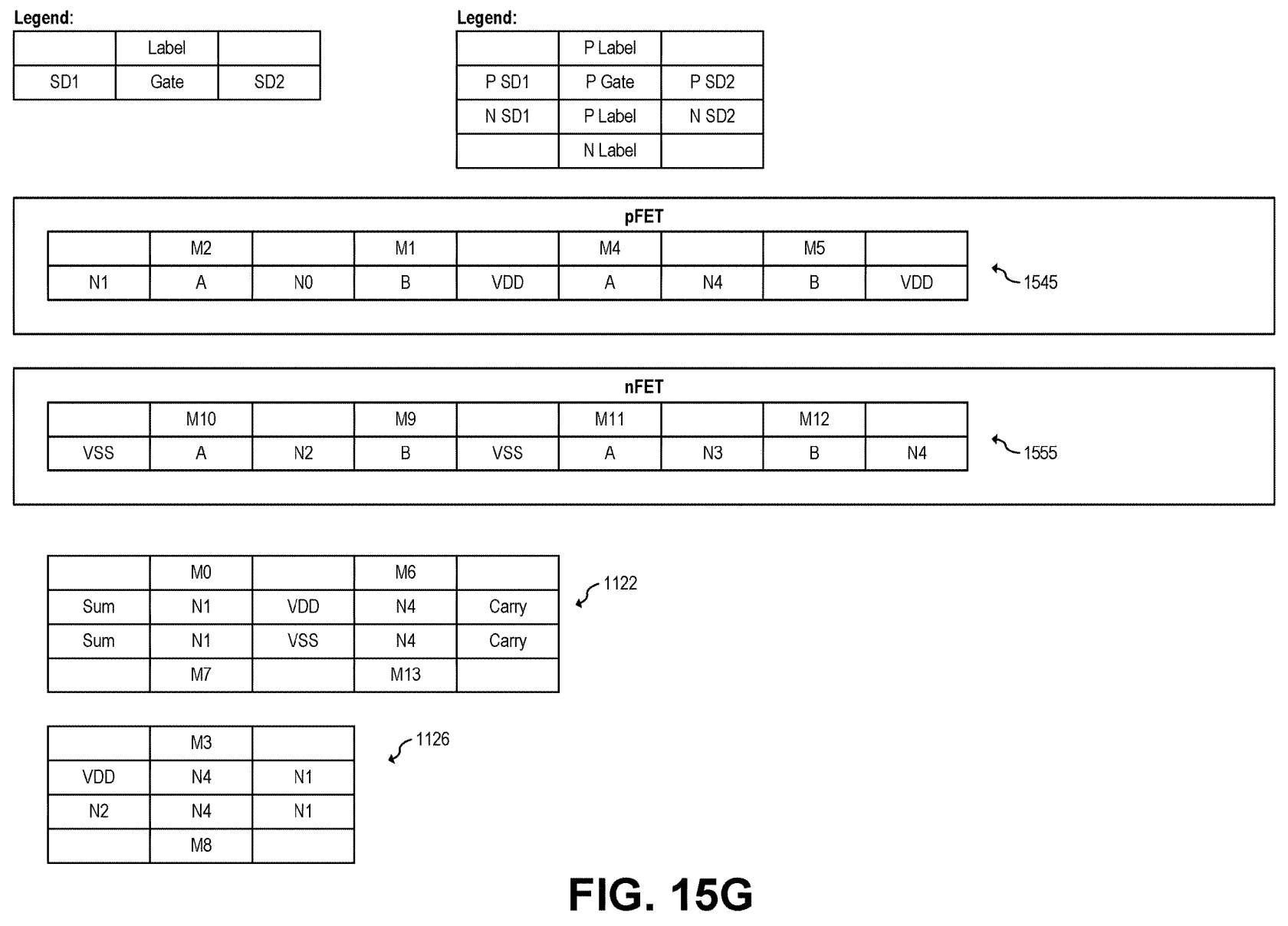

Legend:

| P SD1 | P Label | P SD2 |
|-------|---------|-------|
|       | P Gate  |       |
| N SD1 | P Label | N SD2 |
|       | N Label |       |

Legend:

| SD1 | Label | SD2 |
|-----|-------|-----|
|     | Gate  |     | pFET — 1545

| SD1 | N1 |     |     |     |
|-----|----|-----|-----|-----|
| Label | M2 | M1 | M4 | M5 |
| Gate | A | B | A | B |
| SD2 | N0 | VDD | VDD | VDD | nFET — 1555

| SD1 | VSS |     |     |     |
|-----|-----|-----|-----|-----|
| Label | M10 | M9 | M11 | M12 |
| Gate | A | B | A | B |
| SD2 | N2 | VSS | N3 | N4 |

1122

|     |     | M0  | M6  |       |
|-----|-----|-----|-----|-------|
| Sum | N1  | VDD | N4  | Carry |
| Sum | N1  | VSS | N4  | Carry |
|     | M7  |     | M13 |       |

1126

|     |     | M3  |     |
|-----|-----|-----|-----|
| VDD | N4  | N4  | N1  |
| N2  | N4  | N4  | N1  |
|     | M8  |     |     |

FIG. 15G

Figure 15H:
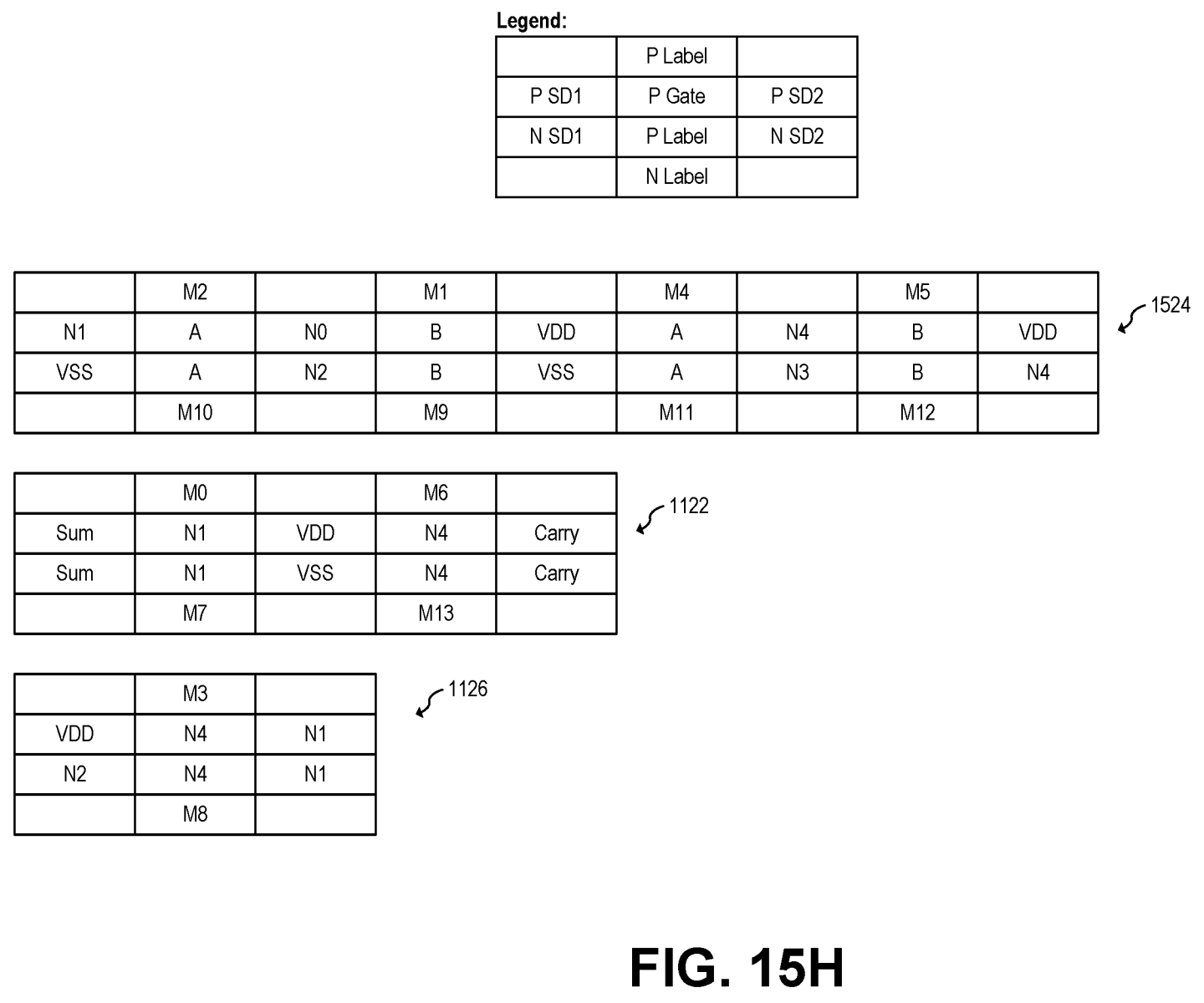

Legend:

| | P Label | P SD2 |
|---|---|---|
| P SD1 | P Gate | N SD2 |
| N SD1 | P Label | |
| | N Label | |

1524

| N1 | M2 | M1 | M4 | M5 |
|---|---|---|---|---|
| VSS | A | B | A | B |
| | A | B | N3 | VDD |
| | M10 | M9 | M11 | M12 |

(cells: N0 / VDD / N4 / VDD; N2 / VSS / A / B; N4)

1122

| Sum | M0 | M6 |
|---|---|---|
| Sum | N1 | N4 |
| | N1 | N4 |
| | M7 | M13 |

(VDD / Carry; VSS / Carry)

1126

| VDD | M3 |
|---|---|
| N2 | N4 |
| | N4 |
| | M8 |

Legend:

| | P Label | |
|---|---|---|
| P SD1 | P Gate | P SD2 |
| N SD1 | P Label | N SD2 |
| | N Label | |

METHOD FOR AUTOMATED STANDARD CELL DESIGN

CROSS-REFERENCE TO RELATED APPLICATIONS

Reference to Related Applications

This application is a continuation of U.S. patent application Ser. No. 17/219,539, entitled "Method for Automated Standard Cell Design," filed Mar. 31, 2021, which is a continuation-in-part of U.S. patent application Ser. No. 17/122,689, entitled "Method for Automated Standard Cell Design," filed Dec. 15, 2020, now issued as U.S. Pat. No. 11,550,985, which claims the benefit of U.S. Provisional Application No. 63/007,705, entitled "Method for Automated Standard Cell Design," filed on Apr. 9, 2020, which applications are hereby incorporated herein by reference.

TECHNICAL FIELD

The present disclosure relates generally to semiconductor devices and methods, and, in particular embodiments, to a method for automated standard cell design.

BACKGROUND

Integrated circuits may include one or more types of transistors. Planar transistors are a very common transistor technology. Planar transistors are manufactured using a conventional planar (layer by layer) manufacturing process and in which the transistor junctions reach the semiconductor surface in one plane. For example, FIG. 1 shows exemplary planar transistor 100.

Non-planar transistors, also referred to as three-dimensional (3D) transistors, are transistors in which the transistor junctions reach the semiconductor surface in different planes, such as a raised source-to-drain channel, e.g., as exemplified by a Tri-Gate transistor, or a raised channel (called fin) from source to drain, e.g., as exemplified by a fin field-effect-transistor (FET) (FinFET). A FinFET has the gate placed on two, three, or four sides of the channel, or wrapped around the channel, forming a double gate structure. FIGS. 2A and 2B show exemplary 3D Tri-Gate transistor 200, and FinFET 250.

Another example of non-planar transistor is the nanosheet (NS) transistor (also known as lateral gate all around (LGAA) transistor. FIG. 3 shows exemplary NS transistor 300.

Complementary FET (CFET) is another type of non-planar, 3D transistor in which, e.g., two FETs (e.g., an nFET and a pFET) are stacked vertically, with a vertical common gate that form horizontal channels. For example, FIG. 4 shows exemplary CFET 400. As can be seen from FIG. 4, CFETs have the advantage of resulting in simplified access to the FET terminals, which can result in smaller layouts.

FIG. 5 shows exemplary vertical transistor (VFET) 500, in which source-gate-drains of each transistor are stacked vertically. VFETs are referred to as vertical transistors because the channel is vertical, as shown in FIG. 5.

SUMMARY

In accordance with an embodiment, a method includes: receiving data representative of an electrical circuit including an arrangement of devices, inputs, outputs, and power sources; determining a minimum number of segments based on the received data; grouping the devices into N segments based on common features shared between two or more of the devices, where N is equal to the minimum number of segments; and generating discrete portions of the grouped devices to form a physical layout representative of a physical manifestation of the electrical circuit, such that when the discrete portions are integrated together they form a physical manifestation of the electrical circuit.

In accordance with an embodiment, a computing device for generating standard cell layouts for a standard cell library includes: a processor; and a non-transitory computer-readable storage medium coupled to the processor and storing a program executable by the processor, the program including instructions to: receive data representative of an electrical circuit including an arrangement of devices, inputs, outputs, and power sources, determine a minimum number of segments based on the received data, group the devices into N segments based on common features shared between two or more of the devices, where N is equal to the minimum number of segments, and generate discrete portions of the grouped devices to form a physical layout representative of a physical manifestation of the electrical circuit, such that when the discrete portions are integrated together they form a physical manifestation of the electrical circuit.

In accordance with an embodiment, a method includes: receiving data representative of an electrical circuit including an arrangement of devices, inputs, outputs, and power sources, where the electrical circuit includes a plurality of nodes, and where the devices include a plurality of n-type field effect transistors (nFETs) and a plurality of p-type field effect transistors (pFETs); identifying pFETs and nFETs of the electrical circuit from the received data; identifying different nodes of the plurality of nodes based on the received data; assigning a terminal count to each of the identified nodes based on the received data to form a plurality of terminal counts, where each terminal count is indicative of a number of terminals of the devices coupled to a respective node of the identified nodes; determining a minimum number of segments based on a number of terminal counts of the plurality of terminal counts having an odd count; and grouping the devices into N segments based on common features shared between two or more of the devices, where N is equal to the minimum number of segments; and generating discrete portions of the grouped devices to form a physical layout representative of a physical manifestation of the electrical circuit, such that when the discrete portions are integrated together they form a physical manifestation of the electrical circuit.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 shows a flow chart of an exemplary semiconductor technology design flow;

FIGS. 8A-8D show four different representations of a half-adder cell, according to an embodiment of the present invention;

FIG. 9 shows a flow chart of an embodiment method for automatically generating a physical layout of a standard cell based on a netlist, according to an embodiment of the present invention;

FIGS. 13A-13K illustrate the performance of the method of FIG. 9 for converting the netlist of FIG. 8C (half-adder) into a physical layout using CFET technology, according to an embodiment of the present invention;

FIGS. 15A-15I show various possible outputs of performing the method of FIG. 14, according to embodiments of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
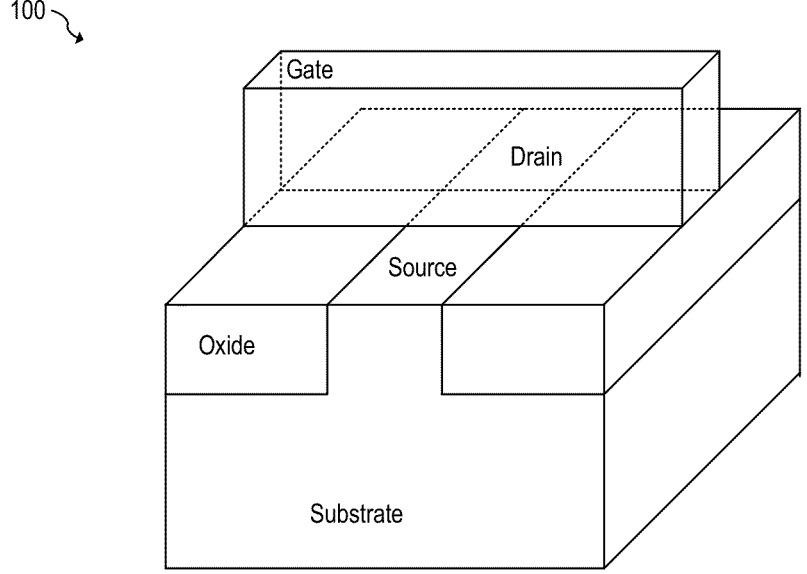
FIG. 1 shows an exemplary planar transistor.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a method for generating standard logic cell design in a FinFET device, CFET device, or 3D CFET device. Embodiments of the present invention may be used in other types of transistor technologies, such as other types of 3D transistors, such as VFETs and TriGate transistors, for example.

In an embodiment of the present invention, an electrical circuit design is automatically converted to a corresponding physical layout based on the circuit netlist. In some embodiments, the placement and routing of a standard cell is automatically generated and optimized based on the netlist corresponding to the standard cell before translation to physical layout. After automatically placing and routing devices (e.g., transistors) in accordance with the netlist of the standard cell in an optimized manner, the physical layout of the standard cell is generated.

Developing a new semiconductor technology node, such as 10 nm node (N10), 7 nm node (N7), or 5 nm node (N5), involves generating models and cell libraries so that circuits and devices can be designed with the new nodes. For example, FIG. 6 shows a flow chart of exemplary semiconductor technology design flow 600.

During step 602, the semiconductor technology node is defined. For example, during step 602, the types of basic standard cells and bit cells to be implemented for the technology node are selected, and connectivity (e.g., track plan, wire stacks, and power delivery networks) and design rules, contour and arc routing are identified.

During step 604 a process design kit (PDK) is manually generated for the semiconductor node. A PDK is a set of libraries and associated data, such as model files, physical varication rule files, etc., that allows for designing circuits and devices using a particular semiconductor technology node. During step 604, for example, design rule manual (DRM) and design rule check (DRC) files are generated.

During step 606, the basic standard cells identified during step 602 are manually laid out to create standard cell library 608. The standard cell library is generally manually optimized during step 606 to, e.g., so that the cells take the least amount of space and so that can be used by place and routing (PNR) tools during step 622.

During step 610, the performance of the standard cells is emulated in a testbench simulation environment. Emulating the standard cells during step 610 advantageously allows for testing the standard cells early in the semiconductor node development cycle.

During step 612, parasitic extraction of the standard cells is performed, and the PDK is updated during step 614 based on the result from the parasitic extraction. For example, during step 614, the PDK is updated with front-end-of-line (FEOL) and includes parasitic resistances and capacitances.

During step 616, netlists of the standard cells that incorporate the results from the parasitic extraction is generated.

During step 618, technology computer-aided design (TCAD) is used to generate Spice models. During step 620, the Spice models generated during step 618 are used together with the netlists generated during step 616 to characterize the standard cells, e.g., over process, voltages and temperature (PVT) variations.

During step 622, digital circuits defined by design netlists (e.g., written in Verilog or VHDL) are synthesized (placed in a layout) and routed based on connectivity information (from step 602) using the standard cells from standard cell library 608.

During step 624, power-performance-area (PPA) assessments are made for blocks designed using the design netlists received during step 622, e.g., for optimization purposes.

When developing a new semiconductor node using method 600, feedback loops may exist around various steps. For example, if after performing steps 604 and 606, there are a large number of DRC errors, the architecture of the library may have to be changed. Achieving acceptable placement density when building the standard cell library 608 may also be an iterative process. For example, the first version of the standard cell library may achieve a low placement density (e.g., 60%) before achieving a final, higher, placement density (e.g., 75%) after one or more iterations of step 606.

Design rules and process modification may also need to be made based on results from step 620, and additional changes may need to be made if PPA targets are not met during step 624. As a result, in some cases, performing method 600 may last months, such as six months or longer. Given the long lead times for some of the steps, some of the feedback loops are omitted, rendering the design of the standard cells effectively fixed after performed, which may result in less optimized solutions and may require restrictive design rules.

As semiconductor nodes progress to smaller and smaller size (e.g., from N7 to N5, to N3, and smaller), routing congestion may increase, which may increase the complexity of designing the standard cell library. The use of non-planar transistors as well as the use of 3D integration (using, e.g., transistor stacking, e.g., of any type) is also becoming increasingly likely as semiconductor nodes transition to smaller nodes. Performing layout and routing of stacked transistors and/or non-planar transistors may require consideration of multiple placements and routing options to achieve optimal layouts with, e.g., high placement density and/or ease of placement by automated routing tools. Thus, as semiconductor technology nodes become smaller, manually evaluating all layout options for optimizing the layout of standard cells, and manually designing the standard cells of the standard library may become too complex, too expensive and/or too time consuming to be effectively or practically performed. Thus, smaller devices by themselves may not guarantee better scaling, power, performance, and/or cost.

In an embodiment of the present invention, a standard cell library is automatically generated with optimized layout based on the technology definition. In some embodiments, by automatically generating the layout of standard cells, a new semiconductor technology node may be evaluated based on the generated standard cells in the context of place-and-route (instead of in isolation, before place and route) to determine, e.g., scaling, power, performance, and cost, in substantially less time (e.g., weeks versus months) compared to performing the layout of the standard cells manually. For example, FIG. 7A shows a flow chart of embodiment semiconductor technology design flow 700, according to an embodiment of the present invention.

Figure 7A:
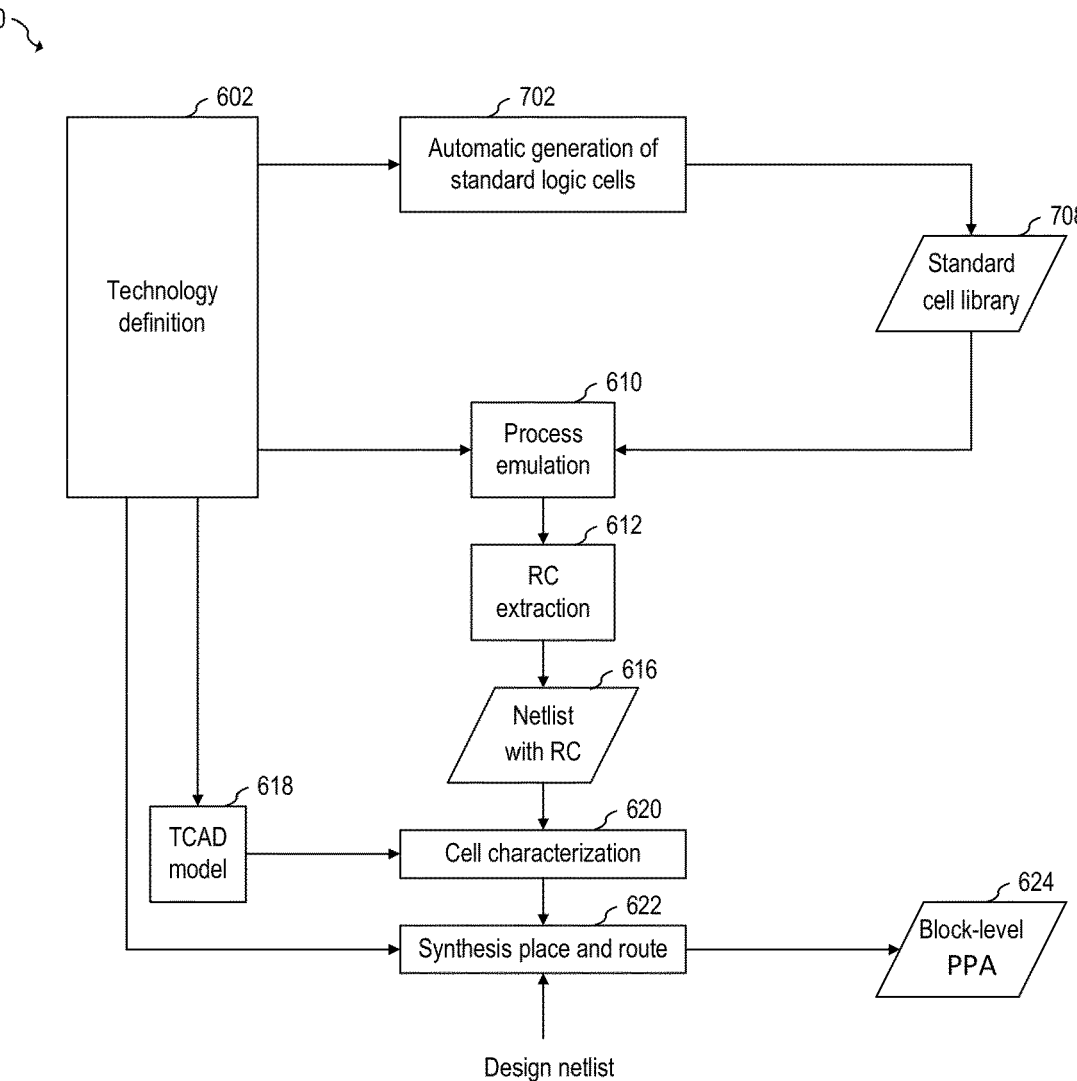
FIG. 7A shows a flow chart of an embodiment semiconductor technology design flow, according to an embodiment of the present invention.

As shown in FIG. 7A, design flow 700 is similar to design flow 600, but includes step 702 for automatic generation of standard cells. By automatically generating the standard logic cells, some embodiments advantageously substantially reduce the amount of time for generating an optimized standard cell library (e.g., from several months to a few weeks), e.g., by omitting the performance of one or more of steps 604, 606, and 614, and, instead, generating the standard cell library and associated PDK automatically during step 702.

For example, in some embodiments, the design rules in the PDK (step 604) are replaced with instructions (e.g., rules) for standard cell automatic generation (during step 702). In some embodiments, since the behavior of the instructions (e.g., programming instructions) for automatic generation of standard cells (in step 702) is much more predictable than a human designer performing manual cell layout during step 606, (e.g., substantially) fewer rules may be needed. Additionally, advanced technology nodes may be highly restricted. Thus, in some embodiments, it may be more efficient to instruct an automatic standard cell generation system (in step 702) to design layout of standard cells rather than instruct a human of, e.g., an extensive list of rules of what to avoid during the manual layout design (step 606) to comply with the restrictions of the advanced node.

Therefore, in some embodiments, the design rule checking deck (DRC) in the PDK can be eliminated since the standard cells may be generated correctly by construction. For example, in some embodiments, the automatic cell generation of standard cells may correctly and systematically generate layouts that are optimized and comply with the semiconductor node requirements. Thus, in some embodiments, eliminating manually laying out standard cells (step 606) and replacing such step with automatically laying out the standard cells during step 702 advantageously allows for optimized and correct layout of standard cells that comply with the requirements of the semiconductor node in a (e.g., substantially) shorter time frame.

In some embodiments, step 614 may be eliminated by running resistance and capacitance extraction directly in emulation (step 610). In some embodiments, performing such parasitic extraction during step 610 is advantageously enabled, e.g., by the consistency of the output generated during step 702. Even though in some embodiments performing parasitic extraction during step 610 may be more time consuming than running an abstracted extraction deck during step 614, performing parasitic extraction during step 610 may advantageously provide efficiency for early iterative optimization.

Standard cells (e.g., of standard libraries 608 and 708) are physical representations of standardized Boolean logic functions. An example of a standard cell is a half-adder, which is configured to add two binary numbers. Other examples of standard cells include, a NAND gate, a NOR gate, a D-flip-flop, an arithmetic logic unit (ALU), etc. In some embodiments, standard cell library may include more than 50 standard cells, such between 50 and 100 standard cells, such as 80 standard cells, for example.

Figure 7B:
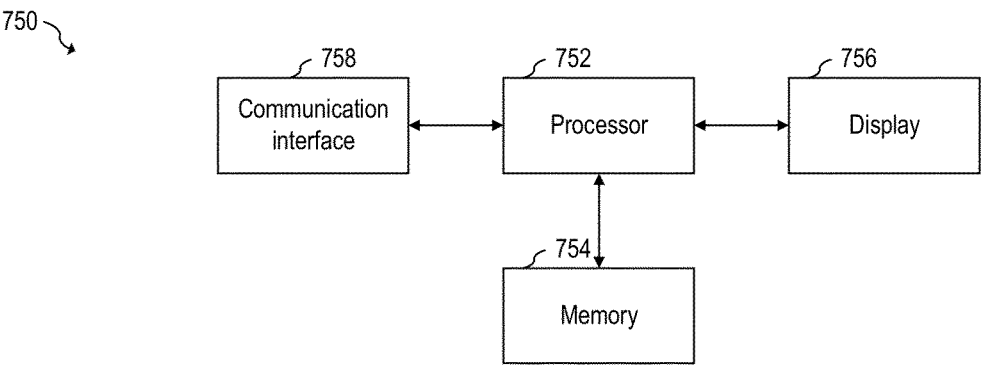
FIG. 7B shows a computing device, according to an embodiment of the present invention.

In some embodiments, method 700 may be implemented in a computing device coupled to a memory for storing a program executable by the process, and where the program includes instructions for performing method 700. For example, FIG. 7B shows computing device 750, according to an embodiment of the present invention. As shown, computing device 752 includes processor 752 coupled to memory 754 display 756, and communication interface 758. In some embodiments, processor 752 may be implemented as a generic processor, an Application Specific Integrated Circuit (ASIC), a microprocessor, or other processing logic that may interpret and execute instructions stored in memory 754.

Display 756 is configured to display, e.g., layout drawings (e.g., generated during step 702). Display 756 may be a computer monitor and may be implemented in any way known in the art.

Memory 754 is configured to store a program including instructions to perform, e.g., method 700. Memory 754 is also configured to store, either temporarily or permanently, digital files of intermediate or final outputs generated during method 700, such as during step 702, such as, e.g., digital files including layout information of standard cell library 708. Memory 754 may be implemented, e.g., as a non-volatile memory, in any way known in the art.

Communication interface 758 is configured to transmit to, e.g., other computing devices and/or other storage mediums intermediate or final outputs generated during method 700, such as during step 702, such as, e.g., digital files including layout information of standard cell library 708.

In some embodiments, one or more steps of method 700 may be implemented in different computing devices.

Figure 8D:
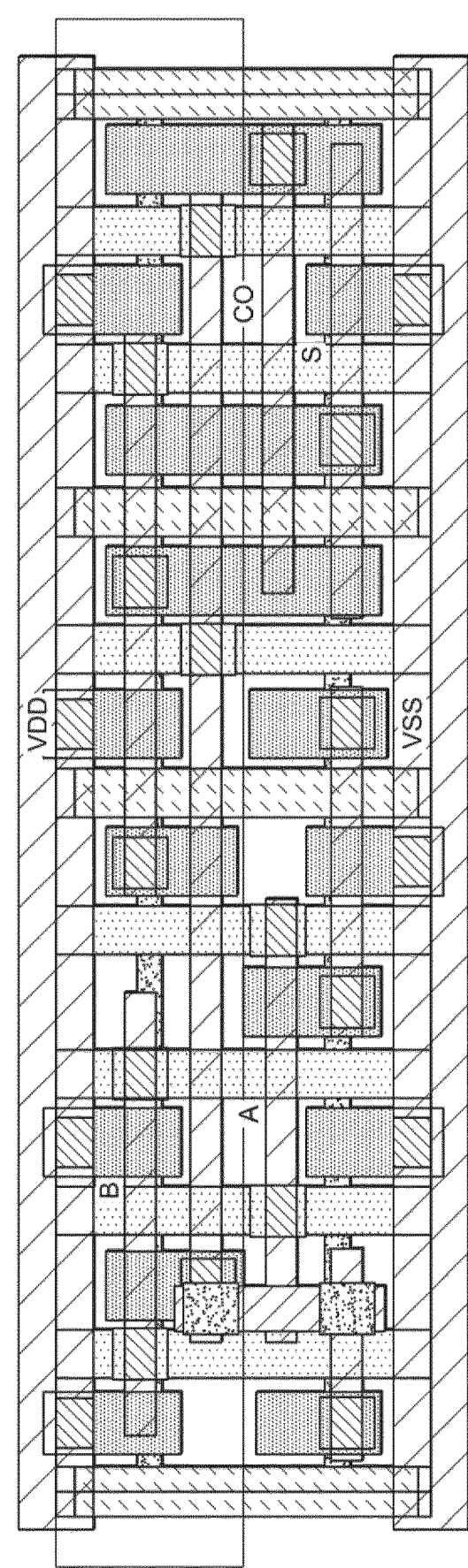

FIGS. 8A-8D show four different representations of a half-adder cell, according to an embodiment of the present invention. FIG. 8A shows a truth table of a half-adder, where A and B are first and second inputs, respectively, and C and S are the outputs carry, and sum, respectively. FIG. 8B shows schematic diagram 800 that implements the truth table of FIG. 8A in a CMOS circuit.

FIG. 8C shows a netlist that implements circuit 800. In some embodiments, the connectivity list is an abstract representation for the design or layout of electrical components needed to implement a desired logic behavior for a standard cell design that, e.g., may be stored in a digital file.

As shown in FIG. 8C, the netlist includes all components (transistors in this example) of circuit 800, specifying gate, input, and output signals for each transistor. The netlist also includes referenced to power sources (VDD and VSS), in which power sources may be understood as nodes or rails capable of delivering power to the transistors. In some embodiments, the netlist (also referred to as the connectivity list) includes a transistor name with references to the connections for the input, output, and gate-signal for the transistor. For example, the M13 transistor is the NMOS transistor located on the far right of FIG. 8B, connected to VSS (GND), the node N4, and the carry output. As shown in FIG. 8B, node N4 provides a common electrical characteristic, feature, or connection between transistors M3, M4, M5, M6, M8, and M12. The remaining nodes are representative of the common connections between the transistors shown in FIG. 8B. In some embodiments, the netlist of FIG. 8C may be expanded to include other circuit details, such as the type of transistor (n-type or p-type), for example.

FIG. 8D shows an exemplary physical layout of circuit 800, in a 5.5T (i.e., cell height=5.5 metal tracks) FinFET design. In some embodiments, the netlist (e.g., as shown in FIG. 8C) is the input data used to perform step 702. For example, in some embodiments, generating the netlist is the first step for converting a circuit design existing in a theoretical or virtual model (e.g., FIG. 8B) to the physical manifestation or physical layout (e.g., FIG. 8D).

FIG. 9 shows a flow chart of embodiment method 900 for automatically generating a physical layout of a standard cell based on a netlist, according to an embodiment of the present invention. Step 702 may be performed as method 900 and may be implemented by computing device 750.

Method 900 may be understood as a method that includes device placement steps (steps 902, 904, 906, 908, 910, 912, 914, and 918), and device routing steps (steps 916 and 920). In some embodiments, the device placement steps may be performed automatically (e.g., as described in method 900) while the placement steps may be performed in a conventional manner. In some embodiments, the device routing steps may be performed automatically (e.g., as described in method 900) while the placement steps may be performed in a conventional manner.

During step 902, a netlist is received and transistor pairs having a first type of shared connection (e.g., gates connected together) are identified. In some embodiments, the first type of connection may be a free connection, in which the term free connection may be understood as a connection that can be made by placement and without a routing effort. In some embodiments, the first type of connection may be referred to as the most important free connection. In some embodiments, such as in planar transistors, FinFETs and TriGate transistors, the gates of complementary transistors are the first type of free connections, in which a single poly-gate switches both p-type and n-type transistors. In other embodiments, such as in architectures based on heterogeneous sequential 3D integration, the first type of free connection may be different than the gate (e.g., such as source/drain). Some embodiments may exhibit more than one free connection. For example, in stacked transistor architectures, a first type of free connection may refer to horizontal connectivity between transistors in the same stack layer, and a second type of free connection may refer to vertical connectivity between transistors in different layers of the stack.

During step 904, objects for each of the transistor pairs identified in step 902 are formed, where each object is identified by the inputs and outputs (e.g., the common gate input as well as the nFET and pFET inputs and outputs). In some embodiments, the objects are programming objects, such as object oriented data structures, matrices, or vectors, e.g., of tensors. In some embodiments, the objects formed during step 904 do not specify signal flow direction, and such signal flow may be reversed (e.g., between drains and sources) without changing functionality.

During step 906, the transistor-pair objects generated during step 904 are clustered based on common inputs/outputs of the transistor-pair objects. For example, after identifying inputs and outputs of each of the transistor-pair objects, when two transistor-pair objects share a common connection (e.g., transistor-pair objects are connected to the same node), then such two transistor-pair objects are clustered together. In some embodiments, the clustering is performed by associating transistor-pair objects, e.g., using pointers (e.g., stored in the transistor-pair objects) or database tables, e.g., stored in memory 754. In some embodiments, other programing techniques known in the art may be used.

During step 908, transistor-pair objects are flipped to align common input/output of transistor-pair objects to cluster such flipped transistor-pair objects when sharing a common input/output. In some embodiments, the flipping is performed, e.g., by data structure, vector, or matrix transformations. In some embodiments, other programing techniques known in the art may be used. In some embodiments, steps 906 and 908 may be performed together.

During step 910, merge transistor-pair objects and clusters of transistor-pair objects into larger clusters by overlapping common input/outputs. In some embodiments, the merging is performed by, e.g., associating inputs/outputs of the transistor-pair objects using, e.g., pointers or database tables. In some embodiments, other programing techniques known in the art may be used. In some standard cells, the entire logic function may be rendered in a single cluster during step 910. In some standard cells, more than one cluster may be used to render the entire logic function.

During step 912, unnecessary internal nodes (also referred to as closed internal nodes or completed nodes) are identified and eliminated. In some embodiments, the elimination of unnecessary internal nodes is performed by, e.g., removing references to nodes from a set of open nodes stored in memory 754. Nodes that need further connectivity (e.g., nodes that should be connected to another node, but are not connected as clustered during step 910) are identified.

During step 914, the clusters are arranged according to a technology-specific wire track plan in a cluster map, e.g., so that it resembles a final physical layout rendering. In some embodiments, the track plan includes wiring rules (e.g., minimum metal length, connection restrictions, etc.) as well as number of tracks. For example, in some embodiments, the technology-specific wire track plan may require a single row, and, thus, the clusters are arranged in a single row in such technologies. Other technologies may allow for a plurality of rows, such as 2, 4, or more (which may be referred to as multi-row height cells). In some embodiments, the clusters extend beyond a single column, such as 20 columns or more. In some embodiments, the cluster map generation comprises the generation of a digital file that includes location information of the components identified in the netlist with respect to the track plan, such as the location of gate, source, and drain contacts with respect to different tracks and columns of the track plan.

In some embodiments, a cost function may be used to reward the arrangement, e.g., based on reducing cell-internal wiring congestion. In some embodiments, machine learning trained models may be used for optimizing the placement (e.g., reducing cell-internal wiring congestion), e.g., based on the cost function.

During step 916, open nodes (e.g., nodes still requiring a connection after step 912 or 914) are identified in the cluster map. For example, nodes to be connected to external circuits (e.g., pins) or nodes to be connected to other nodes inside the cluster may be identified as open nodes. In some embodiments, the identification of an open node may be performed, e.g., by using a bit in a register or data structure in memory 754 indicative of whether a node requires a connection.

During step 918, each column of the technology-specific wiring track plan is mapped into a predefined technology construct from a set of predefined technology constructs. The set of predefined technology constructs includes a finite number of possible implementations (e.g., all possible implementations) of basic devices (e.g., pFET and nFET) in a particular technology-specific wiring track plan. In some embodiments, the set of predefined technology constructs is manually generated. For example, as will be described in more detail later, e.g., with respect to FIG. 11K, in some embodiments, each construct is available in layout form. In some embodiments, the mapped layout constructs are stored in a digital file in the form of a (e.g., partial) physical semiconductor layout. In some embodiments, a different set of construct may be used instead of the construct illustrated in FIG. 11K for mapping the track plan (e.g., as illustrated in FIG. 11I) into a physical layout.

After selection and placement of the predefined technology constructs according to the output of step 914, routing of the remaining open nodes are performed, e.g., using off-the-shelf routing tools. The output of step 920 is a final layout, which may be, e.g., rendered on a monitor and/or printed in paper or other medium, and/or may be exported, e.g., for the generation of corresponding masks for the fabrication of semiconductor devices, in which the fabrication of the semiconductor devices may be performed by applying photoresists and patterning a substrate based on the generated masks.

In some embodiments, files associated with intermediate steps during steps 902, 904, 906, 908, 910, 912, 914, 916, 918, and/or 920, may be (e.g., temporarily or permanently) stored in memory 754 and may be read from memory 754 during steps 902, 904, 906, 908, 910, 912, 914, 916, 918, and/or 920. For example, in some embodiments, objects, such as transistor-pair objects, clusters of transistor-pairs, flipped clusters of transistor pairs, etc., may be stored and read back from memory 754 during the step in which the objects are created, or any step thereafter. Digital files that include information associated with track planning, routing, placement, and layout (e.g., generated during steps 914, 916, 918, and/or 920), may also be stored in memory 754, and may be read from memory 754 during the step in which the files are created, or any step thereafter. Representations of the objects and/or information (e.g., stored in digital files) created or used during any of the steps 902, 904, 906, 908, 910, 912, 914, 916, 918, and/or 920 may be displayed in display 756 during the step in which the object or information is created or used, or any step thereafter.

In some embodiments, the resulting physical layout (e.g., which may be stored in a digital file in memory 754) of the (e.g., one or more) standard cell (e.g., or of the entire standard cell library 708) may be used for RC extraction (during step 612) and allow for the generation of the corresponding netlist that includes parasitics (step 616) for performing cell characterization (620).

In some embodiments, performing one or more of steps 902, 904, 906, 908, 910, 912, 914, 916, and/or 918, advantageously improves a device for generating standard cell layouts for a standard cell layout library, e.g., by reducing the time it takes for achieving, e.g., optimum, layouts for a particular track plan, which advantageously allows for the evaluation of a technology node early in the design phase.

Figure 10:
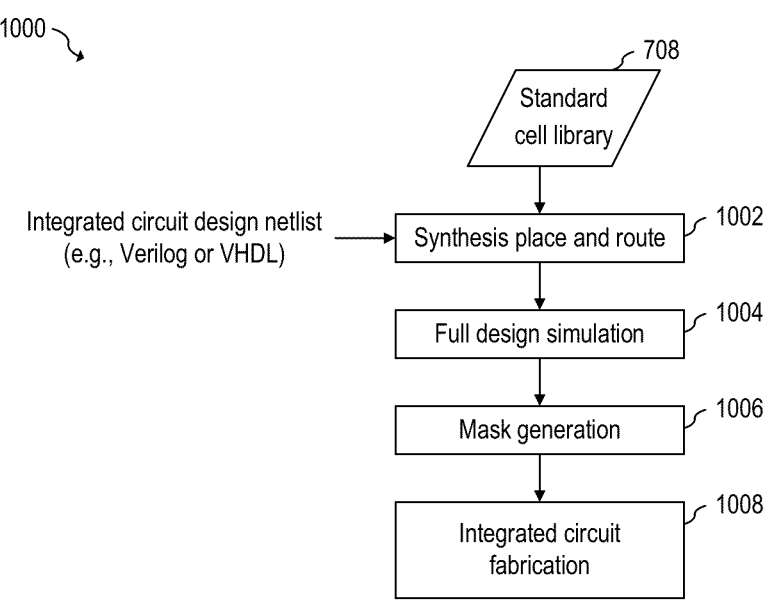
FIG. 10 shows a flow chart of an embodiment method for designing and fabricating an integrated circuit using standard cell library of FIG. 7A, according to an embodiment of the present invention.

FIG. 10 shows a flow chart of embodiment method 1000 for designing and fabricating an integrated circuit using standard cell library 708, according to an embodiment of the present invention.

During step 1002, synthesis, place and route of an integrated circuit design netlist is performed using standard cells of standard cell library 708. During step 1004, (e.g., full) design simulation is performed based on the integrated circuit layout generated during step 1002. During step 1006, a mask set with masks corresponding to the layout generated during step 1002 are fabricated. The mask set includes a set of masks that include geometric shapes corresponding to the patterns of metal, oxide, or semiconductor layers that make up the components of the integrated circuit. The mask set is sent to a semiconductor foundry during step 1008 for integrated circuit fabrication, e.g., using a photolithographic process.

Figure 11A:
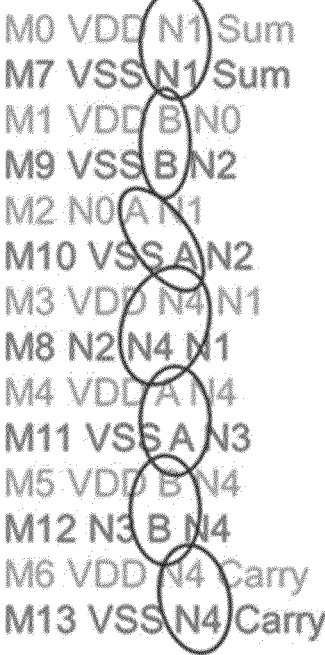
FIGS. 11A-11L illustrate the performance of the method of FIG. 9 for converting the netlist of FIG. 8C into a physical layout using non-stacked FinFET technology, according to an embodiment of the present invention.
Figure 11B:
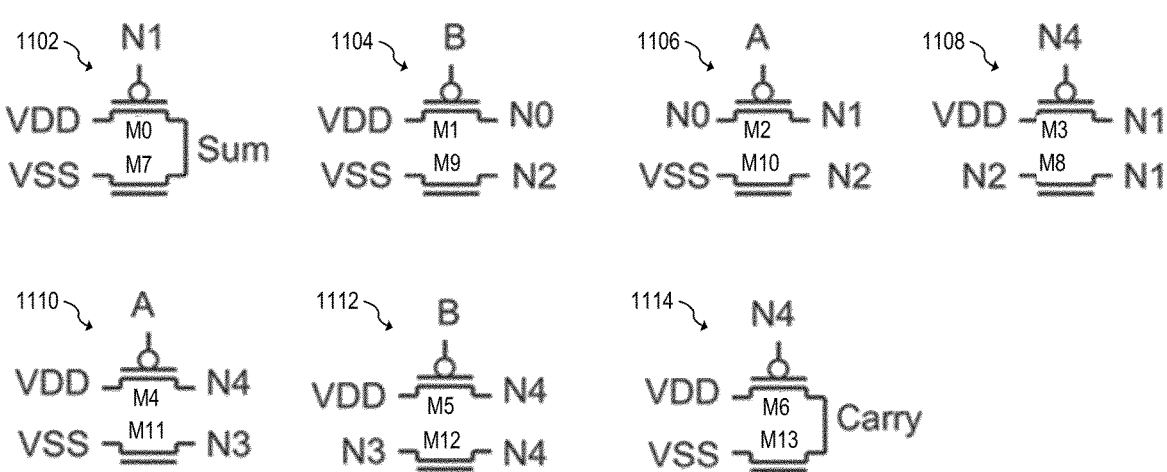
Figure 11C:
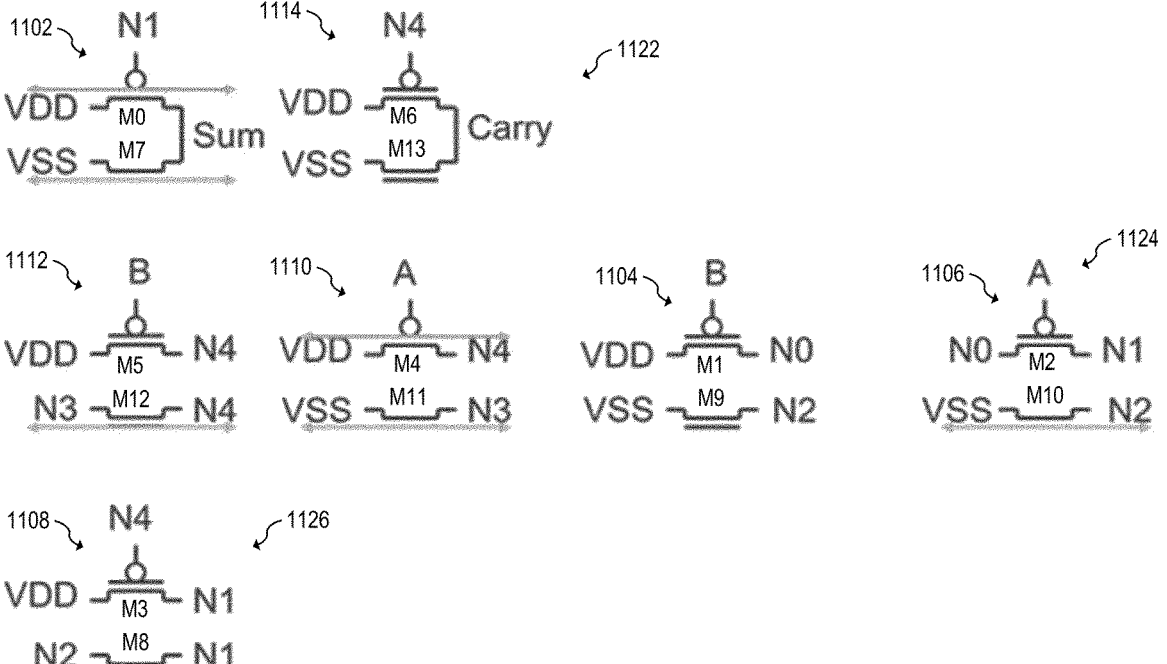
Figure 11D:
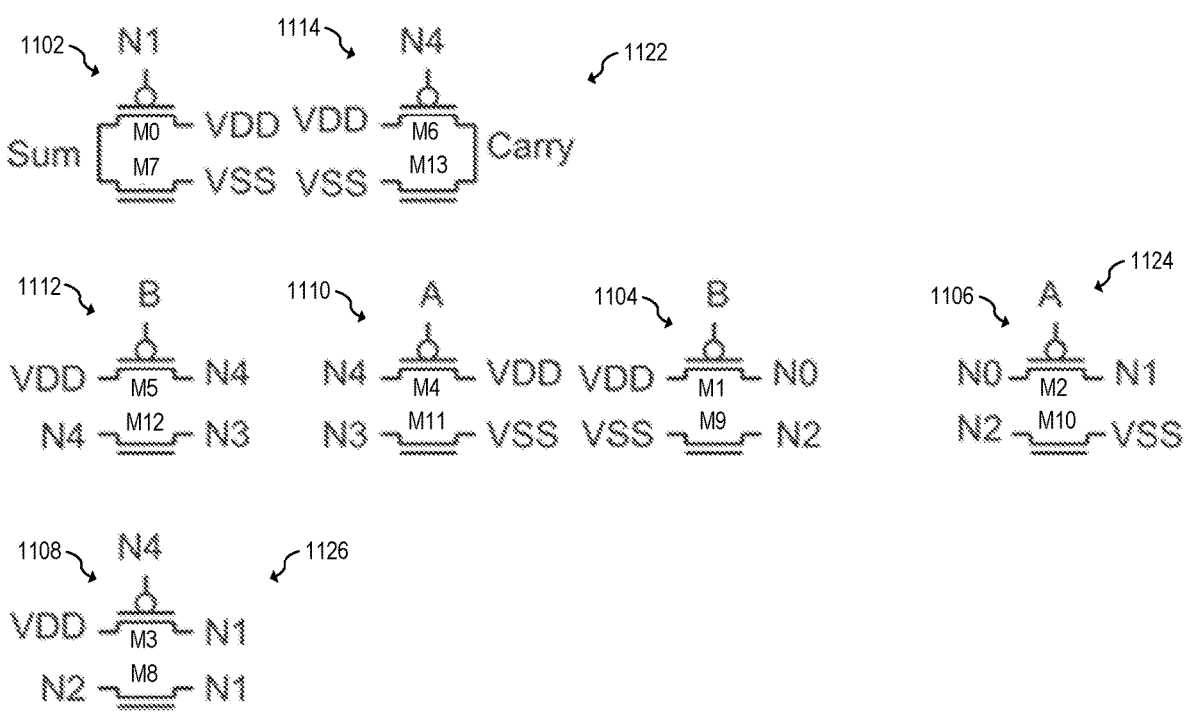
Figure 11E:
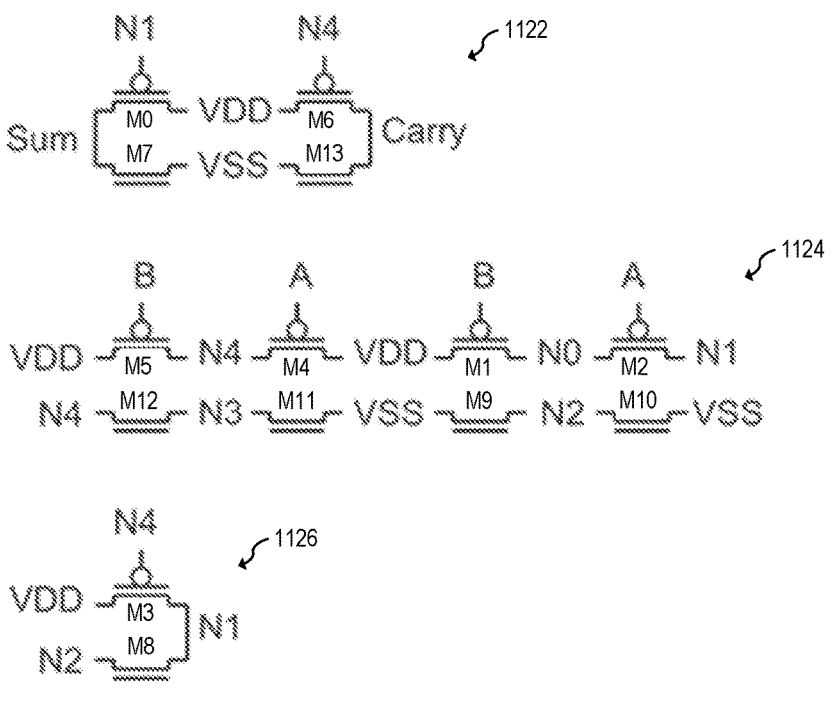
Figures 11F, 11G:
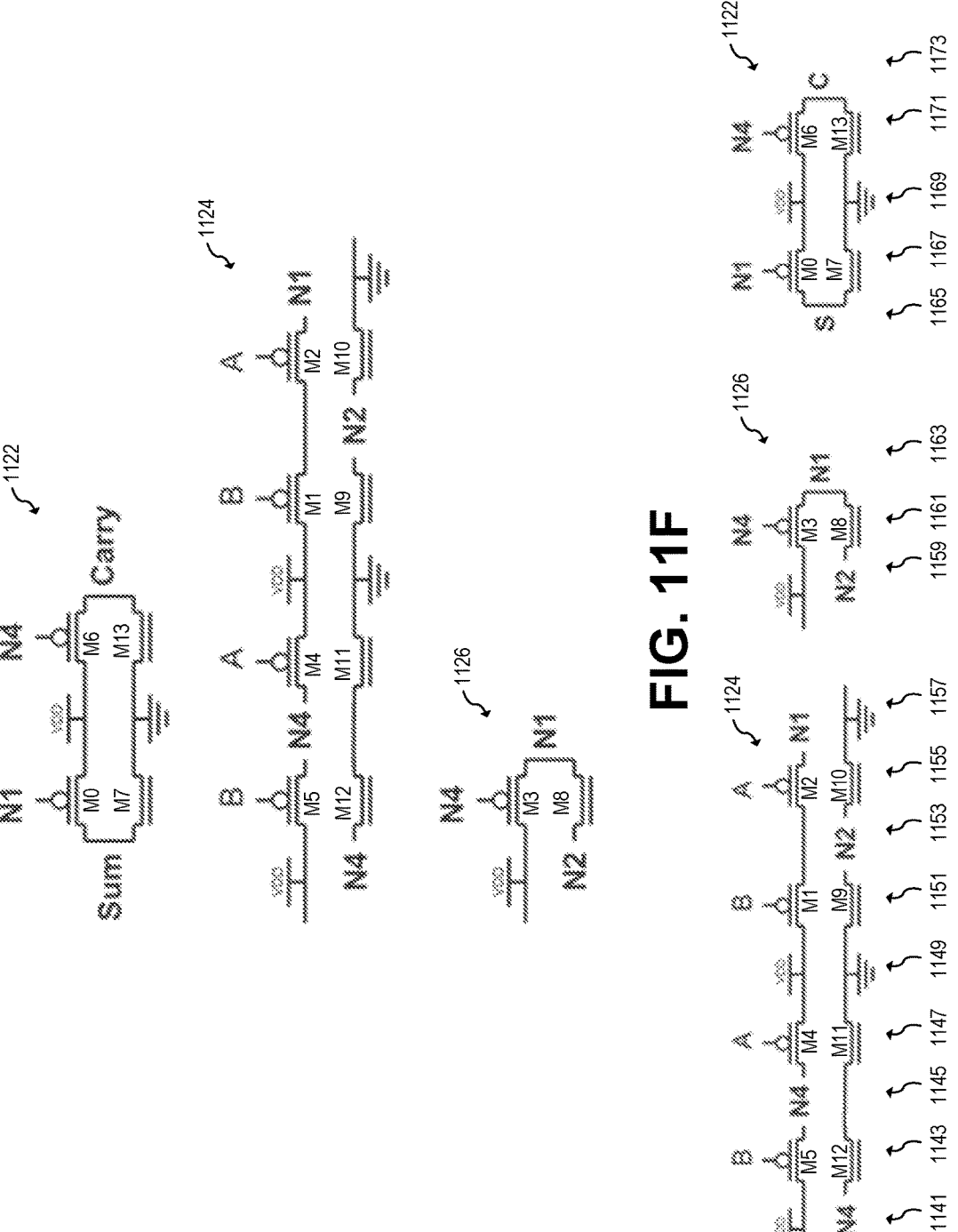
Figure 11H:
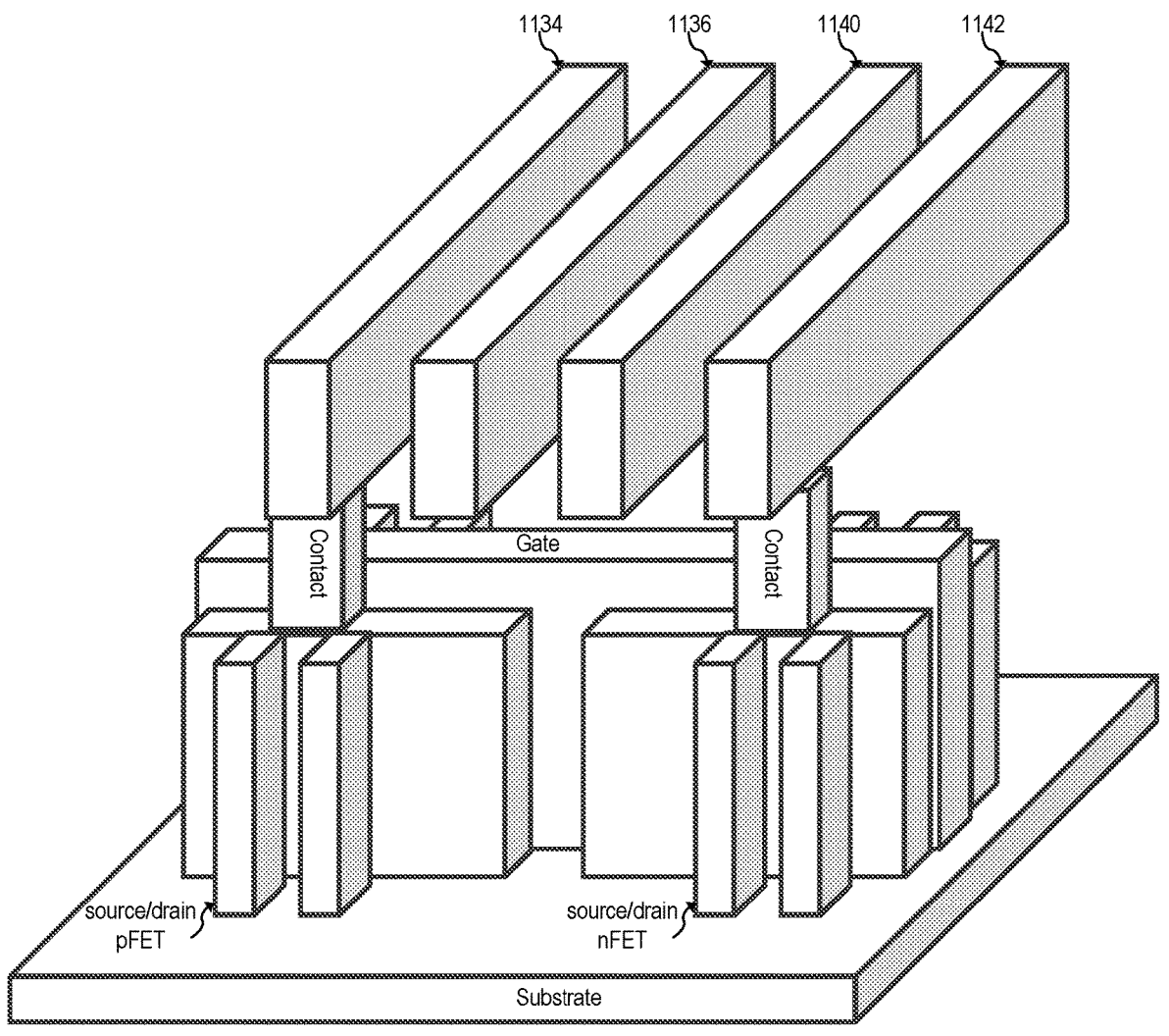
Figure 11I:
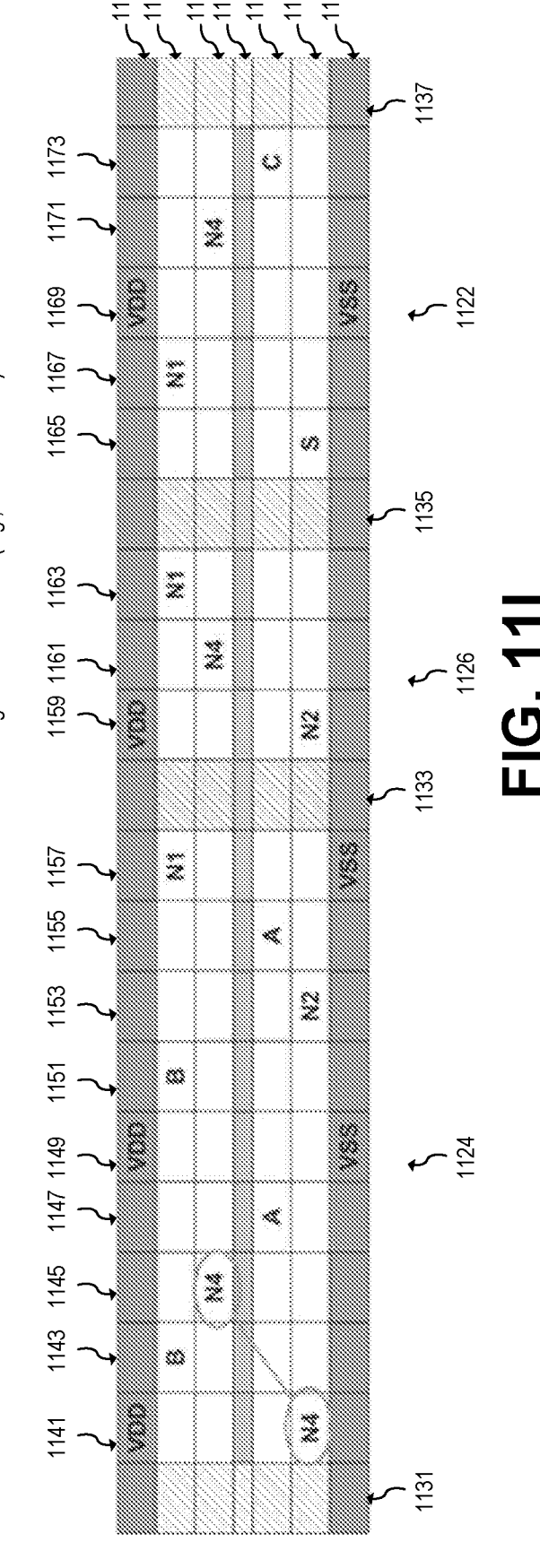
Figure 11J:
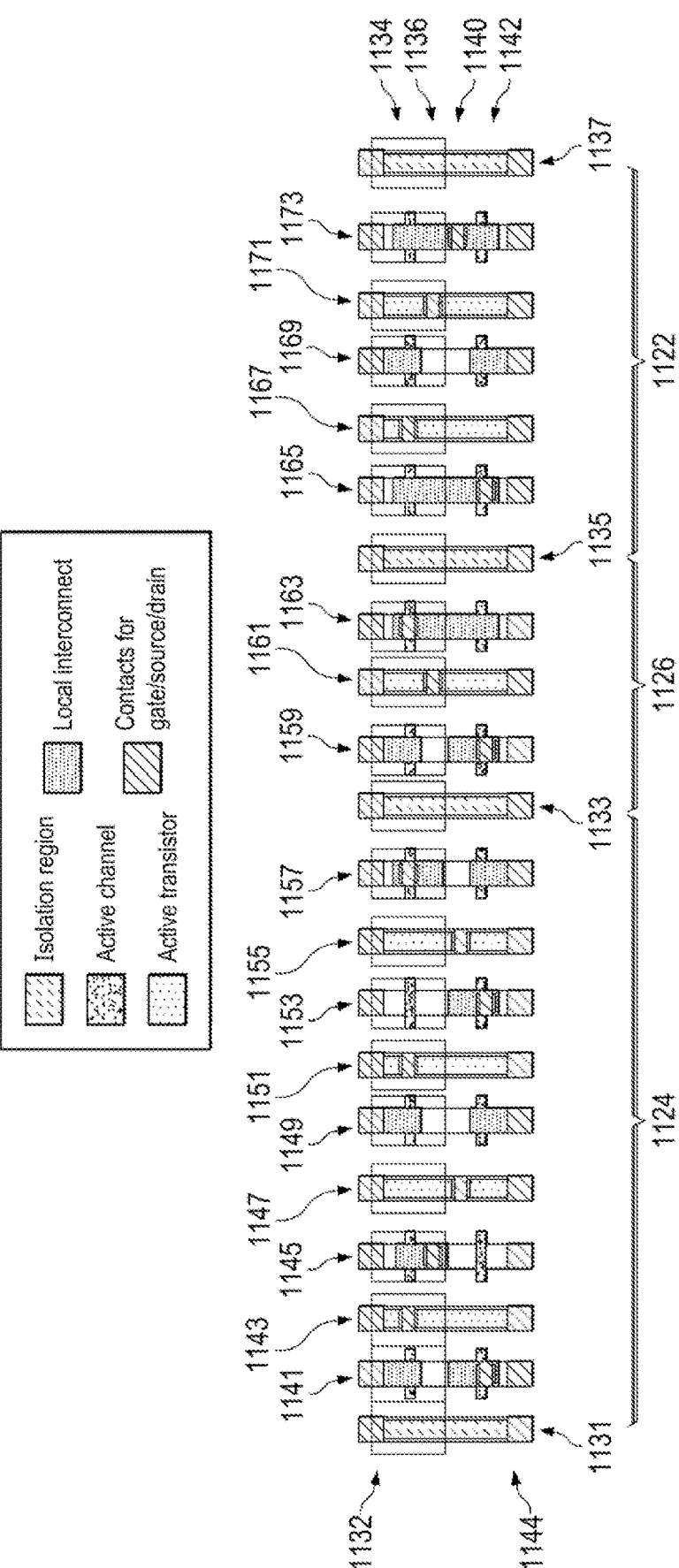
Figure 11K:
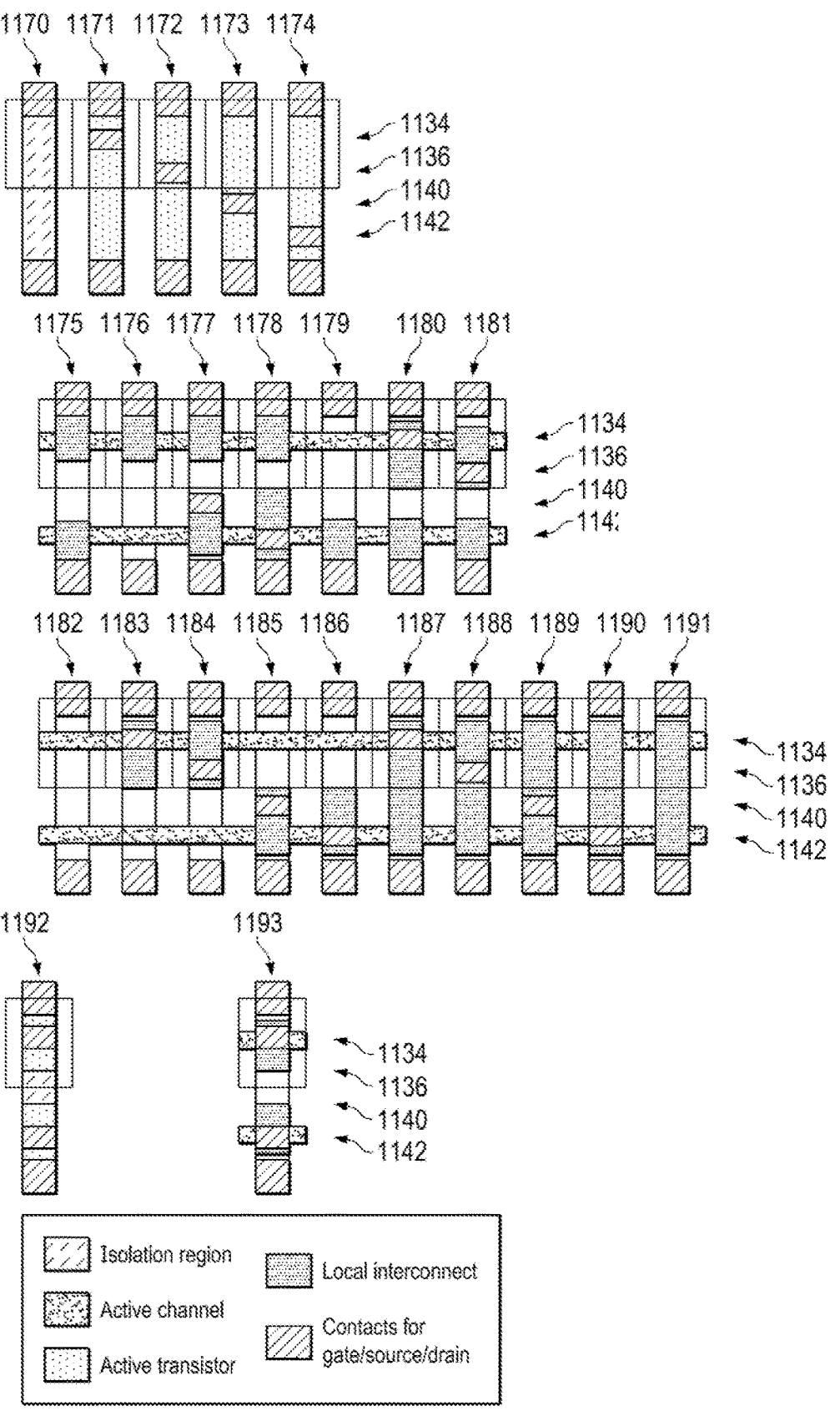
Figure 11L:
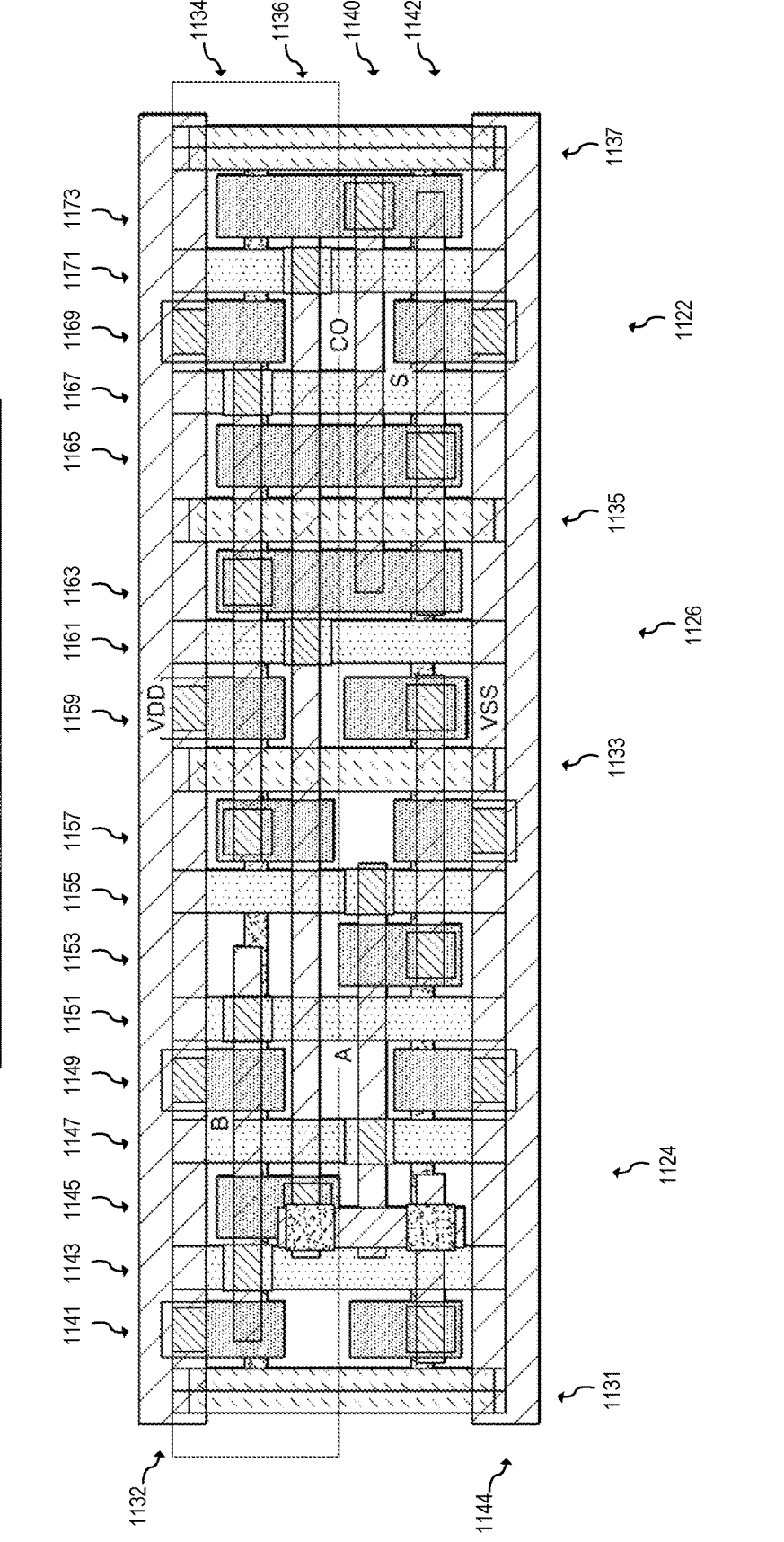

FIGS. 11A-11L illustrate the performance of method 900 for converting the netlist of FIG. 8C (half-adder) into a physical layout using non-stacked FinFET technology, according to an embodiment of the present invention. For example, FIGS. 11A, 11B, 11C, 11D, 11E, 11F, illustrate steps 902, 904, 906, 908, 910, and 912, respectively. Step 914 is illustrated in FIGS. 11G and 11I. Step 916 is illustrated in FIG. 11I, and steps 918 and 920 are illustrated in FIGS. 11J and 11L, respectively.

FIG. 11A illustrates the pairing complementary transistors having a common gate (step 902), according to an embodiment of the present invention. For example, the netlist of FIG. 8C includes pMOS transistors M0, M1, M2, M3, M4, M5, and M6, and nMOS transistors M7, M8, M9, M10, M11, M12, and M13. As shown in FIG. 11A, pMOS-nMOS pairs having a common gate are identified and paired together. For example, pMOS transistor M0 and nMOS transistor M7 share a common gate (gates of transistors M0 and M7 are connected to node N1). PMOS transistor M1 and nMOS transistor M9 share a common gate (connected to node B). PMOS transistor M2 and nMOS transistor M10 share a common gate (connected to node A). PMOS transistor M3 and nMOS transistor M8 share a common gate (connected to node N4). PMOS transistor M4 and nMOS transistor M11 share a common gate (connected to node A). PMOS transistor M5 and nMOS transistor M12 share a common gate (connected to node B). PMOS transistor M6 and nMOS transistor M13 share a common gate (connected to node N4).

Although FIG. 11A illustrates step 902 as applied to a FinFET device, a similar or identical step may be performed for other technologies, such as for a CFET device.

In some embodiments, each complementary transistor pair identified in FIG. 11A becomes an object, as shown in FIG. 11B. The object may be a data structure, a vector of tensors, or other. For example, as shown in FIG. 11B, the objects identified in FIG. 11 (step 902) may be represented as transistor icons. For example, complementary transistor pair M0/M7 is represented as object 1102, having gate input N1 (which is connected to the gates of transistors M0 and M7), and input/output terminals VDD, VSS, and Sum. Complementary transistor pair M1/M9 is represented as object 1104, having gate input B (which is connected to the gates of transistors M1 and M9), and input/output terminals VDD, VSS, N0 and N2. Complementary transistor pair M2/M10 is represented as object 1106, having gate input A (which is connected to the gates of transistors M2 and M10), and input/output terminals N0, VSS, N1 and N2. Complementary transistor pair M3/M8 is represented as object 1108, having gate input N4 (which is connected to the gates of transistors M3 and M8), and input/output terminals VDD, N2, and N1. Complementary transistor pair M4/M11 is represented as object 1110, having gate input A (which is connected to the gates of transistors M4 and M11), and input/output terminals VDD, VSS, N4 and N3. Complementary transistor pair M5/M12 is represented as object 1112, having gate input B (which is connected to the gates of transistors M5 and M12), and input/output terminals VDD, N3, and N4. Complementary transistor pair M6/M13 is represented as object 1114, having gate input N4 (which is connected to the gates of transistors M6 and M13), and input/output terminals VDD, VSS, and Carry.

In some embodiments, the transistor icons of the identified objects (e.g., as shown in FIG. 11B) may be displayed in display 756.

Although FIG. 11B illustrates step 904 as applied to a FinFET device, a similar or identical step may be performed for other technologies, such as for a CFET device.

FIGS. 11C-11F illustrates steps of method 900 for, e.g., optimizing and/or modifying the arrangement of transistor pair objects within the construct of electrical design as implemented with FinFETs, e.g., so that a resulting physical layout or arrangement of the electrical design component is, e.g., smaller and/or easier to route and to enable a real-world operation of the electrical design (in this example, the half-adder).

FIG. 11C illustrates the associating of transistor-pair objects into clusters based on common input/output connections (step 906), according to an embodiment of the present invention. For example, transistor-pairs 1102 and 1114 share common input/outputs (VDD and VSS). Transistor-pairs 1112, 1110 share common input/outputs (VDD, N3, and N4). Transistor-pairs 1110 and 1104 share common input/outputs (VDD, and VSS). Transistor-pairs 1104 and 1106 share common input/outputs (N0, and VSS). As shown in FIG. 11C, three clusters (1122, 1124, and 1126) are identified.

In some embodiments, transistors-pair objects may be wholly or partially mirrored about the y-axis without changing functionality. Thus, as shown in FIG. 11C, transistors of transistor-pairs that could benefit from flipping (e.g., because of a share connection) are identified. As shown in FIG. 11C, in this example, transistors M0, M7, M12, M4, M11, and M10 are identified for flipping.

As can be seen from FIG. 11C, other clusters and transistor-pair associations are possible (e.g., objects 1108 and 1106 could be associated based on the common nodes N1 and N2). As can also be seen in FIG. 11C, other transistors flipping can be identified (e.g., flipping transistor 1112 and not flipping transistor 1110 based on shared connection VDD). In some embodiments, all possible associations and permutations of transistor-pairs are evaluated, and the association resulting in the lower number of clusters is selected.

In some embodiments, all possible associations and permutations of transistor-pairs and transistor flipping are evaluated, and the association resulting in the lower number of clusters and/or minimize the distance between nodes is selected.

FIG. 11D illustrates the transistor-pair objects after cluster association and transistor flipping (as identified in FIG. 11C), based on common input/output connections (step 908), according to an embodiment of the present invention.

FIG. 11E illustrates the merging of (e.g., duplicate shared) nodes after step 908 (step 910), according to an embodiment of the present invention. For example, transistor-pair objects (e.g., as shown in FIG. 11D) each include a gate node (that connects to the gates of the complementary transistors), two inputs, and two outputs (for each of the complementary transistors. During step 910, duplicate shared nodes are merged, and the resulting clusters may have less than the number of input/outputs of their combined transistor pairs. For example, in addition to gate nodes N1 and N4, cluster 1122 includes 4 input/output nodes (Sum, VDD, VSS, and Carry), which is less than the 6 input/output nodes shown for cluster 1122 in FIG. 1D. In cluster 1124, an N4 node (between transistors M5 and M4), an N3 node (between transistors M12 and M11), a VDD node (between transistors M4 and M1), a VSS node (between transistors M11 and M9), an N0 node (between transistors M1 and M2), and an N2 node (between transistors M9 and M10), are respectively merged. A node N1 is merged from cluster 1126. In some embodiments, transistor icons of the merged clusters are displayed in display 756 (e.g., as shown in FIG. 11E).

FIG. 11F illustrates the elimination of nodes that are only local to the cluster and do not require external connectivity, either internally or to other clusters (step 912), according to an embodiment of the present invention. For example, in cluster 1122, since Sum and Carry are external pins of the standard cell, VDD and VSS are power supply nodes, and nodes N1 and N4 are gate nodes, no nodes are eliminated. In cluster 1124, nodes N3 and N0 are local to cluster 1124 and are therefore eliminated. Node N4 requires further internal connectivity (between a current path terminal of transistor M12 to a current path terminal of transistor M5), and therefore, is not eliminated (Node N4 also connects to other clusters, and thus is kept also for such reasons). Nodes N2 and N1 connect to clusters 1122 and/or 1126 and are thus not eliminated. Nodes A and B are external pins of the standard cell and are therefore not eliminated. In cluster 1126, no nodes are eliminated. In some embodiments, transistor icons of the resulting clusters are displayed in display 756 (e.g., as shown in FIG. 11F).

FIG. 11G illustrates the arrangement of clusters 1122, 1124 and 1126 in a technology-specific wire track plan (step 914), according to an embodiment of the present invention. In this example, the wire track plan is constrained to a single row of complementary transistor-pairs, and thus, clusters 1122, 1124 and 1126 are arranged in a single row (as shown in FIG. 11G). In some embodiments, transistor icons of the resulting cluster arrangement are displayed in display 756 (e.g., as shown in FIG. 11G).

FIG. 11H illustrates a 3D view of a technology specific wire track plan for non-stacked FinFETs, according to an embodiment of the present invention. As shown in FIG. 11H, the track plan includes 4 signal tracks (1136, 1138, 1140 and 1142). Signal tracks 1134 and 1136 may be used to route the gate or a source/drain of the pFET using a contact. Signal tracks 1140 and 1142 may be used to route the gate or a source/drain of the nFET using a contact. It is understood that the 3D view illustrated in FIG. 11H is a non-limiting example that corresponds to a specific arrangement of devices in the track plan (in this example, corresponding to construct 1193 illustrated in FIG. 11K), and that the placement of, e.g., contacts and other connections may be different, may connect different nodes or be omitted depending on the particular connections to be made (e.g., as shown by the various constructs illustrated in FIG. 11K).

It is understood that the track plan illustrated in FIG. 11H is a non-limiting example of a possible track plan. For example, a track plan with a different number of tracks or with different access to the tracks may also be used. For example, in some embodiments, the track plan may include less than 4 signal tracks, such as 3 or 2, for example. In some embodiments, the track plan includes more than 4 tracks, such as 5, 6, 8, or more track.

FIG. 11I illustrates the mapping (e.g., step 914) of the clusters arrangement, e.g., as shown in FIG. 11G into the technology-specific wire track plan illustrated in FIG. 11H, according to an embodiment of the present invention. As shown, the wire track plan includes a single row of tracks that includes tracks 1132, 1134, 1136, 1140, and 1142. Tracks 1132 and 1144 correspond to power-rails VDD and VSS (or ground), respectively. Track 1138 illustrates the separation between nMOS and pFET as is not used for routing signals (in this example, pFETs are located in the top half above track 1138 and nFETs are located in the bottom half below track 1138). Tracks 1134, 1136, 1140, and 1142 are available signal wiring tracks that can be used for routing.

Each column shown in FIG. 11I represents possible location of nodes or electrical isolation structures, such as diffusion breaks. Diffusion breaks may be used for isolation purposes, e.g., whenever transistors can not be placed such that the output of one transistor becomes the input of the neighboring transistor. For example, columns 1131, 1133, 1135, and 1137 represent diffusion breaks with may be filled with dummy poly. In some embodiments, such diffusion breaks separate clusters as well as separate the half-adder cell from adjacent cells. In some embodiments, diffusion breaks separate the clusters. For example, in FIG. 11I, diffusion breaks 1133 and 1135 separate clusters 1122, 1124, and 1126, and diffusion breaks 1131 and 1137 separate the half-adder cell from adjacent cells.

Columns 1141, 1143, 1145, 1147, 1149, 1151, 1153, 1155, 1157, 1159, 1161, 1163, 1165, 1167, 1169, 1171, and 1173 correspond to transistor nodes, and are also illustrated in FIG. 11G. Thus, the cells at the intersection of columns 1141, 1143, 1145, 1147, 1149, 1151, 1153, 1155, 1157, 1159, 1161, 1163, 1165, 1167, 1169, 1171, and 1173, with rows 1132, 1134, 1136, 1140, 1142, and 1144 correspond to possible transistor node locations. For example, column 1141 includes the current path nodes of transistors M5 (connected to VDD at row 1132, column 1141) and M12 (connected to node N4 at row 1142, column 1141); column 1143 includes the gate nodes of transistors M5 (connected to node B at row 1134, column 1143) and M12 (at row 1142, column 1143 and connected to the cell at row 1134, column 1143); column 1145 includes the current path node of transistors M5 (at row 1134, column 1145) and transistor M4 (at row 1136, column 1145 and connected to node N4 and to the current path of transistor M5 at row 1134, column 1145) and transistor M11 (at row 1142, column 1145 and connected to the gate of transistor M5 at row 1142, column 1143); etc.

FIG. 11I also illustrates the identification of open nodes in the technology-specific wire track plan (step 916). For example, nodes B and N1 are identified in track 1134 of cluster 1124. Node N4 is identified in track 1136 of cluster 1124. Nodes A are identified in track 1140 of cluster 1124. Nodes N4 and N2 are identified in track 1142 of cluster 1124. Node N1 is identified in track 1134 of cluster 1126. Node N4 is identified in track 1136 of cluster 1126. Node N2 is identified in track 1142 of cluster 1126. Node N1 is identified in track 1134 of cluster 1122. Node N4 is identified in track 1136 of cluster 1122. Node C (Carry) is identified in track 1140 of cluster 1122. Node S (Sum) is identified in track 1142 of cluster 1122. Open connections internal to each cluster are also identified, e.g., which may be made in a higher level metal. For example, nodes N4 in tracks 1136 and 1142 of cluster 1124 may be connected to each other using metal M1 (e.g., the first layer of metal above the top of the semiconductor substrate).

As can be seen in FIG. 11I, the cell located at column 1141 and row 1142 corresponds to node N4 of transistor M12. The cell located at column 1143 and row 1134 corresponds to node B of transistor M5. The cell located at column 1145 and row 1136 corresponds to node N4 of transistor M5. The cell located at column 1147 and row 1140 corresponds to node A of transistor M11 (gate nodes are shared between complementary cells). The cell located at column 1151 and row 1134 corresponds to node B of transistor M1. The cell located at column 1153 and row 1142 corresponds to node N2 of transistor M9. The cell located at column 1155 and row 1140 corresponds to node A of transistor M10. The cell located at column 1157 and row 1134 corresponds to node N1 of transistor M2. The cell located at column 1159 and row 1142 corresponds to node N2 of transistor M8. The cell located at column 1161 and row 1136 corresponds to node N4 of transistor M3. The cell located at column 1163 and row 1134 corresponds to node N1 of transistor M3. The cell located at column 1165 and row 1142 corresponds to node S (Sum) of transistor M7. The cell located at column 1167 and row 1134 corresponds to node N1 of transistor M0. The cell located at column 1171 and row 1136 corresponds to node N4 of transistor M6. The cell located at column 1173 and row 1136 corresponds to node C (Carry) of transistor M13.

Cells at the power rail 1132 identified as VDD (cells at columns 1141, 1149, 1159, 1169) correspond to VDD nodes (e.g., for external connections). Cells at power rail 1144 identified as VSS (cells at columns 1149, 1157, 1169) correspond to VSS (ground) nodes (e.g., for external connections).

As can be seen in FIG. 11I, some nodes are shared among more than 1 cell. In some embodiments, thus, more than one cell can be used for routing connections (e.g., cells located at column 1145, rows 1134 and 1136 can both be used for connecting node N4). In some embodiment all possible cell selections are evaluated and the cells that result in the shortest wiring (shortest connections) is selected (in this example, the cell located at column 1145, row 1136 results in a shorter connection to the cell at column 1141, row 1142, and is thus selected. In some embodiments, similar nodes are assigned to the same track (in this example, node N4 is routed using track 1136).

In some embodiments, a representation of the track plan, e.g., as illustrated in FIG. 11I, is displayed in display 756 (e.g., as shown in FIG. 11I).

FIG. 11J illustrates the mapping of each column in the technology specific wiring track plan (columns 1131, 1133, 1135, 1141, 1143, 1145, 1147, 1149, 1151, 1153, 1155, 1157, 1159, 1161, 1163, 1165, 1167, 1169, 1171, and 1173, e.g., as shown in FIG. 11I) into predefined technology constructs ((also referred to as device layout constructs, e.g., as illustrated in FIG. 11K) from a set of predefined technology constructs (step 918), according to an embodiment of the present invention. Although gaps between constructs are illustrated in FIG. 11J, such gaps may not be present in the actual placement of the constructs in the layout.

The set of predefined technology constructs includes a finite number of possible implementations (e.g., all possible implementations) of basic devices (e.g., transistor) in a particular technology-specific wiring track plan. For example, FIG. 11K illustrates a set of predefined technology constructs with source/drain and gate connections for a 5.5T FinFET technology illustrated in FIGS. 11A-11L, according to an embodiment of the present invention. For example, construct 1170 corresponds to a diffusion break (e.g., implemented in columns 1131, 1133, 1135, and 1137). Constructs 1170-1193 correspond to possible implementations of pFET and nFET in the wiring plan, including different possible locations for source, gate, and drain connections. For example, constructs 1171, 1172, 1173, and 1174 corresponds to possible gate connection of complementary transistors, where the shared gate contact is on tracks 1134, 1136, 1140, or 1142, respectively. Constructs 1175 corresponds to VDD and VSS connections to pFET and nFET, respectively. Constructs 1176 corresponds to VDD connection to pFET. Constructs 1177 corresponds to VDD connection to pFET and nFET signal contact on track 1140. Constructs 1178 corresponds to VDD connection to pFET and nFET signal contact on track 1142. Constructs 1180 corresponds to VSS connection to nFET and pFET signal contact on track 1134. Constructs 1181 corresponds to VSS connection to nFET and pFET signal contact on track 1136. Constructs 1182 corresponds to a closed node with no connection. Constructs 1183-1186 corresponds to pFET signal contact on track 1134, 1136, 1140, and 1142, respectively. Constructs 1187-1190 corresponds to connecting pFET and nFET source/drain with such connections having a signal contact on track 1134, 1136, 1140, and 1142, respectively. Construct 1191 corresponds to connecting pFET and nFET source/drain with no other connection. Construct 1191 corresponds to split gate (gate of pFET and nFET contacted independently). Construct 1193 corresponds to pFET signal contact on track 1134 and nFET signal contract on track 1142.

Columns 1143, 1151, and 1167 are implemented as construct 1171. Columns 1161 and 1171 are implemented as construct 1172. Column 1147 and 1155 are implemented as construct 1173. Other columns are implemented with other constructs. For example, columns 1141 and 1159 are implemented with construct 1177; column 1145 is implemented as construct 1184; columns 1149 and 1169 are implemented as construct 1175; column 1153 is implemented as construct 1186; column 1157 is implemented as construct 1180; column 1163 is implemented as construct 1187; column 1165 is implemented as construct 1190; and column 1173 is implemented as construct 1189.

In some embodiments, a representation of the track plan using constructs (e.g., as shown in FIG. 11J, is displayed in display 756 (e.g., as shown in FIG. 11J).

FIG. 11L shows final layout of the half-adder in which routing of open nodes between constructs is performed using an off-the-shelf tool (step 920), according to an embodiment of the present invention. As shown in FIG. 11L, a signal wiring track is routed at track 1134 between columns 1143 and 1151, making contact in columns 1143 and 1151 for input B. A signal wiring track is routed at track 1134 between columns 1157 and 1167, making contact at columns 1157, 1163, and 1167 for node N1. A signal wiring track is routed at track 1140 between columns 1145 and 1155, making contact in columns 1147 and 1155, for input A of the half-adder. A signal wiring track is routed at track 1142 between columns 1153 and 1159, making contact at columns 1153, and 1159 for node N2.

In some embodiments, a representation of the final layout, e.g., as illustrated in FIG. 11L, is displayed in display 756 (e.g., as shown in FIG. 11L).

Figure 2A:
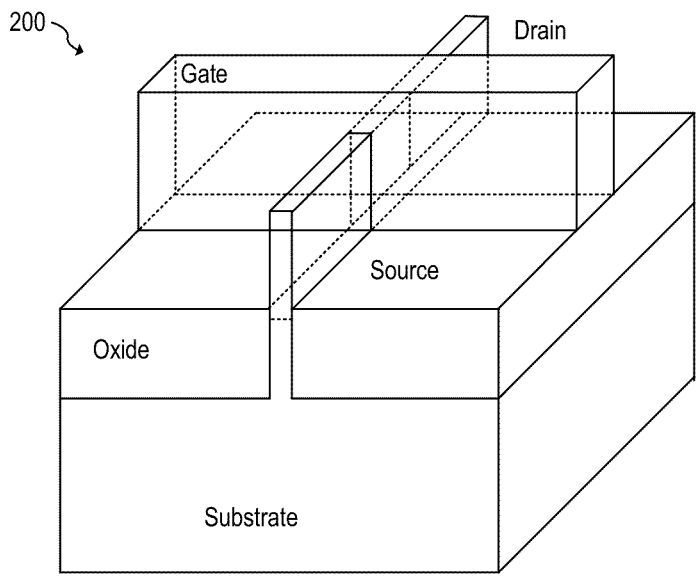
FIG. 2A shows an exemplary 3D Tri-Gate transistor.
Figure 2B:
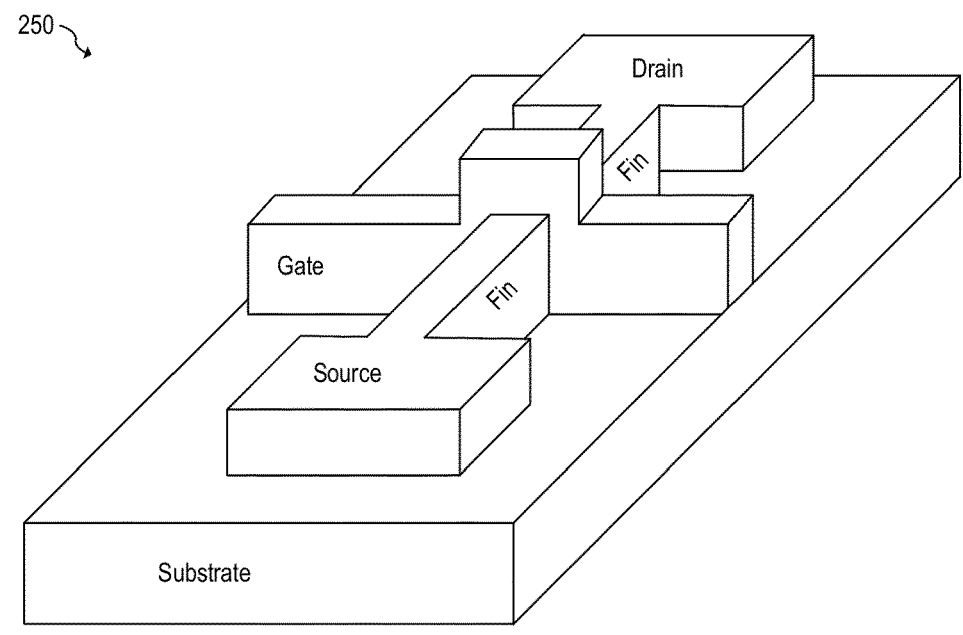
FIG. 2B shows an exemplary FinFET.
Figure 3:
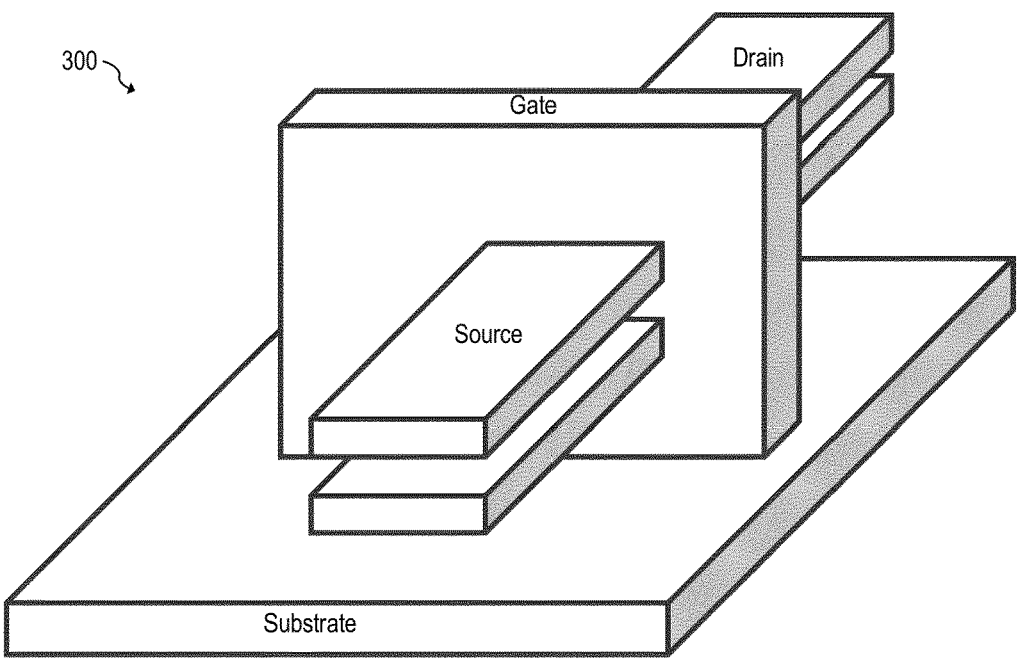
FIG. 3 shows an exemplary NS transistor.
Figure 4:
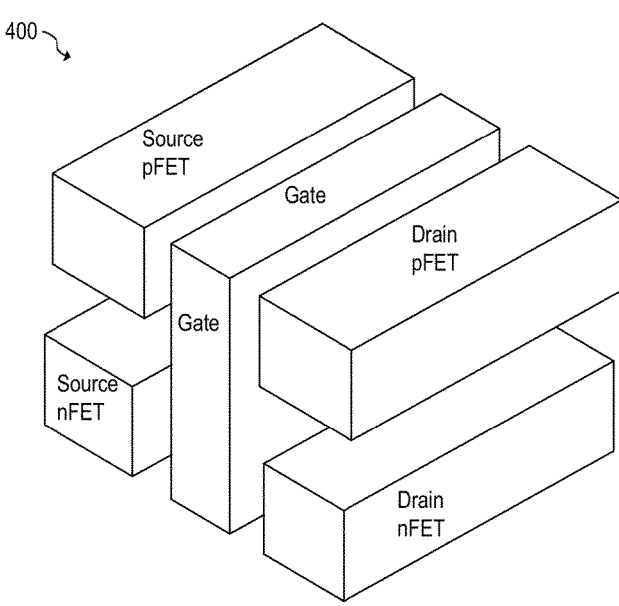
FIG. 4 shows an exemplary CFET.
Figure 5:
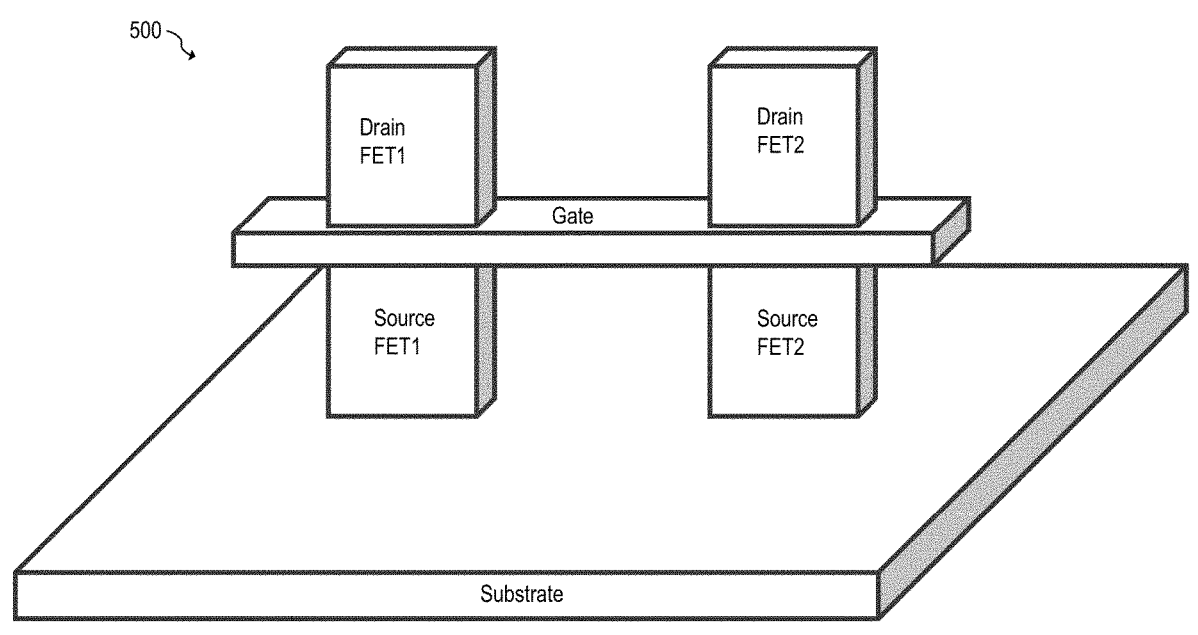
FIG. 5 shows an exemplary VFET.

As illustrated in FIGS. 11A-11L, method 900 may be implemented in non-stacked FinFET transistors (e.g., of the type shown in FIG. 3). A similar or identical method may be implemented in other types of non-stacked transistors architectures, such as in non-stacked planar transistors (e.g., of the type shown in FIG. 1), non-stacked TriGate transistors (e.g., of the type shown in FIG. 2A), and non-stacked NS transistor (e.g., of the type shown in FIG. 3). A similar implementation of method 900 may be performed for non-stacked CFETs (e.g., of the type shown in FIG. 4) and non-stacked VFETs (e.g., of the type shown in FIG. 5). For example, FIGS. 12A-12D illustrate the performance of steps 914, 916, 918, and 920 for converting the arrangement of clusters as illustrated in FIG. 11G to a physical layout using non-stacked CFET technology, according to an embodiment of the present invention.

Figure 12A:
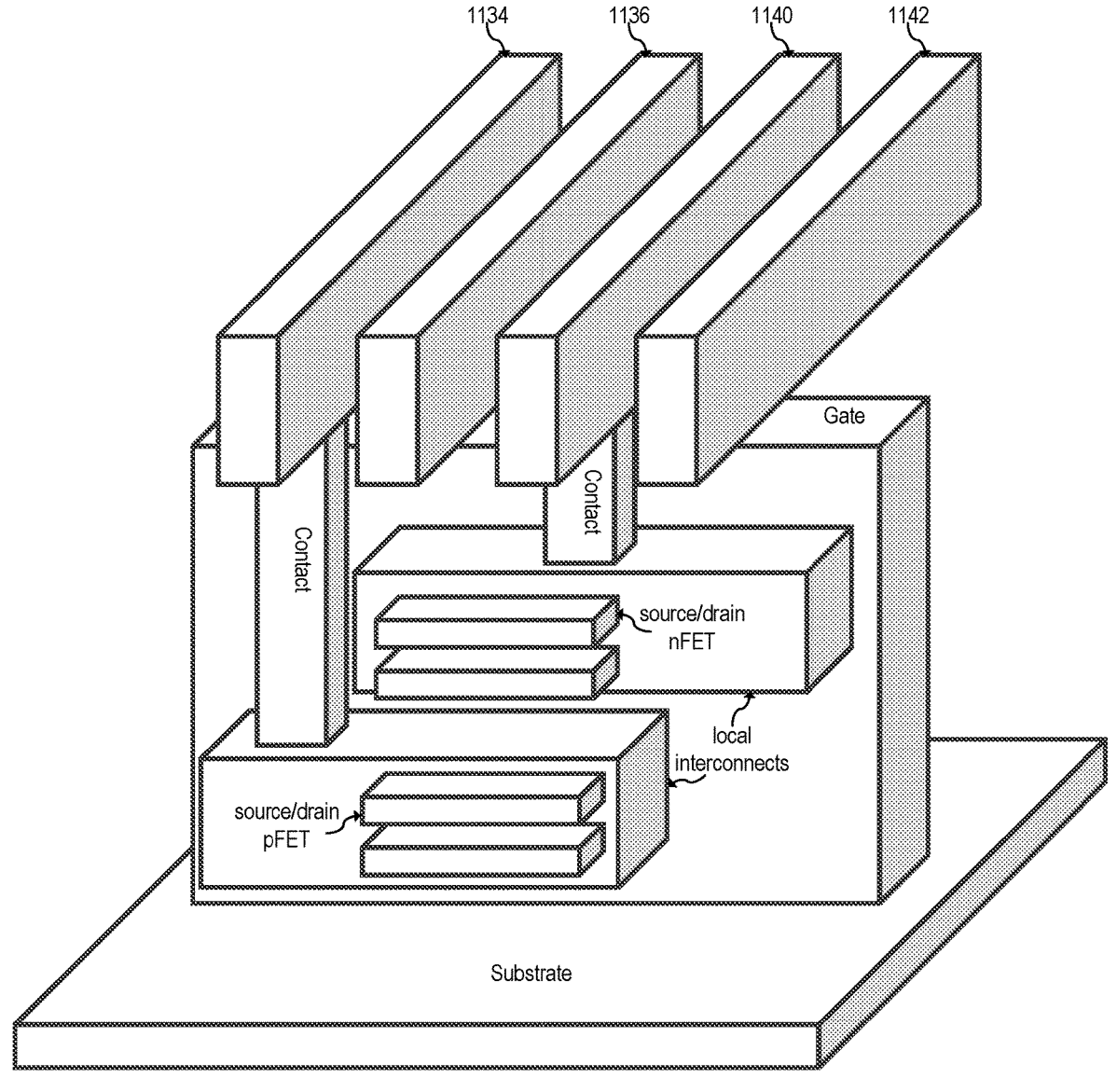
FIGS. 12A-12D illustrate the performance of steps of the method of FIG. 9 for converting the arrangement of clusters illustrated in FIG. 11G to a physical layout using non-stacked CFET technology, according to an embodiment of the present invention.
Figure 12B:
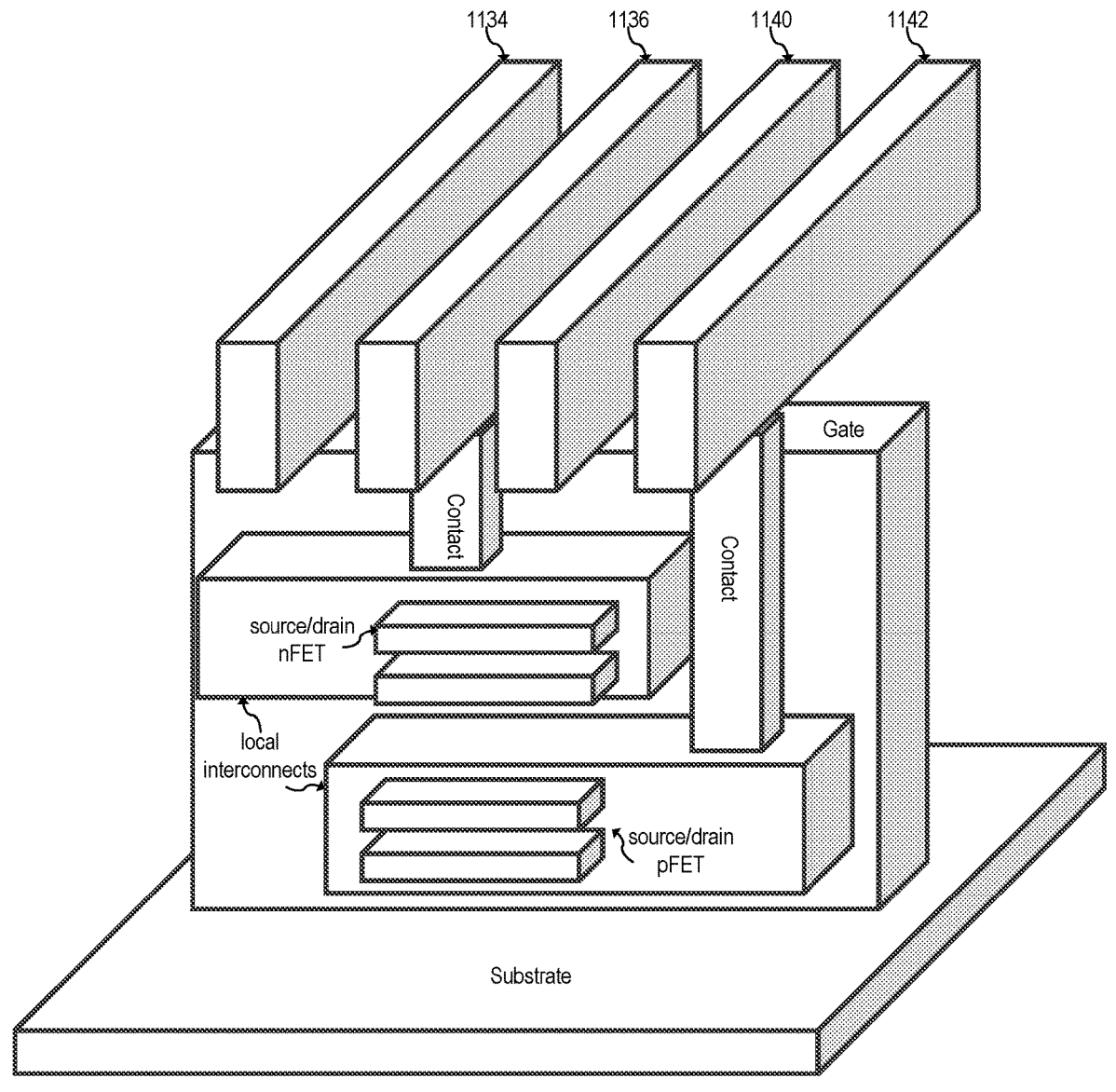

FIGS. 12A and 12B illustrate a 3D view of a technology specific wire track plan for a single stack of CFETs, according to an embodiment of the present invention.

In the track plan illustrated in FIGS. 12A and 12B, pFETs are capable of connecting to tracks 1134 and 1136 and nFETs are capable of connecting to tracks 1140 and 1142 when implemented in the configuration shown in FIG. 12A, and nFETs are capable of connecting to tracks 1134 and 1136 and pFETs are capable of connecting to tracks 1140 and 1142. As illustrated in FIGS. 12A and 12B, the track plan for CFETs is also capable of connecting source/drains without the use of a contact by routing horizontally in the layer where the source/drain is located using one of the two layers of local interconnects.

Figure 12C:
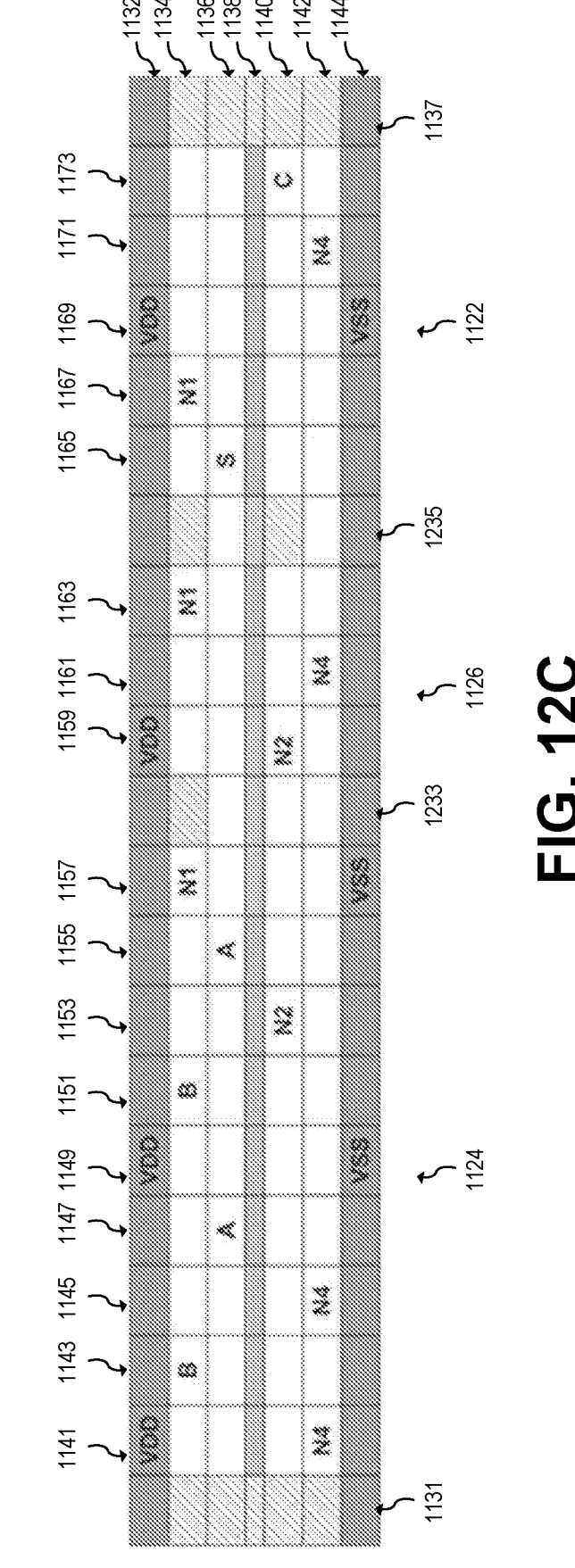

FIG. 12C illustrates the mapping (e.g., step 914) of the device arrangement (e.g., as shown in FIG. 11G) into the technology-specific wire track plan illustrated in FIGS. 12A and 12B, according to an embodiment of the present invention. As shown, the mapping illustrated in FIG. 12C with respect to non-stacked CFETs is very similar to the mapping illustrated in FIG. 11I with respect to non-stacked FinFETs. The mapping in FIG. 12C, however, does not connect nodes N4 in columns 1141 and 1145 using a higher level of metal since a local interconnect can be used for such connect. FIG. 12 also shows that diffusion breaks 1233 and 1235, which correspond to diffusion breaks 1133 and 1135, respectively, do not extend to the full column to allow for the connection between clusters of node N2 (between clusters 1124 and 1126) and of node N4 (between clusters 1124, 1126 and 1122).

Figure 12D:
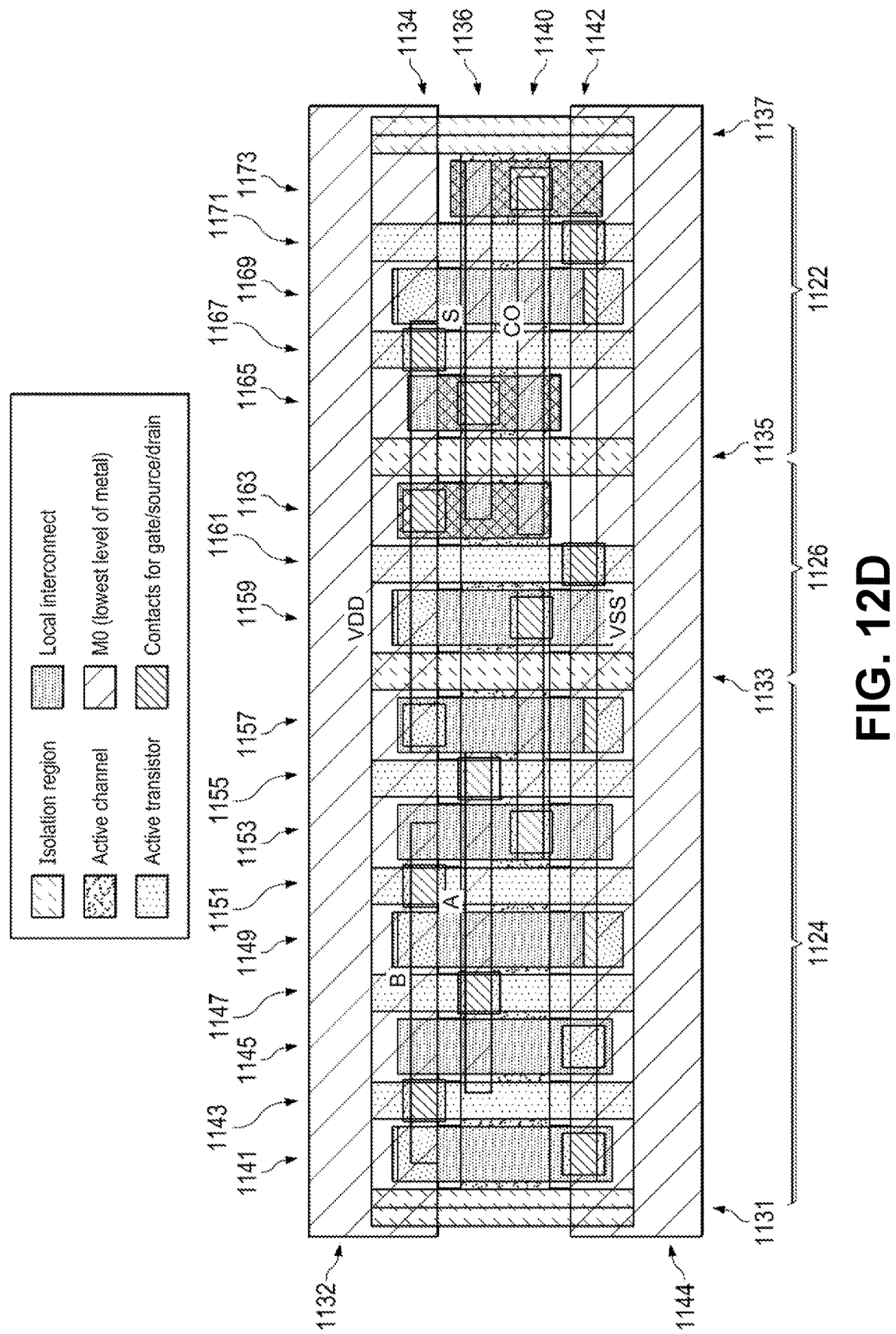

FIG. 12D shows final layout of the half-adder in the track plan illustrated in FIGS. 12A and 12B, mapped as shown in FIG. 12C, according to an embodiment of the present invention. As shown in FIG. 12D, a signal wiring track is routed at track 1134 between columns 1143 and 1151, making contact in columns 1143 and 1151 for input B. A signal wiring track is routed at track 1134 between columns 1157 and 1167, making contact at columns 1157, 1163, and 1167 for node N1. A signal wiring track is routed at track 1140 between columns 1145 and 1155, making contact in columns 1147 and 1155, for input A of the half-adder. A signal wiring track is routed at track 1142 between columns 1153 and 1159, making contact at columns 1153, and 1159 for node N2.

Method 900 may also be implemented in transistor technologies with stack of transistors, such as stacked planar transistors, stacked FinFETs, stacked TriGate transistors, stacked NS transistors, stacked CFETs, and stacked VFETs. For example, FIGS. 13A-13J illustrate the performance of method 900 for converting the netlist of FIG. 8C (half-adder) into a physical layout using stacked CFET technology, according to an embodiment of the present invention. A similar or identical method may be applied to other stacked transistor architectures.

Figures 13A, 13B:
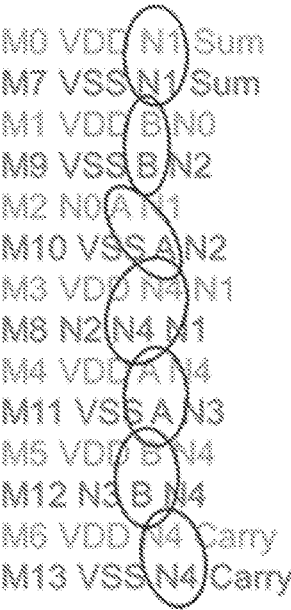
Figures 13C, 13D:
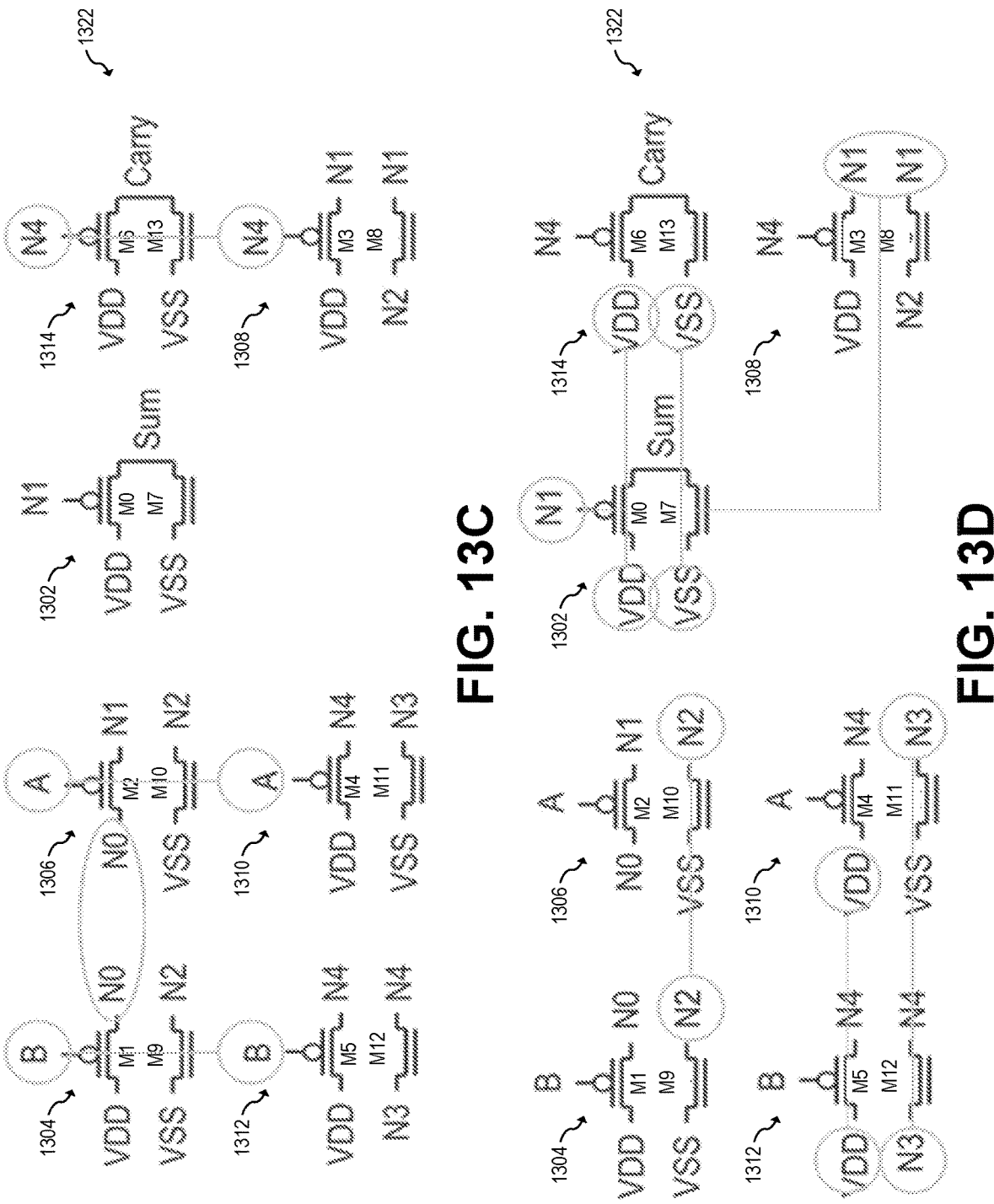
Figure 13E:
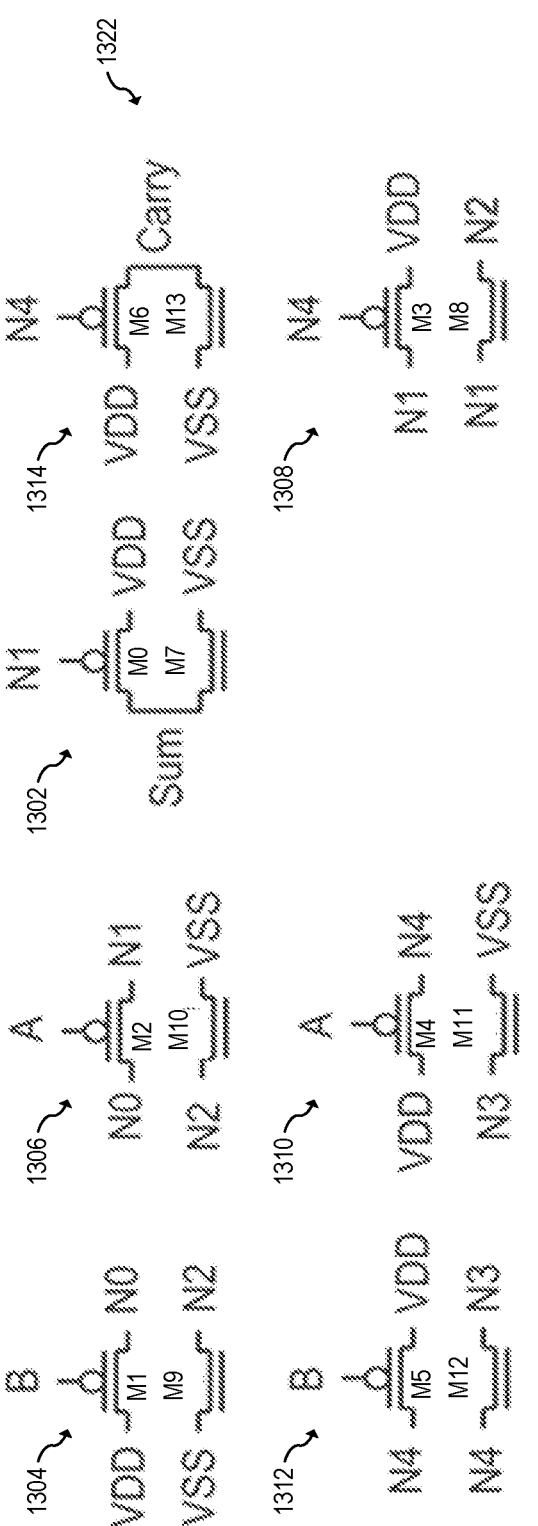
Figure 13F:
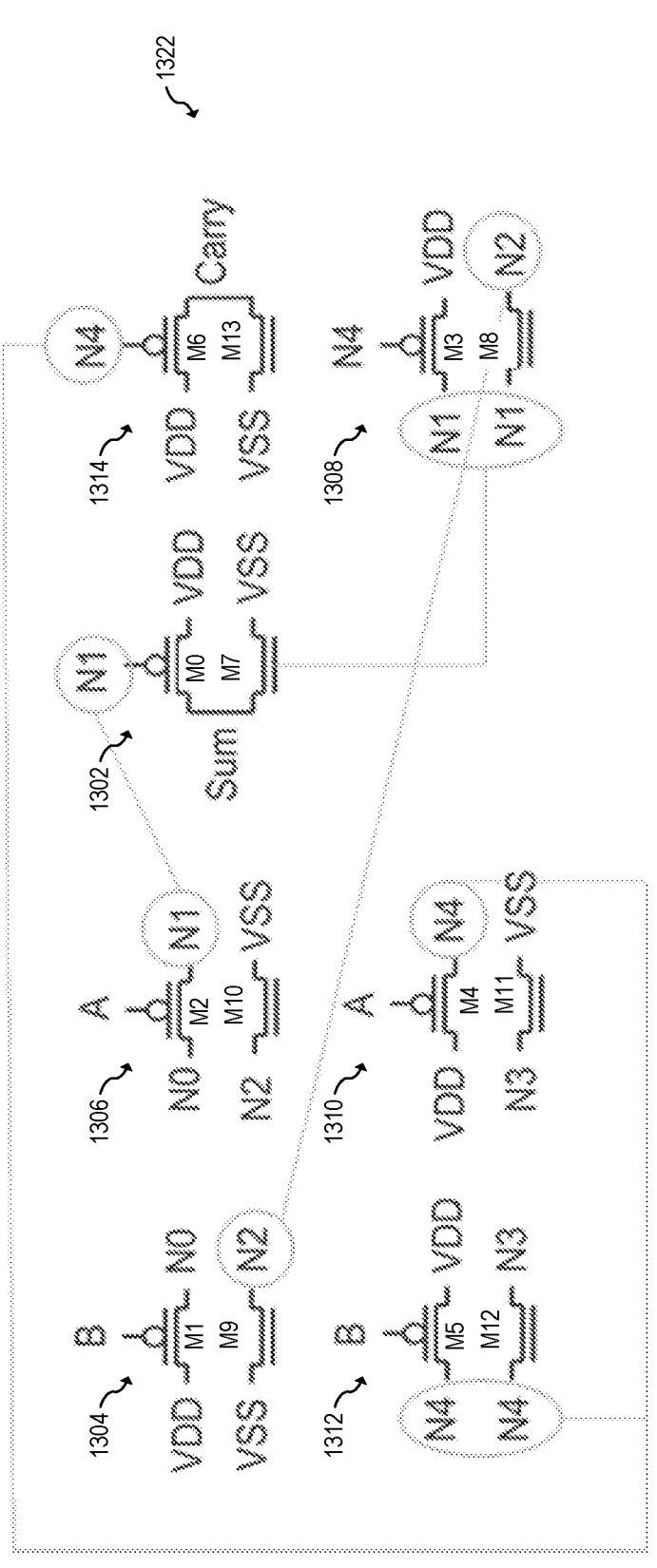

FIGS. 13A and 13B illustrate steps 902, 904, respectively. FIGS. 13C and 13D illustrate step 906 and illustrate the stacked nature of the technology, e.g., as indicated by two-tiers of transistors stacked on top of each other. FIG. 13E illustrates step 908. FIGS. 13F and 13H illustrate step 910 and illustrate the additional vertical routing paths enabled by the stacked transistor technology. Step 912 is illustrated in FIG. 13H. As will be described in more detail later, in the embodiment illustrated in FIGS. 13A-13J, steps 916 and 920 may be omitted (e.g., if no open nodes remain to be routed).

FIG. 13A illustrates the pairing complementary transistors having a common gate (step 902), according to an embodiment of the present invention. FIG. 13B illustrates transistor-pair objects (step 904) corresponding to the paring performed during step 902, according to an embodiment of the present invention. As shown in FIGS. 13A and 13B, steps 902 and 904 may be performed, with respect to a stacked CFET device, in a similar or identical manner as with respect to a non-stacked device, such as a non-stacked FinFET device (e.g., as shown and described with respect to FIGS. 11A, and 11B, respectively).

FIGS. 13C-13H illustrates steps of method 900 for, e.g., optimizing and/or modifying the arrangement of transistor pair objects within the construct of electrical design as implemented with stacked CFETs, e.g., so that a resulting physical layout or arrangement of the electrical design component is, e.g., smaller and/or easier to route and to enable a real-world operation of the electrical design (in this example, the half-adder). FIGS. 13C and 13D illustrate the associating of transistor-pair objects into clusters based on common connections (step 906), according to an embodiment of the present invention.

As will be described in more detail later, since a stacked transistor architecture, such as stacked CFETs, allows for the vertical stacking of transistors (e.g., staking of CFETs), a track plan may allow for the vertical sharing of a gate connection between transistors (e.g., between 2 CFETs). Thus, in some embodiments, the association of transistor-pair objects into clusters is based in a common gate that can be shared across rows (e.g., by vertically connecting the gates of the CFETs) in a double-row track plan, in addition to common input/output connections. For example, as shown in FIGS. 13C and 13D, transistor-pairs 1304 and 1306 share common nodes N0 and N2, transistor pairs 1304 and 1312 share common node B, transistors-pairs 1306 and 1310 share node A, transistor-pairs 1312 and 1310 share nodes VDD and N3, transistor-pairs 1314 and 1308 share node N4, transistor-pairs 1302 and 1314 share nodes VDD and VSS, and transistor-pairs 1302 and 1308 share common node N1. As shown in FIGS. 13C and 13D, one cluster (1322) is identified.

As shown in FIG. 13D, transistors M10, M0, M7, M5, M12, M11, M3, and M8 are identified for flipping. FIG. 13E illustrates the transistor-pair objects after cluster association and transistor flipping (as identified in FIGS. 13C and 13D), based on common input/output/gate connections (step 908), according to an embodiment of the present invention.

In some embodiments, the possibility of performing vertical connections, in addition to horizontal connections, may substantially increase the complexity of the placement effort for achieving optimal results.

Figure 13G:
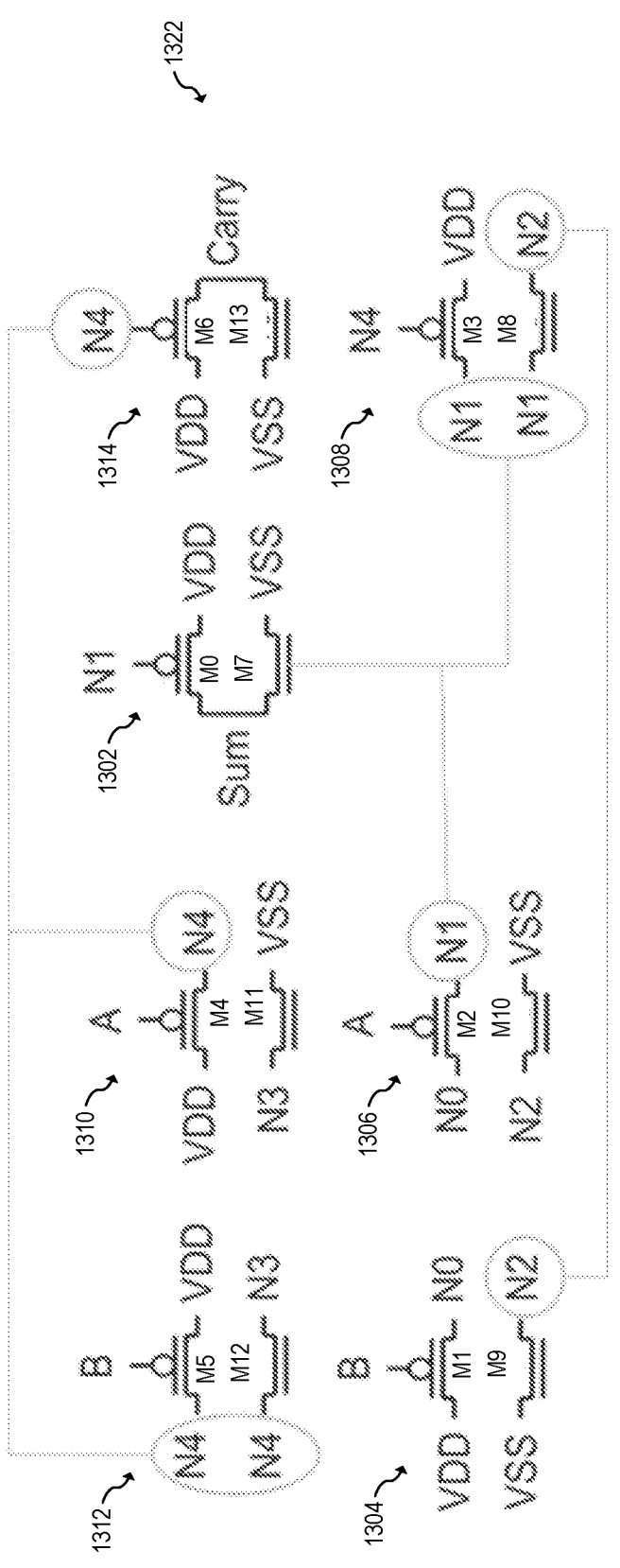
Figure 13H:
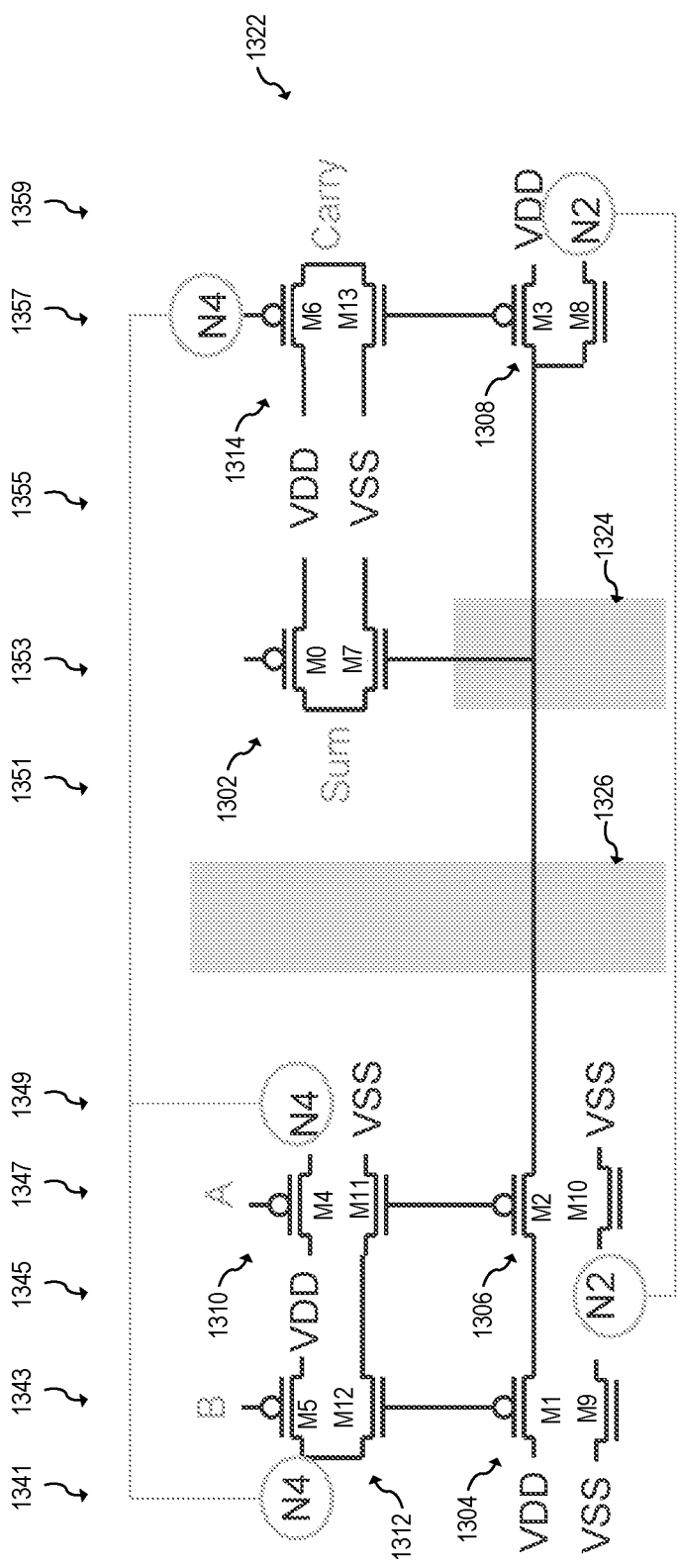

FIG. 13F-13H illustrate the merging of (e.g., duplicate shared) nodes after step 908 (step 910), according to an embodiment of the present invention. As show in FIG. 13F, further opportunities for optimization are first identified before the merging operation. For example, as shown in FIG. 13F, open nodes are first identified. For example, transistor-pairs 1314, 1312 and 1310 all have node N4 as open node. Transistor pairs 1314 and 1308 have node N2 open. Transistor-pair 1306, 1302 and 1308 have node N1 open.

Based on open nodes, transistor-pairs 1304 and 1312 are swapped, and transistor pairs 1306 and 1310 are swapped, as shown in FIG. 13G. In some embodiments, all possible associations and permutations of transistor-pairs and transistor flipping are evaluated, and the association resulting in the lower number and/or minimize the distance between nodes.

FIG. 13H shows cluster 1322 after the merging step (step 910), and after the elimination of nodes that are only local to the cluster and do not require external connectivity, either internally or to other clusters (step 912), according to an embodiment of the present invention. FIG. 13H also illustrates electrical isolation structures, such as dummy polysilicon film forming diffusion breaks 1324 and 1326.

Figure 13I:
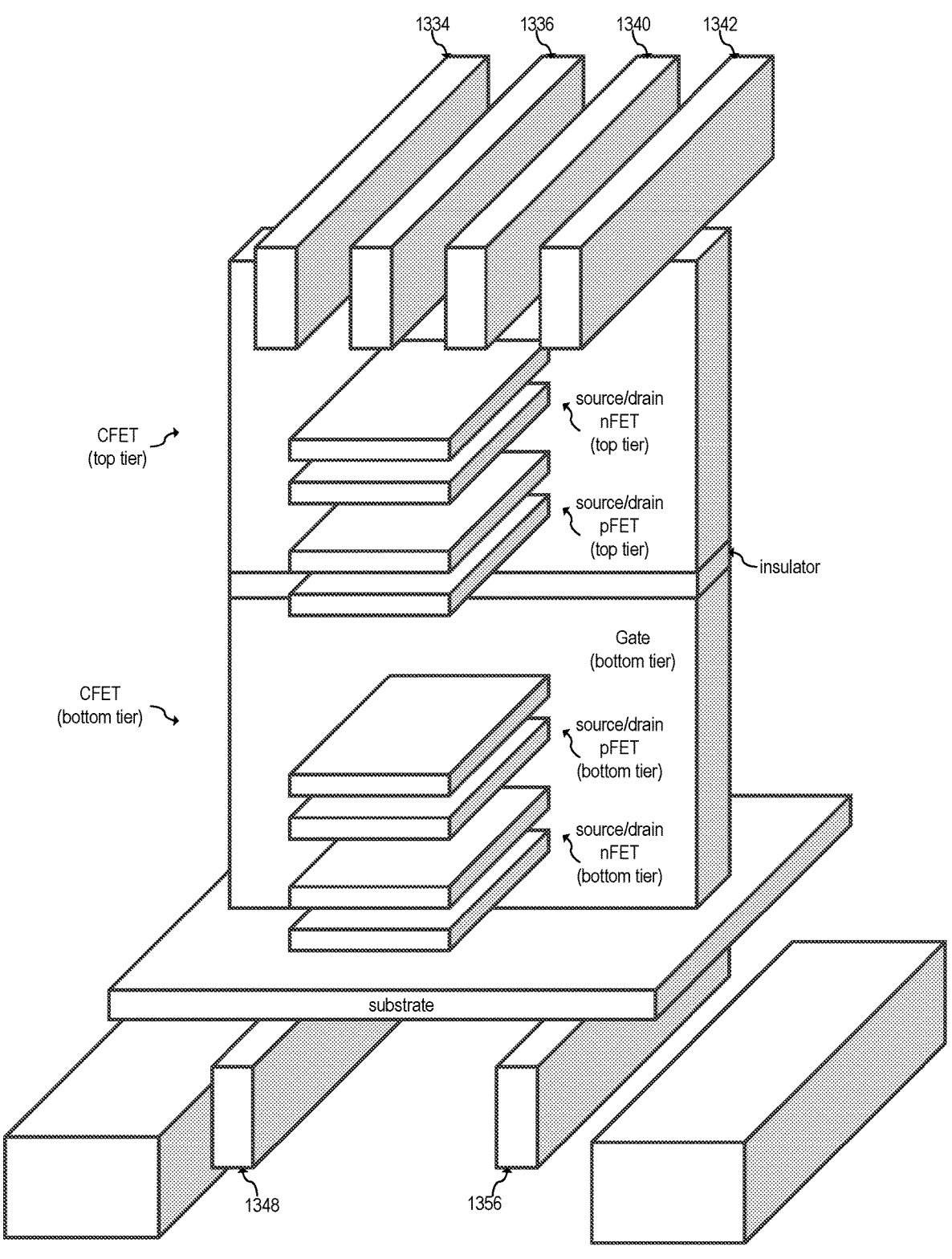

FIG. 13I illustrates a 3D view of a technology specific wire track plan for 2-tier stacked CFETs, according to an embodiment of the present invention. As shown in FIG. 13H, the track plan includes 4 top signal tracks (1334, 1336, 1340, and 1342) and 2 bottom signal tracks (1348 and 1356). In some embodiments, signal tracks 1334 and 1336 may be used to route the top-tier gate or a source/drain of the top-tier nFET using a contact. In some embodiments, signal tracks 1340 and 1342 may be used to route the top-tier gate or a source/drain of the pFET using a contact. In some embodiments, signal track 1348 may be used to route the bottom-tier gate or a source/drain of the bottom-tier pFET using a contact. In some embodiments, signal tracks 1356 may be used to route the bottom-tier gate or a source/drain of the nFET using a contact. In some embodiments, the top-tier gate may be connected to the bottom-tier gate by eliminated (e.g., not forming) the insulator layer between the top-tier and bottom-tier gates. It is understood that the 3D view illustrated in FIG. 13I is a non-limiting example that corresponds to a specific arrangement of devices in the track plan, and that the placement of the devices may be changed (e.g., pFETs and nFETs may be flipped), e.g., and that connections may be different (e.g., flipped).

Figure 13J:
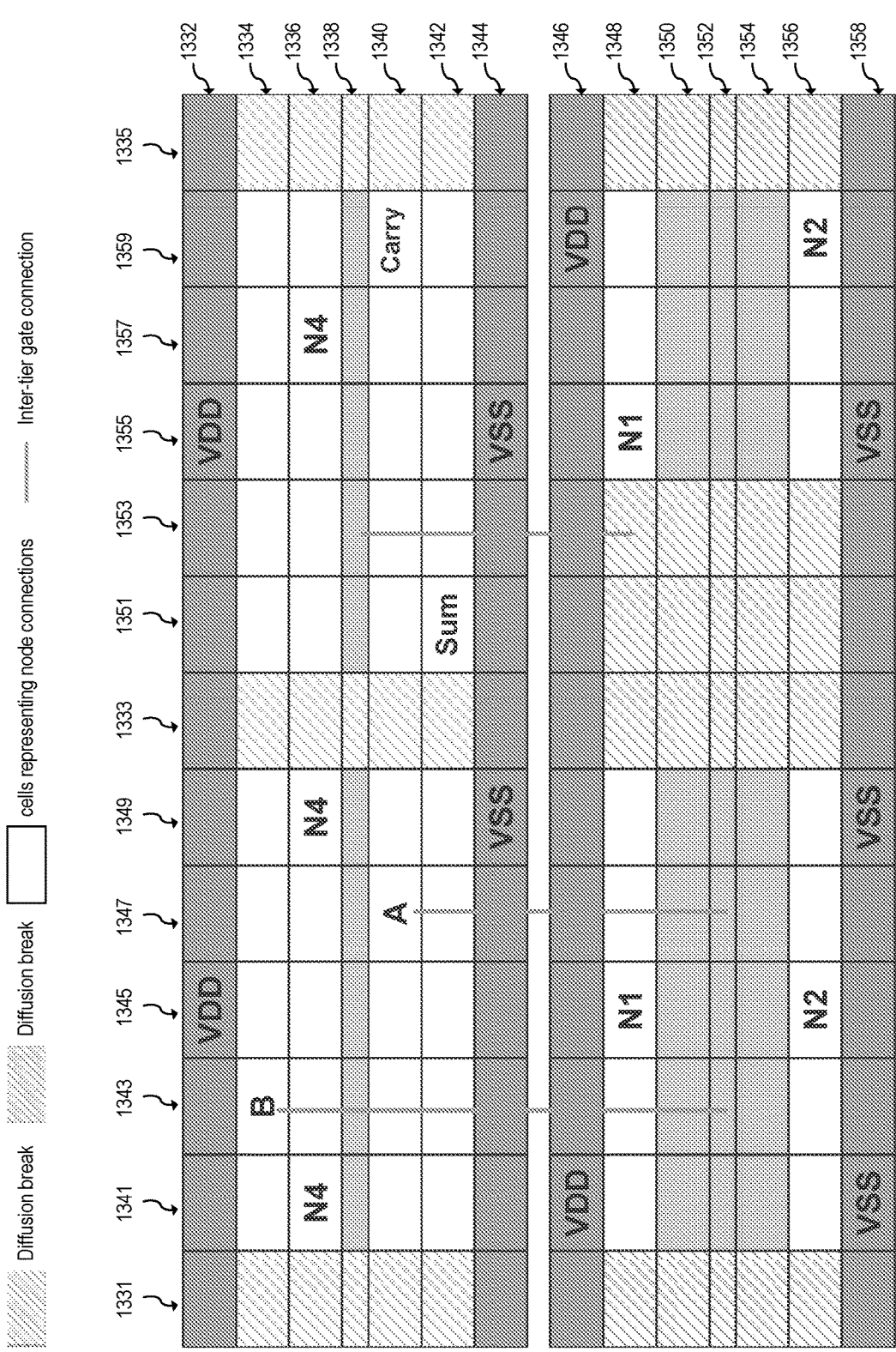

FIG. 13J illustrates the mapping (e.g., step 914) of the device arrangement (e.g., as shown in FIG. 13H) into the technology-specific wire track plan illustrated in FIG. 13I, according to an embodiment of the present invention. As shown, the wire track plan includes two rows of tracks that includes a top tier of tracks (tracks 1332, 1334, 1336, 1340, 1342, and 1342), and a bottom tier (tracks 1346, 1348, 1356, and 1358). Tracks 1332 and 1344 correspond to top tier power-rails VDD and VSS (or ground), respectively. Tracks 1346 and 1358 correspond to bottom tier power-rails VDD and VSS (or ground), respectively. Tracks 1338 and 1352 illustrate the separation between nMOS and pFET and are not used for routing signals. Tracks 1350 and 1354 are not used. Tracks 1334, 1336, 1340, and 1342 are available signal wiring tracks that can be used for routing signals from CFETs in the top tier. Tracks 1348 and 1356 are available signal wiring tracks that can be used for routing signals from CFETs in the bottom tier.

Each column shown in FIG. 13I represents possible location of nodes or electrical isolation structures, such as diffusion breaks. Columns 1341, 1343, 1345, 1347, 1349, 1351, 1353, 1355, 1357, and 1359, correspond to transistor nodes, and are also illustrated in FIG. 13G.

FIG. 13I also illustrates the identification of open nodes in the technology-specific wire track plan (step 916), as well as node connections using tracks, and vertical inter-tier gate connections (e.g., by eliminating the isolation layer between top-tier and bottom-tier gates).

From the mapped track plan, e.g., as illustrated in FIG. 13J, the final layout may be generated by placing predefined technology constructs (step 918) based on the columns of the track plan of FIG. 13J, and then routing open nodes, if any, using, e.g., conventional routing tools. FIG. 13K illustrates a portion of a set of predefined technology constructs with source/drain and gate connections for two-tier stacked CFET technology, according to an embodiment of the present invention. Construct in the set illustrated in FIG. 13K may be used for mapping the track plan illustrated in FIG. 13J into a final layout, e.g., in a similar manner as illustrated with respect to FIGS. 11I-11L.

Figure 14:
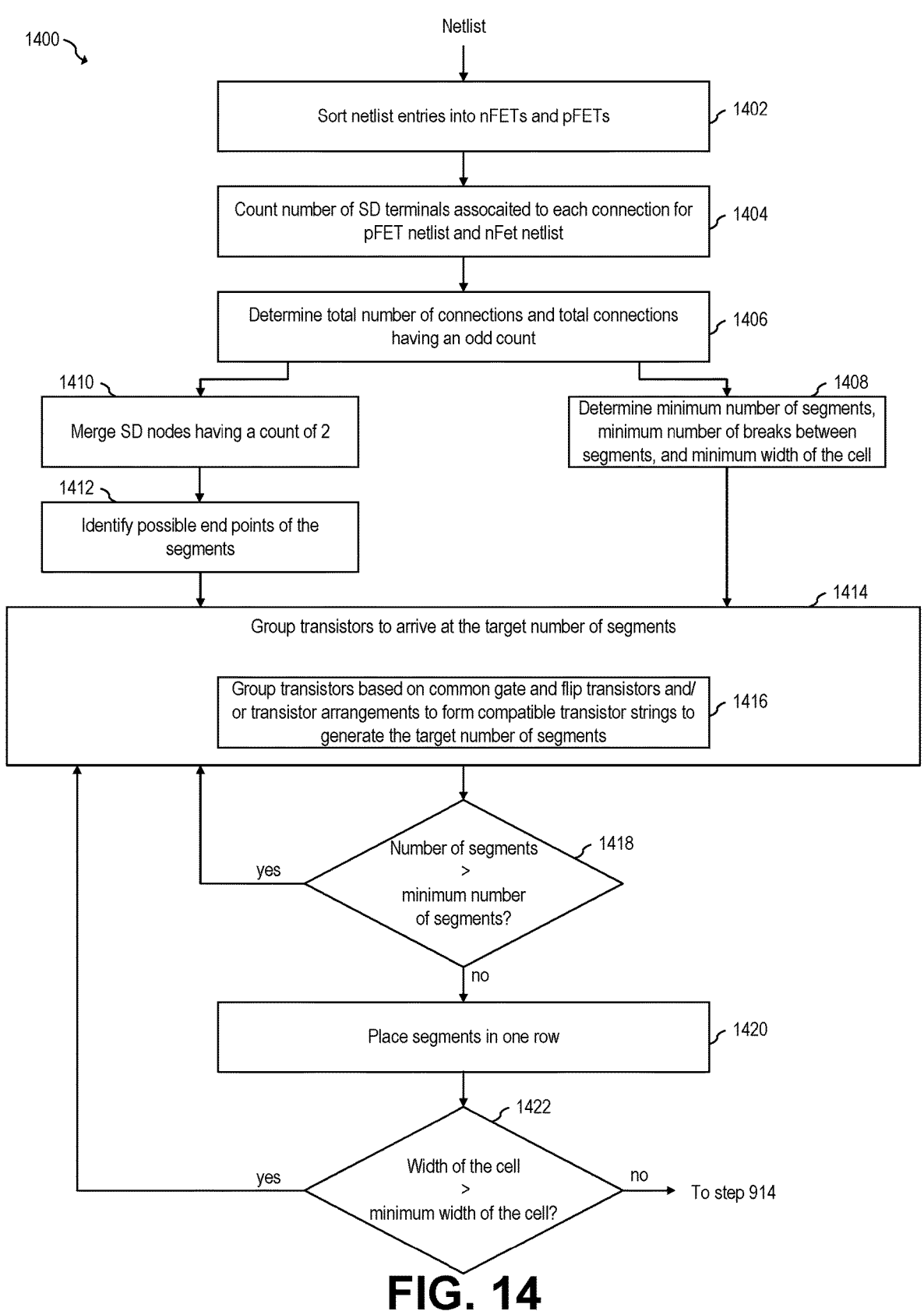
FIG. 14 shows a flow chart of an embodiment method for generating cluster of transistors, according to an embodiment of the present invention.

FIG. 14 shows a flow chart of embodiment method 1400 for generating cluster of transistors, according to an embodiment of the present invention. In some embodiments, steps 906, 908, 910, and 912 may be performed as method 1400. Thus, in some embodiments, arriving at a physical layout from a netlist may involve, e.g., performing method/steps 902, 904, 1400, 914, 916, 918, and 920. Method 1400 may be implemented by computing device 750.

In some embodiments, performing method 1400 results in the generation, for a particular netlist, of shortest strings of nFETs and pFETs by joining matching source/drain terminals. In some embodiments, such shortest strings of nFETs and pFETs are then paired to maximize the number of connections between common gates.

FIGS. 15A-15I show various possible outputs of performing method 1400, according to embodiments of the present invention. FIG. 14 may be understood in view of FIGS. 15A-15I.

During step 1402, entries of a netlist, such as the entries of the netlist of FIG. 8C (half-adder), are sorted into nFETs and pFETs. For example, FIG. 15A shows sorted pFET netlist 1502 and sorted nFet netlist 1504, of the netlist of FIG. 8C, according to an embodiment of the present invention.

During step 1404, the number of source/drain (SD) terminals associated to each connection (node) is counted. The counting is performed for the nFET netlist and for the pFET netlist. For example, FIG. 15B shows lists 1512 and 1514 having the counts associated with each connection of pFET netlist and nFET netlist, respectively.

During step 1406, the number of total connections and total connections having an odd count are determined for each of the sorted lists generated during step 1402 (e.g., based on the output of step 1404). For example, FIG. 15C shows the total connections and total connections having an odd count for sorted pFET netlist 1502 and sorted nFet netlist 1504.

As shown in FIG. 15C, pFET netlist 1502 includes 2 odd source/drain counts, corresponding to Sum (having a count of 1), and Carry (having a count of 1), and nFET netlist 1504 includes 6 odd source/drain counts, corresponding to N1 (having a count of 1), N2 (having a count of 3), N4 (having a count of 1), Sum (having a count of 1), and Carry (having a count of 1). As shown in FIG. 15C, in some embodiments, the number of odd count(s) associated with a supply rail (e.g., VDD/VSS) is ignored and/or not determined.

In some embodiments, steps 1402 and 1404 may be omitted and the counts generated during step 1406 may be obtained, e.g., by directly processing the netlist (e.g., directly processing the netlist of FIG. 8C), such as by iterating through each entry of the netlist and keeping independent counters for each connection.

During step 1408, the minimum number of segments (also referred to as transistor strings), minimum number of breaks between segments, and minimum width of the cell is determined. For example, in some embodiments, the minimum number of segments $Seg_{min}$ is determined by $$Seg_{min} = \frac{MAX(OddCount_{pFET}, OddCount_{nFET})}{2} \qquad (1)$$

where $OddCount_{pFET}$ and $OddCount_{nFET}$ correspond to the total connections having an odd count for pFETs and nFETs respectively, e.g., as determined during step 1406. For example, in the embodiment illustrated in FIG. 15C, $$Seg_{min} = \frac{MAX(2, 6)}{2} = \frac{6}{2} = 3.$$

Thus, when method 1400 is applied to the netlist of FIG. 8C, 3 clusters of transistors may be generated. In some embodiments, the minimum number of segments $Seg_{min}$ is considered the target number of segments.

In some embodiments, the minimum number of internal breaks $Breaks_{min}$ (e.g., diffusion breaks or, e.g., other interruptions in the active channel) between segments is determined by $$Breaks_{min} = Seg_{min} - 1 \qquad (2)$$

US 12,585,857 B2

21                                                                           22

For example, in the embodiment illustrated in FIG. 15C, Breaks$_{min}$=Seg$_{min}$−1=3−1=2. In some embodiments, Equation 2 may be used, e.g., for technologies using single diffusion breaks (e.g., only one dummy poly per diffusion break). For double diffusion break technology, the minimum number of internal breaks may be determined by multiplying the results of Equation 2 times 2.

In some embodiments, the minimum width of the cell cellWidth$_{min}$ is determined by $$\text{CellWidth}_{min}=\text{MAX}(\text{num}_{pFET}+d\cdot\text{Breaks}_{pmin},\text{num}_{nFET}+d\cdot\text{Breaks}_{nmin})+d\cdot\text{Break}_{edge} \quad (3)$$

where num$_{pFET}$ and num$_{nFET}$ are the total number of transistors in the pFET and nFET netlists, Break$_{edge}$ is the number of breaks associated to the edges on the side of the cell (e.g., generally equal to 1), d is equal to the number of dummy poly per diffusion break for the technology (e.g., d=1 for single diffusion break technology, d=2 for double diffusion break technology), and Breaks$_{pmin}$ and Breaks$_{nmin}$ are the minimum number of internal breaks for pFETs and nFETs, respectively, where Breaks$_{pmin}$ and Breaks$_{nmin}$ may be determined by $$\text{Breaks}_{pmin}=\text{OddCount}_{pFET}-1 \quad (4)$$

$$\text{Breaks}_{nmin}=\text{OddCount}_{nFET}-1 \quad (5)$$

For example, in the embodiment illustrated in FIG. 15C, and for single diffusion break technology, CellWidth$_{min}$=MAX (7+1·0,7+1·2)+1·1=MAX(8,9)+1=10. Thus, the cell of FIG. 8C may be rendered in a single diffusion break technology with 10 poly tracks (e.g., 1 poly per transistor, 1 poly per internal diffusion break, half a poly on the left edge of the cell, and half a poly on the right edge of the cell).

In some embodiments, the minimum number of segments determined during step 1408 corresponds to the theoretical minimum number of segments required to implement in layout the netlist (e.g., the netlist of FIG. 8C). In some embodiments, the minimum number of breaks determined during step 1408 corresponds to the theoretical minimum number of breaks required to implement in layout the netlist (e.g., the netlist of FIG. 8C). In some embodiments, the minimum cell width determined during step 1408 corresponds to the theoretical minimum cell width required to implement in layout the netlist (e.g., the netlist of FIG. 8C).

During step 1410, the source/drain terminals associated with a source/drain count of 2 (e.g., as determined during step 1406) are merged. Thus, in some embodiments, the output generated during step 1410 includes a transistor arrangement that includes pairs of transistors, strings of pairs of transistors, and/or single transistors. For example, FIG. 15D illustrates transistors of the netlist of FIG. 8C arranged in strings of transistors in which the source/drain terminals associated with a source/drain count of 2 (e.g., as illustrated in FIG. 15B) are merged, according to an embodiment of the present invention.

As shown in FIG. 15D, source/drain terminals having a count of 2 in FIG. 15B (SD terminals N0, N1, and N4 for pFETS, and SD terminal N3 for pFETS) are merged. As will be illustrated later with respect to FIG. 15E, in some embodiments, some of the transistors merged during step 1410 may be unmerged in favor of another connection (e.g., based on a common gate).

During step 1412, possible end points of the segments are identified. For example, in some embodiments, all source/drain terminals with a connection associated to a count of 1 are identified as end points of a segment. For example, in the embodiment illustrated in FIG. 15B, for pFETs, the source/ drain terminals connected to Sum and Carry are identified as possible end points, and for nFETs, source/drain terminals connected to nodes N1, N4, Sum, and Carry, are identified as possible end points.

During step 1414, the transistor groupings generated during step 1412 are further stringed together to arrive at the target number of segments. For example, in some embodiments, the transistor groupings generated during step 1412 are string together in the target number of segments using an exhaustive search. An optimal solution (e.g., smallest cell size, cell with lower number of metal layers used for internal connections, lowest parasitics for one or more particular nodes, etc.) is selected from the possible solutions obtained using an exhaustive search approach. In some embodiments, performing an exhaustive search of all possible ways in which the transistor groupings generated during step 1412 can be stringed together is less complex than evaluating all possible ways in which the transistors of the original netlist can be connected together. For example, as can be seen from FIGS. 15A and 15D, it is less complex to evaluate all possible arrangements of the transistor groupings of FIG. 15D (where there are 4 groupings of pFETs and 6 groupings of nFETs) than to evaluate all possible arrangements of the transistors of FIG. 15A (where there are 7 pFETs and 7 nFETs) to arrive at the target 3 segments.

In some embodiment, after performing step 1414, steps 914, 916, 918, and 920, may be performed, e.g., as described with respect to method 900.

In some embodiments, determining how to string together the transistor groupings generated during step 1412 to arrive at the target number of segments includes:

connecting pFETs and nFETs sharing a common gate;

placing a source/drain terminal associated with an odd count and the beginning and/or end of a segment;

placing source/drain terminals connected to the same open nodes close to each other; and connecting pFETs and nFETs forming an inverter together. For example, in some embodiments, performing step 1414 includes performing step 1416.

During step 1416, the transistor groupings generated during step 1412 are further grouped based on sharing a common gate and arranged so that the grouped transistors form compatible transistor strings. In some embodiments, the beginning and/or end source/drain terminals of the segments are selected from the group of source/drain terminals associated with an odd count (from step 1406). In some embodiments, further refinement, such as by flipping transistors or transistor arrangements is performed to arrive at the target number of segments and/or to further optimize the transistor placement.

In some embodiments, multiple transistor arrangements are possible when performing step 1416. In some embodiments, an optimal solution (e.g., smallest cell size, cell with lower number of metal layers used for internal connections, lowest parasitics for one or more particular nodes, etc.) is selected from the possible transistor arrangements obtained when performing step 1416 using an exhaustive search approach. In some embodiments, performing an exhaustive search of all possible transistor placements obtained after performing step 1416 is less complex than evaluating all possible ways in which the transistors groupings generated during step 1412 can be connected together.

FIGS. 15E-15H illustrate the performance of step 1416 on the transistor arrangements generated during step 1410 (as illustrated in FIG. 15D) to form 3 target segments (as determined during step 1408), according to an embodiment of the present invention. As shown in FIG. 15E, transistor arrangements 1546, 1548, 1560, and 1562, may be grouped together based on their common gate, e.g., as cluster 1122. In some embodiments, arriving at this grouping may be based on the determination that transistor arrangements 1546, 1548, 1560, and 1562 form (e.g., output) inverters. In some embodiments, arriving at this grouping may be based on the determination that M0 and M7 share a common gate (N7), transistors M6 and M13 share a common gate (N4), and nodes Carry and Sum are both associated with an odd count and thus may be placed at an end point of a segment.

After grouping transistor arrangements 1546, 1548, 1560, and 1562, transistors arrangement 1554 is selected to form a second segment (cluster 1126), as shown in FIG. 15F. As shown in FIG. 15F, transistor M8 is grouped with transistor M3 to form cluster 1126. In some embodiments, arriving at this grouping may be based on the determination that M8 and M3 share a common gate (N4), and that nodes N1 and N2 are both associated with an odd count and thus may be placed at an end point of a segment. In some embodiments, arriving at this grouping may be based on the determination that, from the remaining nFET transistors groupings (1552, 1554, 1556, and 1558), M8 (1554) is the only transistor that is not associated with input nodes A and B. Thus, by forming a cluster with transistor M8, inputs A and B are not split between multiple segments.

As shown in FIG. 15E, the forming of cluster 1126 causes that transistor arrangement 1542 to lose transistor M3 to become transistor arrangement 1543 (by unmerging transistors M3 and M2 in favor of the common gate shared by transistors M8 and M3. Thus, FIG. 15E illustrate that during step 1416, multiple possible arrangements may be evaluated before arriving at the target number of segments.

FIG. 15G illustrates the forming of compatible transistor strings to arrive at the 3 target segments, according to an embodiment of the present invention. As shown in FIG. 15G, supply rails VDD and VSS are considered in this step for merging purposes. As also shown in FIG. 15G, when determining the transistor order of the transistor strings, common gates are considered, as illustrated by transistors M2 and M10 sharing a common gate (A), transistors M1 and M9 sharing a common gate (B), transistors M4 and M11 sharing a common gate (A), and transistors M5 and M12 sharing a common gate (B).

Once the compatible transistor strings are formed, the third cluster is formed by connecting the common gates, as illustrated in FIG. 15H. As shown in FIG. 15H, clusters 1524, 1122, and 1126 may be generated by performing step 1416 on the transistor arrangements illustrated in FIG. 15D. Other 3-cluster configurations may also be generated during step 1416 when performed on the transistor arrangements illustrated in FIG. 15D, such as clusters 1122, 1124, and 1126, as illustrated in FIG. 11G.

During step 1418, the number of segments obtained during step 1414 is compared with the minimum number of segments (e.g., determined during step 1408). If the number of segments obtained during step 1414 is higher than the minimum number of segments, step 1414 is performed again (e.g., by trying different possible transistor arrangements). If the number of segments obtained during step 1414 is equal to the minimum number of segments, the segments generated during step 1414 are placed in a single row during step 1420. For example, FIG. 15I illustrates segments 1524, 1122, and 1124 (as illustrated in FIG. 15G) arranged in a single row, according to an embodiment of the present invention.

During step 1422, the width of the cell is determined based on the segments arranged in the single row (e.g., from step 1420). If the width of the cell is higher than the minimum width of the cell (e.g., from step 1408), step 1414 is performed again (e.g., by trying different possible transistor arrangements). If the width of the cell is equal to the minimum width of the cell, the segments generated during step 1420 are further processed (e.g., during steps 914, 916, 918, and 920) to obtain a physical layout.

Figure 15I:
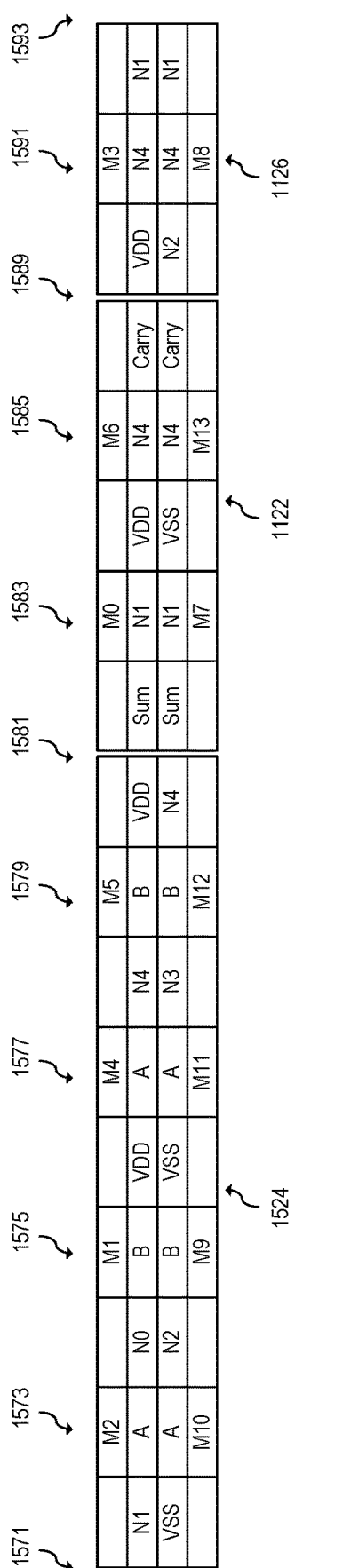

As shown in FIG. 15I, the cell illustrated in FIG. 15I has 10 poly tracks. For example, the cell illustrated in FIG. 15I has 7 poly track associated with transistors (as illustrated by columns 1573, 1575, 1577, 1579, 1583, 1585, and 1591), 2 poly track associated with internal diffusion break (as illustrated by columns 1581 and 1589), and 1 poly track associated with the edge of the cell (as illustrated by columns 1571 and 1593, which are shared with adjacent cells and thus count as half a poly track each). Since the cell illustrated in FIG. 15I has 10 poly tracks, which is equal to the minimum width of the cell determined during step 1408 for the netlist of FIG. 8C, the cell illustrated in FIG. 15I is further processed, and, e.g., step 914 is performed next.

As illustrated in FIG. 14, step 1414 may be iteratively performed if the number of segments of the cell is greater than the minimum number of segments or if the width of the cell if larger than the minimum with of the cell. In some embodiments, step 1414 is also iteratively performed while the number of breaks is higher than the minimum number of breaks. In the embodiment illustrated in FIG. 15I, since 2 breaks are shown, which is equal to the minimum number of breaks determined during step 1408 for the netlist of FIG. 8C, then the cell illustrated in FIG. 15I is further processed, and, e.g., step 914 is performed next.

In some embodiments, having a number of segments higher than the minimum number of segments, a width of the cell larger than the minimum width of the cell, or a number of breaks higher than the minimum number of breaks after performing step 1414 is indicative that a smaller cell design is possible (and thus, step 1414 may be performed again).

In some embodiments, performing method 1400 advantageously allows for determining whether a particular cell design can be further improved (e.g., by comparing the characteristics of the particular cell design, with target characteristics determined during step 1408).

In some embodiments, performing method 1400 advantageously allows for optimizing a cell design (e.g., reduces or minimizes the size of the cell) without having to evaluate, using an exhaustive search, all possible transistor arrangements of a netlist. Such advantages may become more evident as the size of a cell increases.

Figure 16:
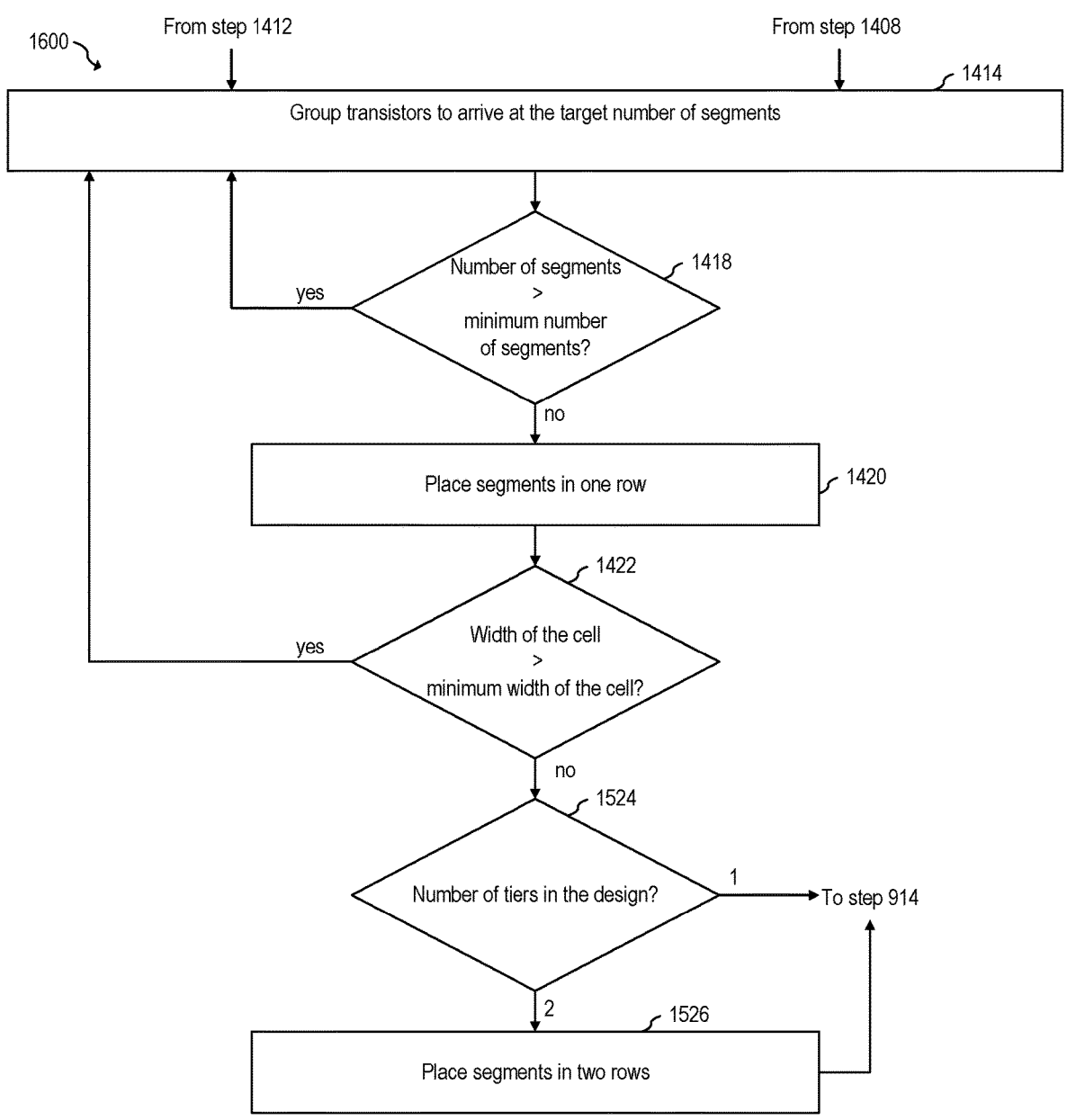
FIG. 16 shows a flow chart of an embodiment method for generating cluster of transistors, according to an embodiment of the present invention.

Although method 1400 has been illustrates with respect to a single-tier design, method 1400 may be applied to designs implemented in a plurality of tiers, such as a two-tier design. For example, FIG. 16 shows a flow chart of embodiment method 1600 for generating cluster of transistors, according to an embodiment of the present invention. Method 1600 includes steps 1402, 1404, 1406, 1408, 1410, 1412, 1414 (and, e.g., 1416), 1418, 1420, and 1422, which may be performed in a similar manner as in method 1400.

If it is determined after performing steps 1418 and 1422 that no further iterations of step 1414 are to be performed (e.g., output of step 1418="no" and output of step 1422="no"), then the number of tiers in the design is determined during step 1524. As shown in FIG. 16, for single tier designs, method 1600 may be identical to method 1400. For two tier designs, the segments generated during step 1414 are placed in a two-row arrangement during step 1526, and then step 914 may be performed.

In some embodiments, the placement of the segments may be determined using an exhaustive search approach during step 1526. In some embodiments, the placement of the segments during step 1526 includes the step of:

placing diffusion breaks in the top-tier; and placing power taps in the top-tier includes stacking the power taps onto power taps of the bottom tier, or stacking the power taps over nodes that do not require additional signal connections. For example, FIG. 17 illustrates segments 1524, 1122, and 1124 (as illustrated in FIG. 15G) arranged in a two rows, according to an embodiment of the present invention.

Figure 17:
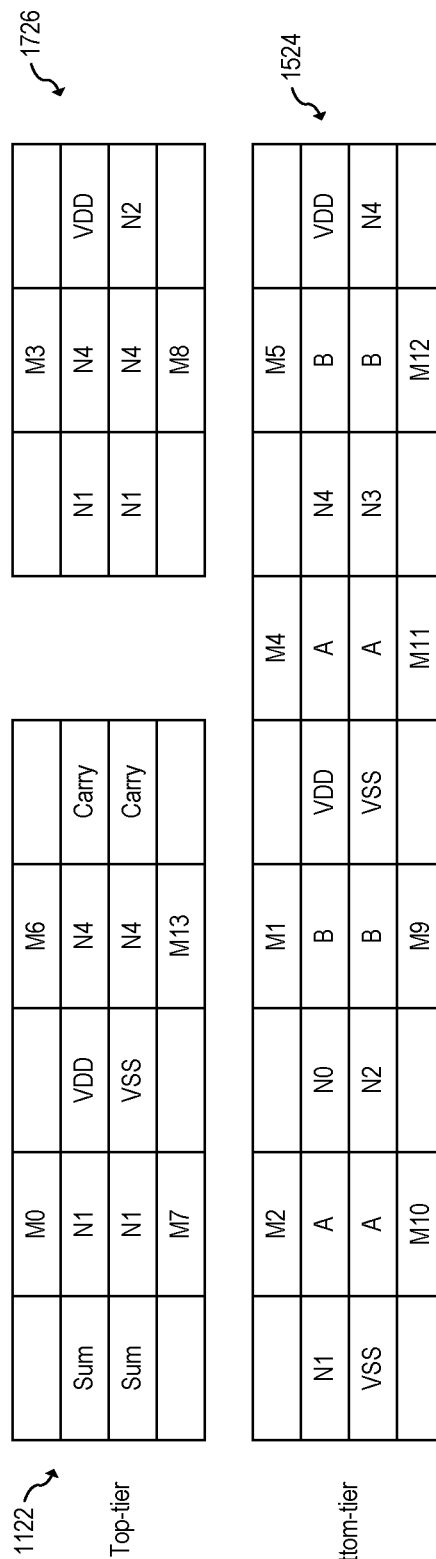
FIG. 17 illustrates the segments of FIG. 15G arranged in a two rows, according to an embodiment of the present invention.

As shown in FIG. 17, the diffusion break is located in the top-tier (above transistor M4). As also shown in FIG. 17, the power taps (VDD/VSS) of the top-tier are located on top of a power tap of the bottom-tier (as illustrated by cluster 1726, which is the flipped version of cluster 1126) or on top of nodes that do not require additional signal connections (as illustrated by cluster 1122).

Advantages of some embodiments include providing a metric indicative that a particular cell design may be further optimized and providing steps to reduce the number of possible transistor arrangements that may be evaluated to arrive at a cell design in which such metric no longer indicates that the particular cell may be further optimized.

Example embodiments of the present invention are summarized here. Other embodiments can also be understood from the entirety of the specification and the claims filed herein.

Example 1. A method including: receiving data representative of an electrical circuit including an arrangement of devices, inputs, outputs, and power sources; determining a minimum number of segments based on the received data; grouping the devices into N segments based on common features shared between two or more of the devices, where N is equal to the minimum number of segments; and generating discrete portions of the grouped devices to form a physical layout representative of a physical manifestation of the electrical circuit, such that when the discrete portions are integrated together they form a physical manifestation of the electrical circuit.

Example 2. The method of example 1, where the electrical circuit includes a plurality of nodes, and where terminals of the devices are coupled to the plurality of nodes, the method further including: identifying different nodes of the plurality of nodes based on the received data; and assigning a terminal count to each of the identified nodes based on the received data to form a plurality of terminal counts, where each terminal count is indicative of a number of terminals of the devices coupled to a respective node of the identified nodes, where determining the minimum number of segments includes determining the minimum number of segments based on a number of terminal counts of the plurality of terminal counts having an odd count.

Example 3. The method of one of examples 1 or 2, where the devices include a plurality of n-type field effect transistors (nFETs) and a plurality of p-type field effect transistors (pFETs), the method further including identifying pFETs and nFETs of the electrical circuit from the received data, where forming the plurality of terminal counts includes forming a plurality of pFET terminal counts and a plurality of nFET terminal counts, and where determining the minimum number of segments includes determining the minimum number of segments by:

$$Seg_{min} = \frac{\mathrm{MAX}(OddCount_{pFET},\, OddCount_{nFET})}{2},$$

where $Seg_{min}$ represents the minimum number of segments, $OddCount_{pFET}$ represents a number of pFET terminal counts having an odd count, and $OddCount_{nFET}$ represents a number of nFET terminal counts having an odd count.

Example 4. The method of one of examples 1 to 3, further including merging terminals of the devices associated with a terminal count of 2.

Example 5. The method of one of examples 1 to 4, further including identifying terminals of the devices associated with an odd terminal count, where grouping the devices into N segments includes: selecting a first terminal from the identified terminals; and forming a first segment of the N segments, the first segment having the first terminal as an end terminal.

Example 6. The method of one of examples 1 to 5, further including determining a minimum number of interruptions of active channels based on the minimum number of segments, where grouping the devices into N segments further includes grouping the devices into N segments having M breaks, where M is equal to the minimum number of segments.

Example 7. The method of one of examples 1 to 6, further including determining a minimum number of poly tracks based on the received data, where grouping the devices into N segments further includes grouping the devices into N segments having L poly tracks, where L is equal to the minimum number of poly tracks.

Example 8. The method of one of examples 1 to 7, where the devices include a plurality of n-type field effect transistors (nFETs) and a plurality of p-type field effect transistors (pFETs), where determining the minimum number of poly tracks includes determining the minimum number of poly tracks by $$CellWidth_{min} = \mathrm{MAX}(num_{pFET} + Breaks_{pmin}, num_{nFET} + Breaks_{nmin}) + 1,\ \text{where } CellWidth_{min}$$

represents the minimum number of poly tracks, $num_{pFET}$ represents a total number of pFETs in the electrical circuit, $num_{nFET}$ represents a total number of nFETs in the electrical circuit, $Breaks_{pmin}$ represents a minimum number of internal breaks associated with pFETs of the electrical circuit, and $Breaks_{nmin}$ represents a minimum number of internal breaks associated with nFETs of the electrical circuit.

Example 9. The method of one of examples 1 to 8, further including manufacturing a mask set based on the formed physical layout and fabricating an integrated circuit using the mask set.

Example 10. The method of one of examples 1 to 9, where the discrete portions are representative of one or more of: a diffusion break, a source-drain construct, or a gate construct.

Example 11. The method of one of examples 1 to 10, where the source-drain construct includes a gate connection for the gate construct or power connection to a power source.

Example 12. The method of one of examples 1 to 11, where the gate construct includes a source-drain connection for the source-drain construct or power connection to a power source.

Example 13. The method of one of examples 1 to 12, where the diffusion break includes a polysilicon film.

Example 14. The method of one of examples 1 to 13, where the source-drain construct including an n-type region or a p-type region.

Example 15. The method of one of examples 1 to 14, where the physical manifestation including a field-effect-transistor (CFET) transistor.

Example 16. The method of one of examples 1 to 15, further including mapping the N segments to a target physical layout rendering based on a target track plan.

Example 17. The method of one of examples 1 to 16, where the target track plan includes a single row height.

Example 18. The method of one of examples 1 to 16, where the target track plan includes a row height of two or more.

Example 19. The method of one of examples 1 to 16 or 18, further including: placing the N segments in two rows, the two rows including a top-tier row and a bottom-tier row, where placing the N segments in the two rows includes: placing only one segment of the N segments in the bottom-tier row; placing all diffusion breaks to separate segments in the top-tier row; and placing a power source terminal of a device of a segment of the top-tier row on top of a power source terminal of a device of the only one segment of the bottom-tier row.

Example 20. A computing device for generating standard cell layouts for a standard cell library, the computing device including: a processor; and a non-transitory computer-readable storage medium coupled to the processor and storing a program executable by the processor, the program including instructions to: receive data representative of an electrical circuit including an arrangement of devices, inputs, outputs, and power sources, determine a minimum number of segments based on the received data, group the devices into N segments based on common features shared between two or more of the devices, where N is equal to the minimum number of segments, and generate discrete portions of the grouped devices to form a physical layout representative of a physical manifestation of the electrical circuit, such that when the discrete portions are integrated together they form a physical manifestation of the electrical circuit.

Example 21. The computing device of example 20, where the program further includes instructions to: store the physical layout in the non-transitory computer-readable storage medium; and transmit the stored physical layout for generating a set of masks for integrated circuit manufacturing.

Example 22. The computing device of one of examples 20 or 21, further including a display, where the program further includes instructions to display the devices using icons in the display.

Example 23. A method including: receiving data representative of an electrical circuit including an arrangement of devices, inputs, outputs, and power sources, where the electrical circuit includes a plurality of nodes, and where the devices include a plurality of n-type field effect transistors (nFETs) and a plurality of p-type field effect transistors (pFETs); identifying pFETs and nFETs of the electrical circuit from the received data; identifying different nodes of the plurality of nodes based on the received data; assigning a terminal count to each of the identified nodes based on the received data to form a plurality of terminal counts, where each terminal count is indicative of a number of terminals of the devices coupled to a respective node of the identified nodes; determining a minimum number of segments based on a number of terminal counts of the plurality of terminal counts having an odd count; and grouping the devices into N segments based on common features shared between two or more of the devices, where N is equal to the minimum number of segments; and generating discrete portions of the grouped devices to form a physical layout representative of a physical manifestation of the electrical circuit, such that when the discrete portions are integrated together they form a physical manifestation of the electrical circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of generating a three-dimensional (3-D) physical layout from a netlist, the method comprising:
automatically generating the 3-D physical layout from the netlist comprising a list of transistors representative of a 3-D electrical circuit, the automatically generating comprising:
dividing the netlist into a first group of transistors to be stacked vertically along a first direction and a second group of transistors to be spaced laterally along a second direction orthogonal to the first direction, wherein during the dividing, for each transistor, assigning the transistor to the first group in response to determining that the transistor comprises a vertical connectivity between other transistors in different layers and assigning the transistor to the second group in response to determining the transistor comprises a horizontal connectivity between transistors in a same layer, and
generating interconnections between transistors in the first group and transistors in the second group such that the first group and the second group together represent the 3-D physical layout of the netlist.

2. The method of claim 1, wherein dividing the netlist into the first group of transistors comprises pairing the transistors based on a complimentary feature shared between the transistors, the complimentary feature being associated with an operational characteristic of the transistors.

3. The method of claim 2, wherein dividing the netlist into the first group of transistors further comprises grouping paired transistors into transistor clusters based on common features shared between two or more of the paired transistors, the two or more of the paired transistors comprising a first transistor of a first type and a second transistor of a second type that is complementary to the first type.

4. The method of claim 1, further comprising:
determining a total number of connections and merging a subset of nodes having an even count.

5. The method of claim 1, further comprising having the 3-D electrical circuit comprising an arrangement of the first and the second group of transistors including a plurality of n-type field effect transistors (nFETs) and a plurality of p-type field effect transistors (pFETs) to be arranged in a 3-D arrangement.

6. The method of claim 1, wherein automatically generating the 3-D physical layout further comprises:
determining a minimum number of segments based on analyzing the netlist;
grouping the transistors into segments based on shared features between two or more of the transistors, wherein a number of segments is based on the determined minimum number of segments; and
wherein generating the 3-D physical layout comprises generating discrete portions of the grouped transistors, such that when the discrete portions are integrated together they form a design of the 3-D electrical circuit, wherein the design comprises a 3-D arrangement of the transistors.

7. The method of claim 1, wherein the automatically generating further comprises:

automatically performing a device placement to determine a placement location of transistors within the netlist, the automatically performing the device placement comprising identifying transistor pairs in the netlist, based on inputs and outputs of the transistors in the netlist, building transistor pairs objects to represent the identified transistor pairs, clustering the transistor pairs based on common current path nodes of the transistor pairs objects, flipping orientation of transistors in the transistor pairs to align common current path nodes, merging the transistor pairs into larger clusters by overlapping common current path nodes, and mapping the merged transistor pairs onto a wire track plan.

8. The method of claim 1, wherein the automatically generating further comprises:

automatically performing a device placement to determine a placement location of devices within the netlist, the automatically performing the device placement comprising identifying adjacent pairs of transistors from the transistors of the netlist based on identifying overlapping common current path nodes of the transistors in the netlist, and mapping the adjacent pairs of transistors onto a wire track plan.

9. A method of generating a three-dimensional (3-D) physical layout from a netlist, the method comprising:

automatically generating the 3-D physical layout of a standard cell design from the netlist comprising a list of transistors representative of a 3-D electrical circuit, the automatically generating comprising:

dividing the netlist into a first group of transistors to be stacked vertically along a first direction and a second group of transistors to be spaced laterally along a second direction orthogonal to the first direction, generating interconnections between transistors in the first group and transistors in the second group such that the first group and the second group together represent the 3-D physical layout of the netlist, and automatically performing a device placement to determine a placement location of the transistors within the netlist.

10. The method of claim 9, wherein automatically performing the device placement comprises:

identifying transistor pairs in the netlist;

based on inputs and outputs of the transistors in the netlist, building transistor pairs objects to represent the identified transistor pairs;

clustering the transistor pairs based on common current path nodes of the transistor pairs objects;

flipping orientation of transistors in the transistor pairs to align common current path nodes;

merging the transistor pairs into larger clusters by overlapping common current path nodes; and mapping the merged transistor pairs onto a wire track plan.

11. The method of claim 10, wherein identifying the transistor pairs comprises identifying transistors with common gate inputs.

12. The method of claim 10, wherein automatically performing the device placement further comprises determining and deleting unnecessary internal nodes.

13. The method of claim 10, further comprising:

determining open nodes in the wire track plan; and routing remaining open nodes to form input/output pins.

14. The method of claim 13, wherein the mapping the merged transistor pairs comprises arranging clusters to a technology-specific wire track plan in a cluster map resembling a physical layout.

15. The method of claim 9, further comprising manufacturing a mask set based on the 3-D physical layout.

16. A non-transitory computer-readable medium storing computer instructions for generating a three-dimensional (3-D) physical layout from a netlist comprising a list of transistors, that when executed by one or more processors, cause the one or more processors to:

generate the 3-D physical layout from the netlist representative of a 3-D electrical circuit, the instructions to generate the 3-D physical layout comprise instructions to:

divide the netlist into a first group of transistors to be stacked vertically along a first direction and a second group of transistors to be spaced laterally along a second direction orthogonal to the first direction, generate interconnections between transistors in the first group and transistors in the second group such that the first group and the second group together represent the 3-D physical layout of the netlist, and perform a device placement to determine a placement location of transistors within the netlist, the instructions to perform the device placement comprise instructions to identify and merge transistor pairs in the netlist into clusters by overlapping common current path nodes, and map the merged transistor pairs onto a wire track plan.

17. The non-transitory computer-readable medium of claim 16, wherein the instructions to identify and merge the transistor pairs comprise instructions to identify the transistor pairs by determining transistors with common gate inputs from the netlist.

18. The non-transitory computer-readable medium of claim 16, wherein the instructions to perform the device placement comprise instructions to determine and delete unnecessary internal nodes.

19. The non-transitory computer-readable medium of claim 16, wherein the instructions, when executed further by the one or more processors, cause the one or more processors to:

determine open nodes in the wire track plan; and route remaining open nodes to form input/output pins.

20. The non-transitory computer-readable medium of claim 16, wherein the instructions to divide the netlist into the first group of transistors comprise instructions to pair the transistors based on a complimentary feature shared between the transistors, the complimentary feature being associated with an operational characteristic of the transistors.

* * * * *